(12) United States Patent
Yamagata

(10) Patent No.: US 8,148,798 B2
(45) Date of Patent: Apr. 3, 2012

(54) SEMICONDUCTOR DEVICE AND METHOD FOR MANUFACTURING THE SAME

(75) Inventor: Takahiro Yamagata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 72 days.

(21) Appl. No.: 12/205,495

(22) Filed: Sep. 5, 2008

(65) Prior Publication Data
US 2009/0001515 A1 Jan. 1, 2009

Related U.S. Application Data

(63) Continuation of application No. PCT/JP2006/304503, filed on Mar. 8, 2006.

(51) Int. Cl.
*H01L 21/66* (2006.01)
*H01L 23/52* (2006.01)

(52) U.S. Cl. ............ 257/532; 257/774; 257/E21.531; 257/E21.615; 257/E21.664; 257/E23.141; 257/E23.145; 257/E27.026; 257/E27.081

(58) Field of Classification Search .......... 257/532, 257/E21.531, E21.614, E21.664, E23.141, 257/E23.145, E27.026, E27.081, 774
See application file for complete search history.

(56) References Cited

U.S. PATENT DOCUMENTS

| | | | |
|---|---|---|---|
| 5,808,365 A | 9/1998 | Mori | |
| 6,163,075 A | 12/2000 | Okushima | |
| 6,323,556 B2 | 11/2001 | Izumi | |
| 6,346,471 B1 | 2/2002 | Okushima | |
| 6,611,449 B1 * | 8/2003 | Hilliger | 365/145 |
| 6,727,590 B2 | 4/2004 | Izumitani et al. | |
| 6,984,895 B2 | 1/2006 | Cho et al. | |
| 7,235,454 B2 * | 6/2007 | Kim et al. | 438/396 |
| 7,288,799 B2 * | 10/2007 | Saigoh et al. | 257/127 |
| 2001/0011775 A1 | 8/2001 | Izumi | |
| 2002/0039801 A1 | 4/2002 | Ishii | |
| 2002/0155719 A1 | 10/2002 | Okada | |
| 2003/0015799 A1 | 1/2003 | Abiru et al. | |
| 2005/0002266 A1 | 1/2005 | Kanaya et al. | |
| 2005/0127395 A1 | 6/2005 | Saigoh et al. | |
| 2005/0212020 A1 * | 9/2005 | Izumi et al. | 257/295 |
| 2007/0063241 A1 * | 3/2007 | Sashida et al. | 257/296 |

(Continued)

FOREIGN PATENT DOCUMENTS

JP 7-37929 A 2/1995
(Continued)

OTHER PUBLICATIONS

International Search Report of PCT/JP2006/304503, date of mailing Jun. 13, 2006.

(Continued)

*Primary Examiner* — Jerome Jackson, Jr.
*Assistant Examiner* — David Spalla
(74) *Attorney, Agent, or Firm* — Fujitsu Patent Center

(57) ABSTRACT

The semiconductor device includes a capacitor 36 formed over a semiconductor substrate 10 and including a lower electrode 30, a dielectric film 32 and an upper electrode 34; a first insulation film 58 formed above the capacitor 36; a first interconnection 88a formed over the first insulation film 68; a second insulation film 90 formed over the first insulation film 68 and over the first interconnection 88a; an electrode pad 102 formed over the second insulation film 90: and a monolithic conductor 100 buried in the second insulation film 90 immediately below the electrode pad 102 and buried through the second insulation film 90 down to a part of at least the first insulation layer 68.

10 Claims, 49 Drawing Sheets

U.S. PATENT DOCUMENTS

| | | | |
|---|---|---|---|
| 2008/0237866 A1* | 10/2008 | Wang | 257/753 |
| 2008/0258195 A1* | 10/2008 | Sugawara et al. | 257/295 |
| 2008/0258260 A1* | 10/2008 | Nagai et al. | 257/532 |
| 2009/0008783 A1* | 1/2009 | Saigoh et al. | 257/760 |
| 2009/0160023 A1* | 6/2009 | Izumi et al. | 257/532 |
| 2009/0278231 A1* | 11/2009 | Nagai et al. | 257/532 |

FOREIGN PATENT DOCUMENTS

| | | |
|---|---|---|
| JP | 9-191084 A | 7/1997 |
| JP | 9-246479 A | 9/1997 |
| JP | 11-214389 A | 8/1999 |
| JP | 11-238855 A | 8/1999 |
| JP | 11-340319 A | 12/1999 |
| JP | 2000-150599 A | 5/2000 |
| JP | 2000-340653 A | 12/2000 |
| JP | 2001-267323 A | 9/2001 |
| JP | 2002-110731 A | 4/2002 |
| JP | 2002-190578 A | 7/2002 |
| JP | 2002-324797 A | 11/2002 |
| JP | 2003-31575 A | 1/2003 |
| JP | 2003-142485 A | 5/2003 |
| JP | 2003-282573 A | 10/2003 |
| JP | 2004-349424 A | 12/2004 |
| JP | 2004-349474 A | 12/2004 |
| JP | 2005-175204 A | 6/2005 |
| JP | 2006-84191 A | 3/2006 |

OTHER PUBLICATIONS

Japanese Office Action mailed Jan. 17, 2012 for corresponding Japanese Application No. 2008-503710, with Partial English-language Translation.

* cited by examiner

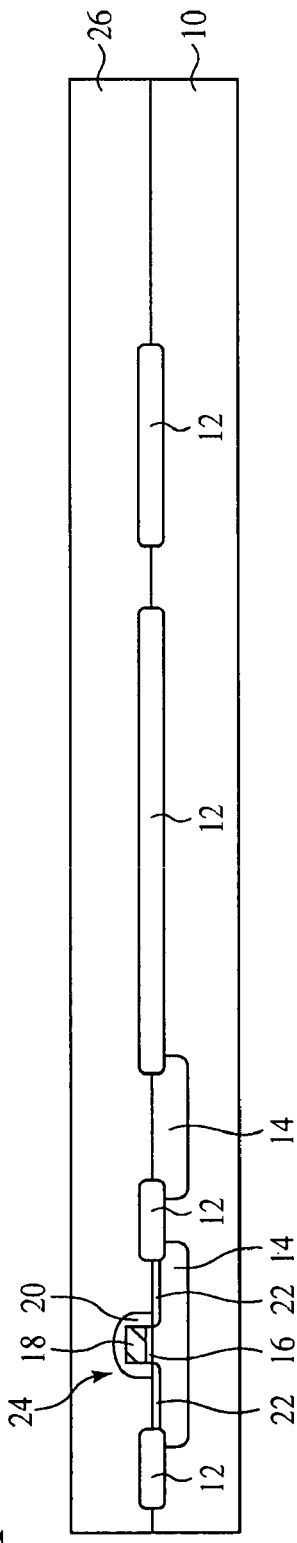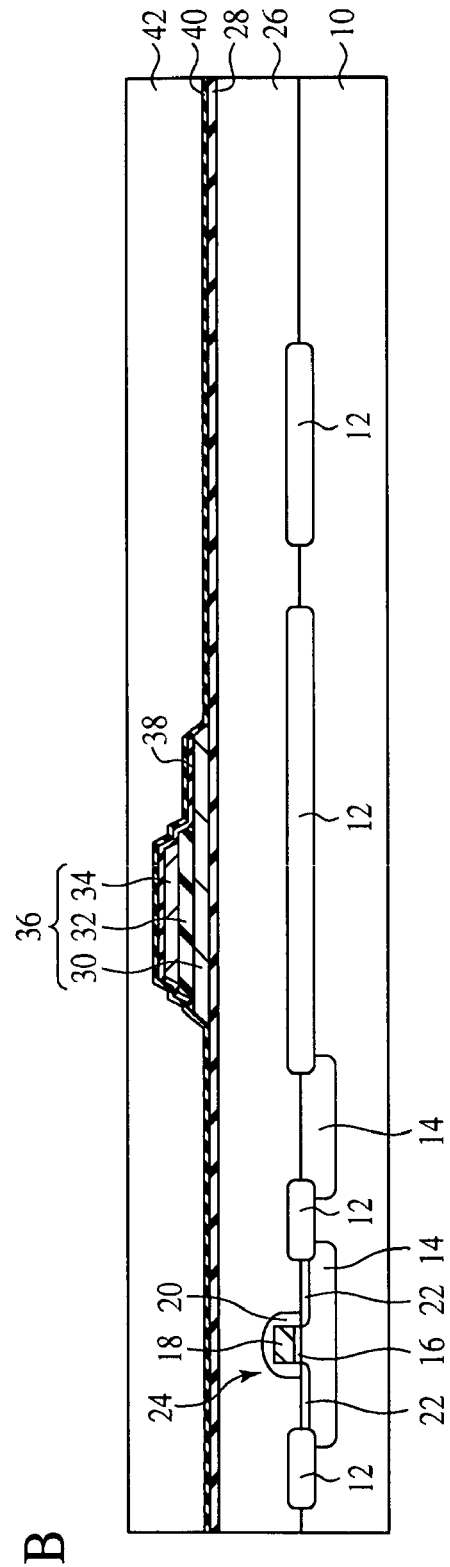

SEMICONDUCTOR DEVICE AND METHOD FOR MANUFACTURING THE SAME

CROSS REFERENCE TO RELATED APPLICATIONS

This application is a Continuation of International Application No. PCT/JP2006/304503, with an international filing date of Mar. 8, 2006, which designating the United States of America, the entire contents of which are incorporated herein by reference.

TECHNICAL FIELD

The present embodiment relates to a semiconductor device and a method for manufacturing the semiconductor device, more specifically, a semiconductor device including a capacitor using a ferroelectric or a high dielectric as the dielectric film, and a method for manufacturing the semiconductor device.

BACKGROUND ART

Recently, semiconductor devices including capacitors using ferroelectrics or high dielectrics as the dielectric film are proposed. As a semiconductor device using a ferroelectric as the dielectric film of the capacitors, FeRAM (Ferroelectric Random Access Memory) is much noted. This ferroelectric memory is a nonvolatile memory characterized by high-speed operation, low electric power consumption, good write/read durability, etc. and is expected to be further developed.

However, when a ferroelectric or a high dielectric is used as the dielectric film, hydrogen or water often arrives at the capacitor dielectric film in steps following the formation of the dielectric film. When hydrogen or water arrives at the dielectric film, metal oxide forming the dielectric film is reduced with the hydrogen, which leads to the deterioration of the electric characteristics of the capacitors.

As techniques for preventing the deterioration of the dielectric film with hydrogen or water are proposed the technique of forming aluminum oxide film, covering the capacitors and the technique of forming aluminum oxide film on the inter-layer insulation film formed on the capacitors. Aluminum oxide film functions to prevent the diffusion of hydrogen or water. Accordingly, the proposed techniques can prevent the arrival of hydrogen or water at the dielectric film, and the deterioration of the dielectric film with hydrogen or water can be prevented.

Background art of the present application is as follows:
Patent Reference 1: Specification of Japanese Patent Application Unexamined Publication No. 11-214389
Patent Reference 2: Specification of Japanese Patent Application Unexamined Publication No. 2003-31575
Patent Reference 3: Specification of Japanese Patent Application Unexamined Publication No. 2002-324797
Patent Reference 4: Specification of Japanese Patent Application Unexamined Publication No. 09-191084

SUMMARY

According to one aspect embodiment, there is provided a semiconductor device including: a capacitor formed over a semiconductor substrate and including a lower electrode, a dielectric film formed over the lower electrode and an upper electrode formed over the dielectric film; a first insulation film formed above the capacitor; a first interconnection formed over the first insulation film; a second insulation film formed over the first insulation film and over the first interconnection; a electrode pad formed over the second insulation film; and a monolithic conductor buried in the second insulation film immediately below the electrode pad, and passed through the second insulation film and buried down to a part of at least the first insulation film.

BRIEF DESCRIPTION OF THE DRAWINGS

FIGS. 3A and 3B are sectional views of the semiconductor device according to the first embodiment in the steps of the method for manufacturing the semiconductor device, which illustrate the method (Part 1).

DETAILED DESCRIPTION OF THE PREFERRED EMBODIMENTS

Figure 49:
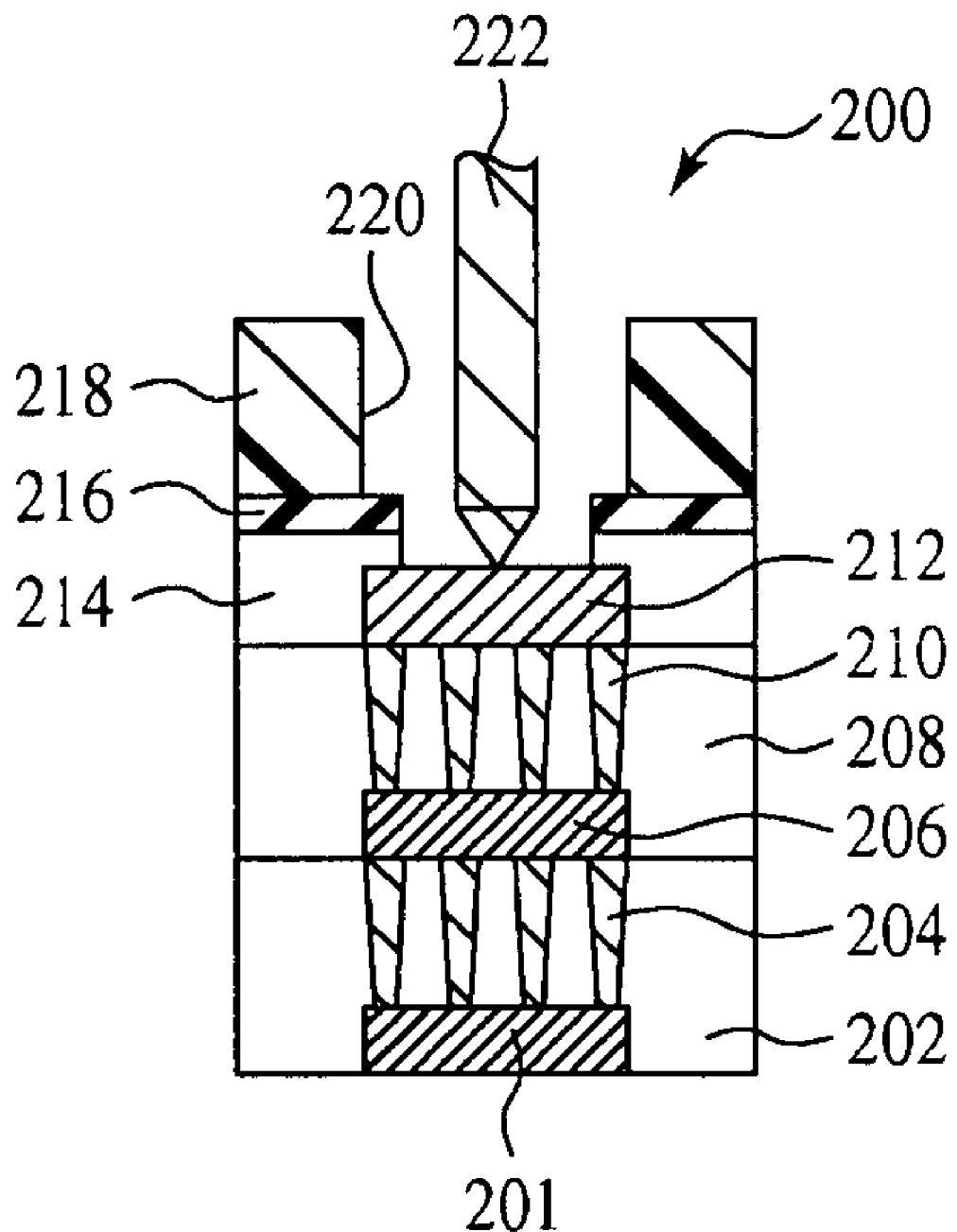
FIG. 49 is a sectional view of the proposed semiconductor device.

However, in the proposed semiconductor device, an electrode pad 200 has the structure as illustrated in FIG. 49. FIG. 49 is a sectional view of the electrode pad part of the proposed semiconductor device. As illustrated in FIG. 49, an electrode 201 is formed on an inter-layer insulation film not illustrated. On the inter-layer insulation film with the electrode 201 formed on, an inter-layer insulation film 202 is formed, covering the electrode 201. In the inter-layer insulation film 202, a plurality of conductor plugs 204 are buried, connected to the electrode 201. On the inter-layer insulation film 202 with the conductor plugs 204 buried in, an electrode 206 is formed. On the inter-layer insulation film 204 with the electrode 206 formed on, an inter-layer insulation film 208 is formed, covering an electrode 206. In the inter-layer insulation film 208, a plurality of conductor plugs 210 connected to the electrode 206 are buried. On the inter-layer insulation film 208 with the conductor plugs 210 buried in, an electrode pad 212 connected to the conductor plugs 210 is formed. On the inter-layer insulation film 208 with the electrode pad 212 formed on, a protection film 214 of silicon oxide film and a protection film 216 of silicon nitride film are formed. On the protection film 216, a protection film 218 of polyimide is formed. In the protection film 218, an opening 220 is formed down to the electrode pad 212. In such proposed semiconductor device, a plurality of conductor plugs 204, 210 are buried in the inter-layer insulation films 202, 208 immediately below the electrode pad 212. When a probe needle 222 contact the electrode pad 212 for tests, etc., often the electrode pad 212 is broken or deformed. In such cases, even the inter-layer insulation films 208, 202, which are present below the electrode pad 212, often crack. In such cases, hydrogen or water intrudes from the electrode pad 212 into the interior of the semiconductor device and often arrive even at the dielectric film of the capacitor. When hydrogen or water arrives at the dielectric film of the capacitor, the metal oxide forming the dielectric film is reduced with the hydrogen, and the electric characteristics of the capacitor are deteriorated.

A First Embodiment

The semiconductor device according to a first embodiment and the method for manufacturing the semiconductor device will be explained with reference to FIGS. 1 to 19.

(Semiconductor Device)

Figure 1:
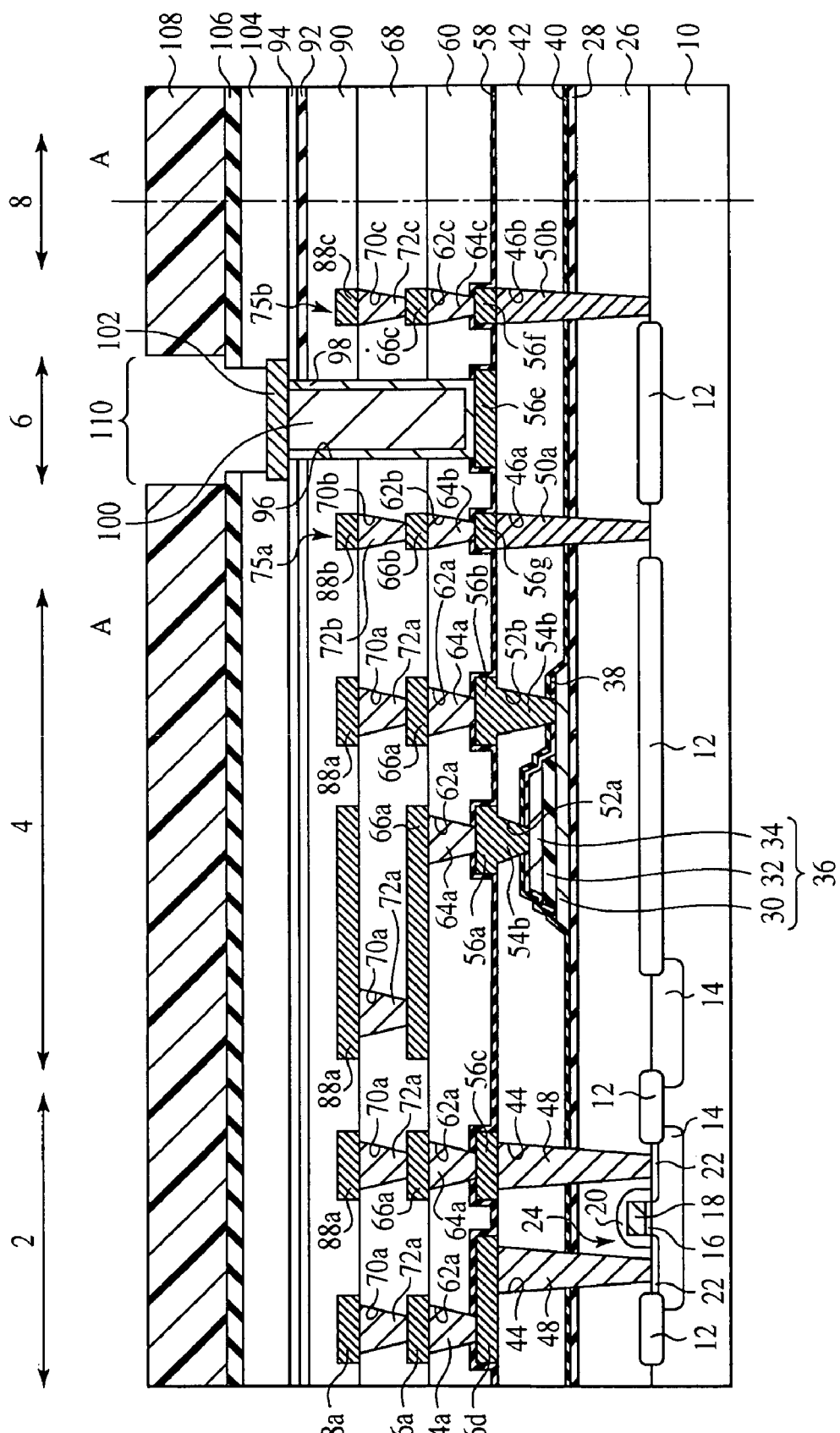
FIG. 1 is a sectional view of the semiconductor device according to a first embodiment.
Figure 2:
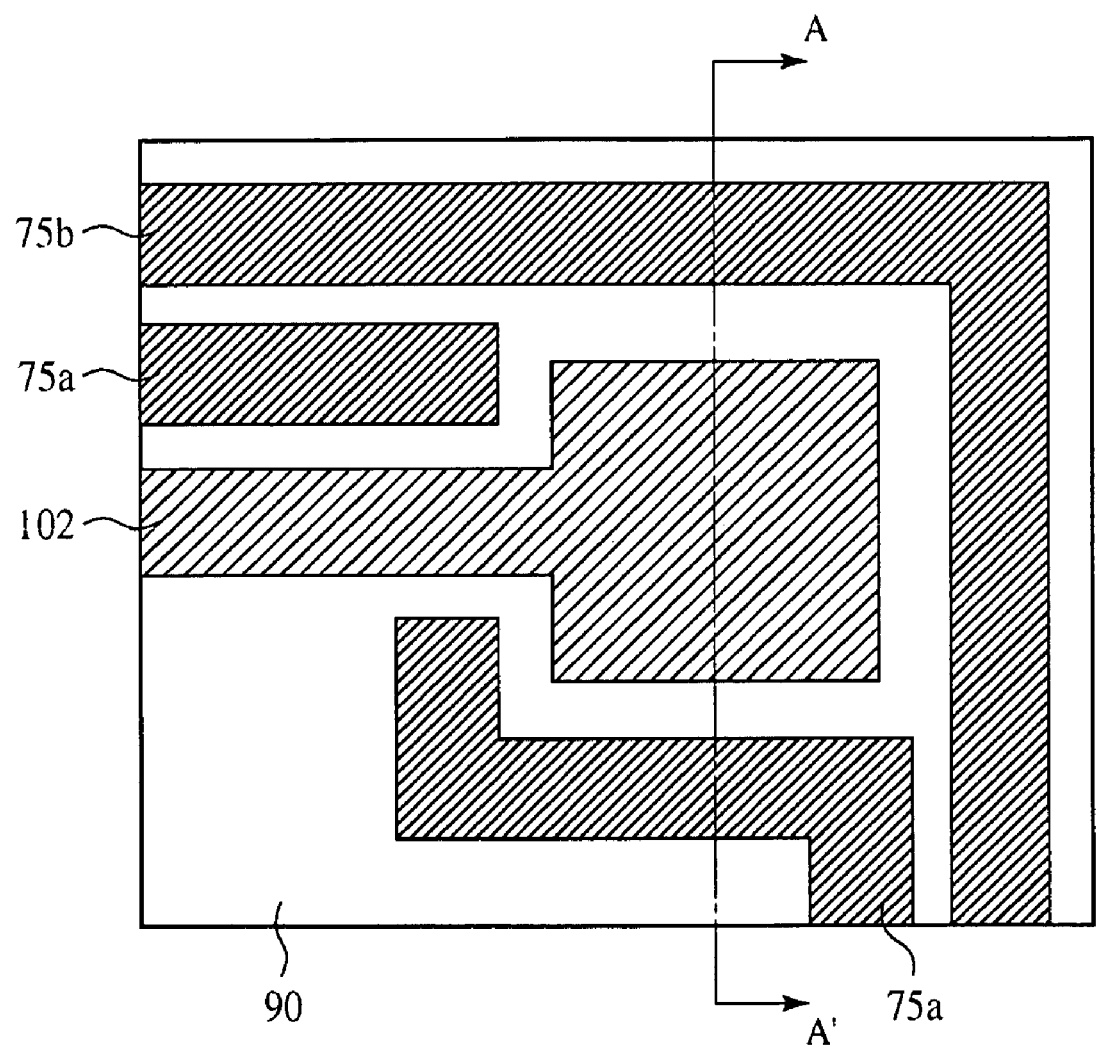
FIG. 2 is a plan view of the semiconductor device according to the first embodiment.

First, the semiconductor device according to the present embodiment will be explained with reference to FIG. 1. FIG. 1 is a sectional view of the semiconductor device according to the present embodiment. In FIG. 1, the left side of the drawing illustrates the logic part (peripheral circuit region) 2, the right side of the drawing of the logic part illustrates the FeRAM cell part (memory cell region) 4, and the right side of the drawing of the FeRAM cell part 4 illustrates the electrode pad part 6, and the right side of the drawing of the electrode pad part 6 illustrates the scribe region 8. The one-dot-chain line in FIG. 1 indicates the scribe part where the semiconductor wafer 10 is scribed. FIG. 2 is a plan view of the semiconductor device according to the present embodiment. The A-A' line in FIG. 2 corresponds to the A-A' line in FIG. 1.

As illustrated in FIG. 1, device isolation regions 12 for defining device regions are formed on a semiconductor substrate 10, of, e.g., silicon. In the semiconductor substrate 10 with the device isolation region 12 formed on, wells 14 are formed.

On the semiconductor substrate 10 with the wells 14 formed in, gate electrodes (gate line) 18 of, e.g., polysilicon are formed with a gate insulation film 16 of, e.g., a 6-7 nm-thickness silicon oxide film. The gate length is set at, e.g., 0.36 µm. On the gate electrode 18, silicon oxide film is formed. On the side walls of the gate electrodes 18, a sidewall insulation film 20 of silicon oxide film is formed.

On both sides of each gate electrode 18 with the sidewall insulation film 20 formed on, a source/drain diffused layer 22 is formed. Thus, transistors 24 each including the gate electrode 18 and the source/drain diffused layer 22 are formed.

The transistors 24 are formed also on the semiconductor substrate 10 in the FeRAM region 4 but are not illustrated in FIG. 1. The transistors 24 formed on the semiconductor substrate 10 in the FeRAM region 4 are electrically connected to, e.g., the lower electrodes 30 or the upper electrodes 34 of the capacitors 36.

On the semiconductor substrate 10 with the transistors 24 formed on, an inter-layer insulation film 26 of silicon nitride oxide film (not illustrated), silicon oxide film (not illustrated) and silicon oxide film (not illustrated) is formed. The surface of the inter-layer insulation film 26 is flat.

On the inter-layer insulation film 26, an insulative barrier film 28 for preventing the diffusion of hydrogen or water is formed. The material of the insulative barrier film 28 is, e.g., aluminum oxide (alumina, $Al_2O_3$). The thickness of the insulative barrier film 28 is, e.g., about 20 nm.

The insulative barrier film 28 is formed on the inter-layer insulation film 26 for the following reason. That is, if hydrogen or water arrives at the dielectric film 32 of the capacitors 36 which will be described later, the metal oxide forming the dielectric film 32 is reduced with the hydrogen, and the electric characteristics of the dielectric film 32 are deteriorated. The insulative barrier film 28 is formed on the inter-layer insulation film 26, whereby the arrival of hydrogen or water at the dielectric film 32 from the inter-layer insulation film 26, and the deterioration of the electric characteristics of the capacitors 36 can be prevented.

On the insulative barrier film 28, the lower electrodes 30 of the capacitors 36 are formed. The lower electrodes 30 are formed of, e.g., a 155 nm-thickness Pt film.

On the lower electrodes 30, the dielectric film 32 of the capacitors 36 is formed. The dielectric film 32 is formed of, e.g., a 150-200 nm-thickness ferroelectric film. The ferroelectric film is, e.g., $PbZr_{1-x}TiO_xO_3$ film (PZT film).

On the dielectric film 32, the upper electrodes 34 of the capacitors 36 are formed. The upper electrodes 34 are formed of the layer film of a 50 nm-thickness $IrO_2$ film (not illustrated) and another $IrO_2$ film of a 200 nm-film thickness (not illustrated) sequentially laid.

Thus, the capacitors 36 each including the lower electrode 30, the dielectric film 32 and the upper electrode 34 are formed.

On the dielectric film 32 and on the upper electrodes 34, an insulative barrier film 38 is formed, covering the upper surfaces and the side surfaces of the dielectric film 32 and the upper electrode 34. As the insulative barrier film 38, an about 50 nm-thickness aluminum oxide ($Al_2O_3$) film, for example, is used. The insulative barrier film 38 is for preventing the diffusion of hydrogen and water. If hydrogen or water arrives at the dielectric film 32 of the capacitors 36, as described above, the metal oxide forming the dielectric film 32 is reduced with the hydrogen, and the electric characteristics of the capacitors 36 are deteriorated. The insulative barrier film 38 is formed, covering the upper surfaces and the side surfaces of the dielectric film 32 and the upper electrodes 34, whereby the arrival of hydrogen and water at the dielectric film 32 is prevented, and the deterioration of the electric characteristics of the capacitors 36 can be prevented.

On the capacitors with the insulative barrier film 38 formed on, another insulative barrier film 40 is formed, covering the insulative barrier film 38 and the capacitors 36. As the insulative barrier film 40, an about 20 nm-thickness aluminum oxide film, for example, is used. The insulative barrier film 40 as well as the insulative barrier film 38 described above is for preventing the diffusion of hydrogen and water.

On the insulative barrier film 40, an inter-layer insulation film 42 of silicon oxide film is formed. The surface of the inter-layer insulation film 42 is planarized.

In the inter-layer insulation film 42, the insulative barrier film 40, the insulative barrier film 28 and the inter-layer insulation film 26, contact holes 44 are formed down to the source/drain diffused layer 22. The diameter of the contact holes 44 is, e.g., about 0.45 μm.

In the inter-layer insulation film 42, the insulative barrier film 40, the insulative barrier film 38 and the inter-layer insulation film 26, openings 46a for a metal layer 50a to be buried in are formed. The metal layer 50a forms parts of inner seal rings (moisture resistant rings) 75a. The seal rings 75a block the intrusion of water, etc. from the outside in cooperation with seal rings 75b after the semiconductor substrate 10 is cut in the scribe region 8.

In the inter-layer insulation film 42, the insulative barrier film 40, the insulative barrier film 38 and the inter-layer insulation film 26, openings 46b for a metal layer 50b to be buried in are formed. The metal layer 50b forms parts of outer seal rings (moisture resistant rings) 75b. The seal rings 75b block the intrusion of water, etc. from the outside in cooperation with the inner seal rings 75a after the semiconductor substrate 10 is cut in the scribe region 8. The openings 46b are formed generally in a frame inside the scribe region 8.

In the contact holes 44 and the openings 46a, 46b, a 20 nm-thickness Ti film (not illustrated), for example, is formed. In the contact holes 44 and the openings 46a, 46b with the Ti film formed in, a 50 nm-thickness TiN film (not illustrated), for example, is formed. The Ti film and the TiN film form a barrier metal film (not illustrated).

In the contact holes 44 with the barrier metal film formed in, conductor plugs 48 of tungsten are buried in. In the openings 46a, 46b with the barrier metal film formed in, metal layers 50a, 50b of tungsten are buried in.

In the inter-layer insulation film 42 and the insulative barrier films 38, 40, contact holes 52a are formed down to the upper electrodes 34. In the inter-layer insulation film 42 and the insulative barrier films 38, 40, contact holes 52b are formed down to the lower electrodes 30. The diameter of the contact holes 52a, 52b is, e.g., about 0.5 μm.

In the contact holes 52a and on the inter-layer insulation film 42, conductor plugs 54a and an interconnection (the first metal interconnection layer) 56a are formed integral. In the contact holes 52b and on the inter-layer insulation film 42, conductor plugs 54b and an interconnection (the first metal interconnection layer) 56b are formed integral. On the inter-layer insulation film 42, a plurality of interconnections (the first metal interconnection layers) 56c, 56d are formed. On the inter-layer insulation film 42, an electrode 56e is formed. The electrode 56e is formed plane as is an electrode pad 102 which will be described later. The electrode 56e is connected to an interconnection not shown. The interconnections 56c, 56d are connected to, e.g., the conductor plugs 48. On the metal layer 50a, a metal layer 56g formed of one and the same film as the interconnections 56a-56e. On the metal layer 50b, a metal layer 56f formed of one and the same film as the interconnections 56a-56d is formed. The metal layer 56f forms parts of the outer seal rings 75b. The metal layer 56g forms parts of the inner seal rings 75a. The interconnections 56a, 56b and the conductor plugs 54a, 54b are formed of the layer film of, e.g., a 150 nm-thickness TiN film, a 550 nm-thickness Al—Cu alloy film, a 5 nm-thickness Ti film and a 150 nm-thickness TiN film sequentially laid.

On the inter-layer insulation film 42 with the interconnections 56a-56d, the electrode 56e, the metal layers 56f, 56g, the conductor plugs 54a, 54b, etc. formed on, an insulative barrier film 58 is formed, covering the interconnections 56a-56d, the electrode 56e and the metal layers 56f, 56g. The insulative barrier film 58 is for preventing the diffusion of hydrogen and water, as is the insulative barrier films 38, 40 described above. As the insulative barrier film 58, a 20 nm-thickness aluminum oxide film, for example, is used.

On the insulative barrier film 58, an inter-layer insulation film 60 of, e.g., a 100 nm-thickness silicon oxide film is formed.

In the inter-layer insulation film 60 and the insulative barrier film 58, contact holes 62a are formed respectively down to the interconnections 56a-56d. The diameter of the contact holes 62a is, e.g., about 0.5 μm. In the inter-layer insulation film 60 and the insulative barrier film 58, openings 62c are formed down to the metal layer 56f. In the inter-layer insulation film 60 and the insulative barrier film 58, openings 62b are formed down to the metal layer 56g.

In the contact holes 62a and the openings 62b, 62c, a 50 nm-thickness TiN film (not illustrated), for example, is formed.

In the contact holes 62a with the TiN film formed in, conductor plugs 64a of tungsten are buried. In the openings 62b with the TiN film formed in, a metal layer 64b of tungsten is buried. In the openings 62c with the TiN film formed in, a metal layer 64c of tungsten is buried. The metal layer 64b forms parts of the inner seal rings 75a. The metal layer 64c forms parts of the outer seal rings 75b.

On the inter-layer insulation film 60 with the conductor plugs 64a and the metal layers 64b, 64c, an interconnection (the second metal interconnection layer) 66a is formed.

On the metal layer 64b, a metal layer 66b formed of one and the same conductor film as the interconnection 66a is formed. The metal layer 66b forms parts of the inner seal rings 75a.

On the metal layer 64c, a metal layer 66c formed of one and the same conductor film as the interconnection 66a is formed. The metal layer 66c forms parts of the seal rings 75b.

The interconnection 66a, the electrode 66b and the metal layer 66c are formed of the layer film of, e.g., a 550 nm-thickness Al—Cu alloy film, a 5 nm-thickness Ti film and a 150 nm-thickness TiN film.

On the inter-layer insulation film 60 with the interconnection 66a, the electrode 66b and the metal layer 66c formed on, an inter-layer insulation film 68 of, e.g., a 100-nm thickness silicon oxide film is formed. The surface of the inter-layer insulation film 68 is flat.

In the inter-layer insulation film 68, contact holes 70a are formed down to the interconnection 66a. The diameter of the contact holes 70a is, e.g., about 0.5 μm. In the inter-layer insulation film 68, openings 70b are formed down to the metal layer 66b. In the inter-layer insulation film 68, openings 70c are formed down to the metal layer 66c. The metal layer 70b form parts of the inner seal rings 75a. the metal layer 70c forms parts of the outer seal rings 75b.

In the contact holes 70a and the openings 70b, 70c, a barrier metal film of, e.g., a 50 nm-thickness TiN film is formed.

In the contact holes 70a with the barrier metal film formed in, conductor plugs 72a of tungsten are buried. In the openings 70b with the barrier metal film formed in, a metal layer 72b of tungsten is formed. In the openings 70c with the barrier metal film formed in, a metal layer 72c of tungsten is formed.

On the inter-layer insulation film 68 with the conductor plugs 72a and the metal layers 72b, 72 buried in, an interconnection (the third metal interconnection layer) 88a is formed.

On the metal layer 72b, a metal layer 88b formed of one and the same conductor film as the interconnection 88a is formed. The metal layer 88b form parts of the inner seal rings 75a. On the metal layer 72c, a metal layer 88c formed on one and the same conductor film as the interconnection 88a is formed. The metal layer 88c forms parts of the outer seal rings 75b.

On the inter-layer insulation film 68 with the interconnection 88a, the metal layers 88b, 88c formed on, an inter-layer insulation film 90 of, e.g., a 100 nm-thickness silicon oxide film is formed. The surface of the inter-layer insulation film 90 is flat.

On the inter-layer insulation film 90 having the surface planarized, an insulative barrier film 92 of, e.g., a 20-80 nm-thickness aluminum oxide film is formed. The film thickness of the aluminum oxide film forming the insulative barrier film 92 is here, e.g., 50 nm. The insulative barrier film 92, which is formed on the planarized inter-layer insulation film 90, is flat. The flat insulative barrier film 92 has good coverage and can sufficiently prevent the diffusion of hydrogen and water.

On the insulative barrier film 92, a 100 nm-thickness silicon oxide film 94, for example, is formed. The silicon oxide film 94 is for preventing the insulative barrier film 92 from being etched in patterning for forming the electrode pads 102, etc.

In the silicon oxide film 94, the insulative barrier film 92, the inter-layer insulation film 90, the inter-layer insulation film 68 and the inter-layer insulation film 60, openings 96 are formed down to the electrodes 56e.

On the inside surfaces of the openings 96, a barrier metal film 98 is formed. As the material of the barrier metal film 98, a 150 nm-thickness Ti—Al—N alloy film, for example, is used.

In the openings 96 with the barrier metal film 98 formed in, monolithic conductors (buried objects) 100 of, e.g., Cu are buried. The conductors 100, which are buried in the plural inter-layer insulation films 60, 68, 90, are formed very thick in, e.g., a 2.5 μm-thickness. The diameter of the openings 96 with the conductors 100 buried in is 50 μm which is relatively large. The diameter of the conductors 100 is set larger than the diameter of any of the conductor plugs 48, 54a, 54b, 64a, 72a connected to the interconnections 56a-56c, 66a, 88a, etc. Specifically, the diameter of the conductors 100 is set at 100 times or above the diameters of the conductor plugs 48, 54a, 54b, 64a, 72a. The conductors 100 are formed thus strong.

The barrier metal film 98 is formed of Ti—Al—N alloy here but the material of the barrier metal film 98 is not limited to Ti—Al—N alloy. For example, TiN, Ti, Ta, etc. may be used as the material of the barrier metal film 98. The composite material of Ti—Al—N alloy and Ta may be used as the material of the barrier metal film 98.

The conductors 100 are formed of Cu here, but the material of the conductors 100 is not limited to Cu.

For example, the conductors 100 may be formed of Al. Al has a higher hardness than Cu. Accordingly, Al is used as the material of the conductors 100, whereby the conductors 100 can have a higher hardness than the conductors 100 formed of Cu. When Al is used as the material of the conductors 100, the barrier metal film 98 can be formed of TiN, TiW or others.

The conductors 100 may be formed of Au. Au has a higher hardness than Al. Accordingly, Au is used as the material of the conductors 100, whereby the conductors 100 can have a higher hardness than the conductors 100 formed of Al. When Au is used as the material of the conductors 100, the barrier metal film 98 can be formed of, e.g., TiN, TiW or others.

Al—Cu alloy may be used as the material of the conductors 100.

On the inter-layer insulation films 60, 68, 90, 92, 94 with the conductors 100 buried in, electrode pads 102 are formed. As the material of the electrode pads 102, Al (aluminum), Al—Cu (aluminum-copper) alloy or another is used.

The outer periphery of the electrode pads 102 is set larger than the outer periphery of the conductors 100. The outer periphery of the electrode pads 102 is set larger than the outer periphery of the conductors 100 so as to sufficiently ensure the alignment allowance.

The outer periphery of the electrodes 56e is set larger than the outer periphery of the conductors 100. The outer periphery of the electrodes 56e is set larger than the outer periphery of the conductors 100 so as to sufficiently ensure the alignment allowance.

The present embodiment is characterized mainly in that the strong conductors 100 are buried immediately below the electrode pads 102. More specifically, the conductors 100 are buried not only in the inter-layer insulation film 90 but also in the inter-layer insulation film 68 and further in a part of the inter-layer insulation film 60.

In the proposed semiconductor device, a plurality of conductor plugs are buried in the inter-layer insulation film immediately below the electrode pads, and in tests, etc. where a probe needle is contacted to the electrode pads, often the electrode pads are broken or deformed. In such case, even the inter-layer insulation film present below the electrode pads often cracks. In such case, often hydrogen or water intrudes from the electrode pads into the interior of the semiconductor device and further arrive even at the dielectric film of the capacitors. When hydrogen or water arrives at the dielectric film of the capacitors, the metal oxide forming the dielectric film is reduced with hydrogen, and the electric characteristics of the capacitors are deteriorated.

In contrast to this, in the present embodiment, because of the strong conductors 100 are present immediately below the electrode pads 102, even when a probe needle is contacted to the electrode pads 102 with some force in tests, etc., the breakage and deformation of the electrode pads 102 can be prevented. If the breakage and deformation of the electrode pads 102 should take place, the conductors 100 formed very strong immediately below the electrode pads 102 can surely prevent the intrusion of hydrogen or water from the electrode pad part 6 into the interior of the semiconductor device. Thus, according to the present embodiment, hydrogen and water are prevented from arriving at the dielectric film 32 of the capacitors 36 via the inter-layer insulation films 60, 68, 90, etc., and the reduction of the ferroelectric forming the dielectric film 32 with the hydrogen can be prevented. A semiconductor device having good electric characteristics and including the long-life capacitors 36 can be provided.

The metal layer 50a, the metal layer 56g, the metal layer 64b, the metal layer 66b, the metal layer 72b and the metal layer 88b form the inner seal ring (inner moisture resistance rings) 75a. As described above, the inner seal rings 75a are for blocking the intrusion of water, etc. from the outside in cooperation with the outer seal rings 75b after the semiconductor wafer 10 is cut in the scribe region 8.

The metal layer 50b, the metal layer 56f, the metal layer 64c, the metal layer 66c, the metal layer 72c and the metal layer 88c form the outer seal rings (outer moisture resistance rings) 75b. As described above, the outer seal rings 75b are for blocking the intrusion of water, etc. from the outside after the semiconductor wafer 10 is cut in the scribe region 8.

On the silicon oxide film 94 with the electrode pads 102 formed on, a protection film 104 of, e.g., a 100 nm-thickness silicon oxide film is formed.

On the protection film 104, a protection film 106 of, e.g., a 350 nm-thickness silicon nitride film is formed. The silicon nitride film 106 is for blocking water, etc. discharged from the protection film 108 of polyimide which will be described later.

On the protection film 106, the protection film 108 of, e.g., polyimide is formed.

Openings 110 are formed down to the electrode pads 102 in the protection film 104, the protection film 106 and the protection film 108.

Thus, the semiconductor device according to the present embodiment is constituted.

The semiconductor device according to the present embodiment is characterized mainly in that the strong conductors 100 are formed immediately below the electrode pads 102.

As described above, with a plurality of conductor plugs simply buried in the inter-layer insulation film immediately below the electrode pads, when tests, etc. are made by contacting a probe needle to the electrode pads, often the electrode pads are broken or deformed. In such case, even the inter-layer insulation film present below the electrode pads often cracks. In such case, hydrogen or water intrudes from the electrode pad part into the semiconductor device and further arrives at the dielectric film of the capacitors. If hydrogen or water should arrive at the dielectric film of the capacitors, the metal oxide forming the dielectric film is reduced with the hydrogen, and the electric characteristics of the capacitors are deteriorated.

In contrast to this, in the present embodiment, the strong conductors 100 are present immediately below the electrode pads 102, whereby even when a probe needle is contacted to the electrode pads 102 with some force in testes, etc., the breakage and deformation of the electrode pads 102 can be prevented. If the electrode pads 102 should be broken or deformed, because of the conductors 100 immediately below the electrode pads 102, which are formed very strong, cracks which arrive at the inter-layer insulation films 60, 68, 90 are never made in the conductors 100. Thus, according to the present embodiment, the arrival of hydrogen and water at the dielectric film 32 of the capacitors 36 via the inter-layer insulation films 60, 68, 90, etc. can be prevented, and the reduction of the ferroelectric forming the dielectric film 32 with the hydrogen can be prevented. As descried above, according to the present embodiment, the deterioration of the dielectric film 32 of the capacitors 36 with hydrogen and water can be surely prevented, and a semiconductor device having good electric characteristics and including long-life capacitors 36 can be provided.

(Method for Manufacturing the Semiconductor Device)

Next, the method for manufacturing the semiconductor device according to the present embodiment will be explained with reference to FIGS. 3A to 19. FIGS. 3A to 19 are sectional views of the semiconductor device according to the present embodiment in the steps of the method for manufacturing the semiconductor device, which illustrate the method.

First, as illustrated in FIG. 3A, the device isolation regions 12 for defining device regions is formed on the semiconductor substrate 10 of, e.g., silicon by LOCOS (LOCal Oxidation of Silicon).

Next, the wells 14 are formed by implanting a dopant impurity by ion implantation.

Next, by, e.g., thermal oxidation, the gate insulation film 16 of a 6-7 nm-thickness silicon oxide film is formed on the device region.

Next, by, e.g., CVD, a 120 nm-thickness polysilicon film 18 is formed. The polysilicon film 18 is to be the gate electrodes, etc.

Next, by photolithography, the polysilicon film 18 is patterned. Thus, the gate electrodes 18 of the polysilicon film are formed. The gate length is, e.g., 0.36 µm.

Next, with the gate electrodes 18 as the mask, a dopant impurity is implanted into the semiconductor substrate 10 on both sides of each gate electrode 18 by ion implantation. Thus, the extension regions (not illustrated) forming the shallow regions of the extension source/drain are formed.

Next, on the entire surface, the 150 nm-thickness silicon oxide film 20 is formed by, e.g., CVD.

Then, the silicon oxide film 20 is anisotropically etched. Thus, on the side walls of the gate electrodes 18, the sidewall insulation film 20 of the silicon oxide film is formed.

Next, by using as the mask the gate electrodes 18 with the sidewall insulation film 20 formed on, by ion implantation, a dopant impurity is implanted into the semiconductor substrate 10 on both sides of each gate electrode 18. Thus, an impurity diffused layer (not illustrated) forming the deep regions of the extension source/drain is formed. The source/drain diffused layers 22 are formed by the extension regions and the deep impurity diffused layer.

Thus, transistors 24 each including the gate electrode 18 and the source/drain diffused layer 22 are formed.

Next, on the entire surface, by, e.g., plasma CVD, a 200 nm-thickness silicon nitride film (SiON film) (not illustrated), for example, is formed by, e.g., plasma-enhanced CVD.

Then, on the entire surface, a 600 nm-thickness silicon oxide film (not illustrated) is formed by, e.g., plasma TEOSCVD.

Next, by, e.g., CMP, the surface of the silicon oxide film is polished by about 200 nm to planarized the surface of the silicon oxide film.

Next, on the entire surface, by, e.g., plasma TEOSCVD, a 100 nm-thickness silicon oxide film (not illustrated) is formed. Thus, the inter-layer insulation film 26 of the silicon nitride oxide film, the silicon oxide film and the silicon oxide film is formed.

Next, dehydration processing is made to remove water from the inter-layer insulation film 26. The conditions for the dehydration processing are as exemplified below. The temperature for the dehydration processing is, e.g., 650° C. The atmosphere for the dehydration processing is nitrogen atmosphere. The period of time of the dehydration processing is, e.g., 30 minutes.

Next, as illustrated in FIG. 3B, by, e.g., PVD (Physical Vapor Deposition), more specifically sputtering, the insulative barrier film 28 of, e.g., a 20 nm-thickness aluminum oxide film is formed. The insulative barrier film 28 is for preventing the arrival of hydrogen and water at the capacitors 36 from the inside of the inter-layer insulation film 26.

Next, by, e.g., RTA (Rapid Thermal Annealing), thermal processing of, e.g., 650° C. and 60 seconds is made in an oxygen atmosphere. This thermal processing is for improving the film quality of the insulative barrier film 28. By this thermal processing, in forming the conduction film 30 on the insulative barrier film 28 in a later step, the conduction film 30 can have good orientation.

Next, on the entire surface, by, e.g., PVD, the conduction film 30 of a 155 nm-thickness Pt film is formed. The conduction film 30 is to be the lower electrodes of the capacitors 36.

Then, on the entire surface, by, e.g., PVD, the dielectric film 32 is formed. The dielectric film 32 is to be the dielectric film of the capacitors. As the dielectric film 32, a ferroelectric film, for example, is formed, more specifically, an about 150-200 nm-thickness PZT film, for example, is formed as the dielectric film 32.

Next, by, e.g., RTA, thermal processing of, e.g., 585° C. and 90 seconds is made in an oxygen atmosphere. The flow rate of the oxygen gas to be fed into the chamber in the thermal processing is, e.g., 0.025 liters/minutes. This thermal processing is for improving the film quality of the dielectric film 32.

Next, by, e.g., PVD, a 50 nm-thickness $IrO_2$ film (not illustrated), for example, is formed.

Next, by, e.g., RTA, thermal processing of, e.g., 725° C. and 20 seconds is made in an oxygen atmosphere. This thermal processing is for preventing the generation of abnormalities in the surface of the upper electrodes 36. The flow rate of the oxygen as to be fed into the chamber in the thermal processing is, e.g., 0.025 liters/minute.

Next, by, e.g., PVD, a 200 nm-thickness $IrO_2$ film (not illustrated) is formed. Two layers of the $IrO_2$ film are stacked to form the layer film 34. The layer film 34 is to be the upper electrodes of the capacitors 36.

Then, on the entire surface, a photoresist film (not illustrated is formed by spin coating.

Next, by photolithography, the photoresist film is patterned into the plane shape of the upper electrodes 34 of the capacitors 36.

Next, with the photoresist film as the mask, the layer film 34 is etched. Thus, the upper electrodes 34 of the layer film are formed. Then, the photoresist film is released.

Then, thermal processing of, e.g., 650° C. and 60 minutes is made in an oxygen atmosphere. This thermal processing is for feeding oxygen to the dielectric film to recover the film quality of the dielectric film 32. The flow rate of the oxygen gas to be fed into the chamber in the thermal processing is, e.g., 20 liters/minute. The thermal processing is made with, e.g., vertical furnace annealer.

Next, on the entire surface, a photoresist film is formed by spin coating.

Next, by photolithography, the photoresist film is patterned into the plane shape of the dielectric film 32 of the capacitors.

Next, with the photoresist film as the mask, the dielectric film 32 is etched. Then, the photoresist film is released.

Next, thermal processing of, e.g., 350° C. and 60 minutes is made in an oxygen atmosphere. This thermal processing is for feeding oxygen to the dielectric film 32 to recover the film quality of the dielectric film 32. The flow rate of the oxygen gas to be supplied into the chamber in the thermal processing is, e.g., 20 liters/minutes. The thermal processing is made with, e.g., a vertical furnace annealer.

Then, on the entire surface, an insulative barrier film (not illustrated) of a 50 nm-thickness aluminum oxide film is formed by, e.g., PVD. The insulative barrier film 38 is for preventing the diffusion of hydrogen and water.

Next, thermal processing of, e.g., 550° C. and 60 minutes is made in an oxygen atmosphere. This thermal processing is for improving the film quality of the insulative barrier film and feeding oxygen to the dielectric film 32 to thereby recover the film quality of the dielectric film 32. The flow rate of oxygen gas to be fed into the chamber in the thermal processing is, e.g., 20 liters/minute. The thermal processing is made with, e.g., a vertical furnace annealer.

Then, on the entire surface, a photoresist film is formed by spin coating.

Next, by photolithography, the photoresist film is patterned into the plane shape of the lower electrodes 30 of the capacitors.

Next, with the photoresist film as the mask, the insulative barrier film 38 and the conduction film 30 are etched. Thus, the lower electrodes 30 of the conduction film are formed. The insulative barrier film 38 is left, covering the upper electrodes 34 and the dielectric film 32. Then, the photoresist film is released.

Next, thermal processing of, e.g., 650° C. and 60 minutes is made in an oxygen atmosphere. This thermal processing is for feeding oxygen to the dielectric film 32 to recover the film quality of the dielectric film 32. The flow rate of oxygen gas to be fed into the chamber in the thermal processing is, e.g., 20 liters/minute. The thermal processing is made with, e.g., a vertical furnace annealer.

Then, on the entire surface, the insulative barrier film 40 of a 20 nm-thickness aluminum oxide film is formed by, e.g., PVD. The insulative barrier film 40 is for preventing the diffusion of hydrogen and water.

Then, thermal processing of, e.g., 550° C. and 60 minutes is made in a oxygen atmosphere. This thermal processing is for improving the film quality of the insulative barrier film 40 and feeding oxygen to the dielectric film 32 to thereby recover the film quality of the dielectric film 32. The flow rate of the oxygen gas to be fed into the chamber in the thermal processing is, e.g., 20 liters/minute. The thermal processing is made with, e.g., a vertical furnace annealer.

Next, on the entire surface, the inter-layer insulation film 42 of, e.g., a 1500 nm-thickness silicon oxide film is formed by plasma TEOSCVD.

Next, the surface of the inter-layer insulation film 42 is planarized by, e.g, CMP.

Next, thermal processing is made in a plasma atmosphere generated with $N_2O$ gas (plasma anneal). The plasma anneal is for removing water present inside the inter-layer insulation film 42 and nitriding the surface of the inter-layer insulation film 42. The plasma anneal is made with, e.g., a CVD system. The conditions for the plasma anneal are, e.g., 350° C. and 2 minutes.

Next, on the entire surface, a photoresist film is formed by spin coating.

Next, by photolithography, openings are formed in the photoresist film. The openings are for forming the contact holes in the inter-layer insulation film.

Figure 4A:
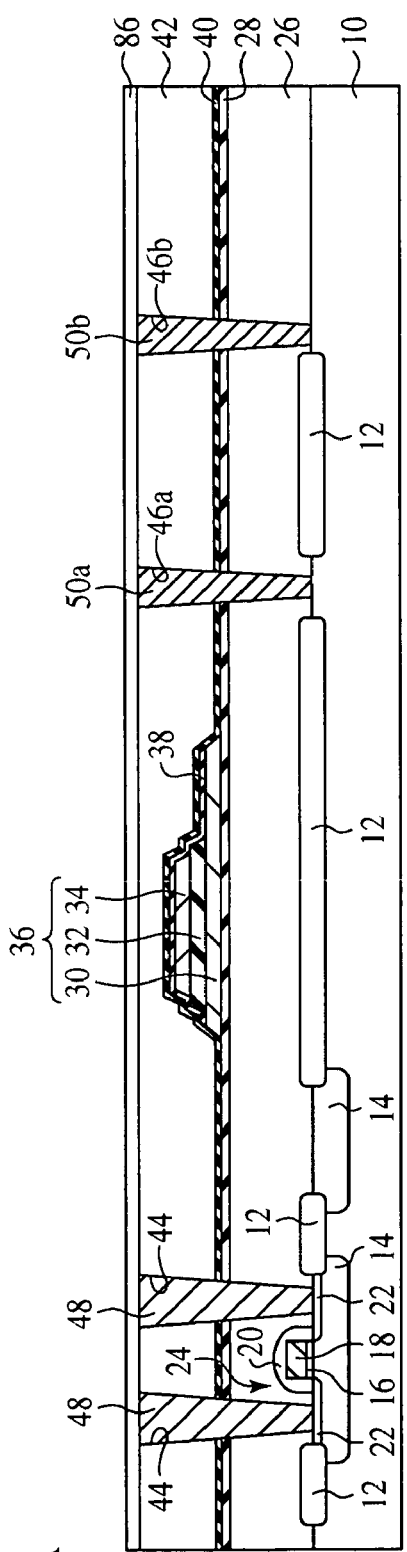
FIGS. 4A and 4B are sectional views of the semiconductor device according to the first embodiment in the steps of the method for manufacturing the semiconductor device, which illustrate the method (Part 2).

Then, with the photoresist film as the mask, the inter-layer insulation film 42, the insulative barrier film 40, the insulative barrier film 28 and the inter-layer insulation film 26 are etched to form the contact holes 44 down to the source/drain diffused layer 22 and the openings 46a, 46b down to the semiconductor substrate 10 (see FIG. 4A).

Then, on the entire surface a 20 nm-thickness Ti film (not illustrated) and a 50 nm-thickness TiN film (not illustrated) are sequentially formed by, e.g., PVD. Thus, the barrier metal film (not illustrated) of the Ti film and the TiN film is formed in the contact holes 44 and the openings 46a, 46b.

Then, on the entire s surface a 500 nm-thickness tungsten film is formed by, e.g., CVD.

Next, by, e.g., CMP, the tungsten film and the barrier metal film are polished until the surface of the inter-layer insulation film 42 is exposed. Thus, the conductor plugs 48 of tungsten are buried in the contact holes 44. In the openings 46a, 46b, the metal layer 50a, 50b of tungsten is buried. The metal layer 50a, 50b is to be a part of the seal rings.

Then, in a plasma atmosphere generated with $N_2O$ gas, thermal processing is made (plasma anneal). The plasma anneal is for removing water present inside the inter-layer insulation film 42 and nitriding the surface of the inter-layer insulation film 42. The plasma anneal can be made with, e.g., a CVD system. The conditions for the plasma anneal are, e.g., 350° C. and 2 minutes.

Next, on the entire surface, a 100 nm-thickness silicon nitride film 86, for example, is formed by, e.g., plasma CVD. The silicon nitride film 86 is for preventing the surfaces of the conductor plugs 48 from being damaged.

Figure 4B:
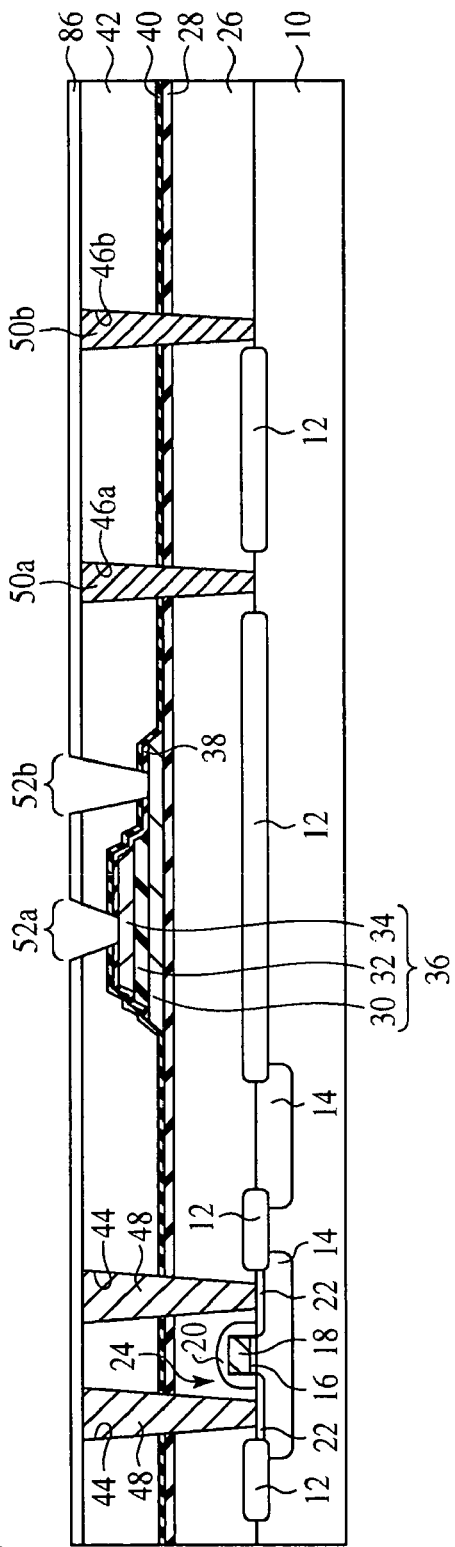

Then, as illustrated in FIG. 4B, by photolithography, the contact holes 52a down to the upper electrodes 34 and the contact holes 52b down to the lower electrodes 30 are formed in the inter-layer insulation film 42 and the silicon nitride film 86.

Then, thermal processing of, e.g. 500° C. and 60 minutes is made in an oxygen atmosphere. This thermal processing is for supplying oxygen to the dielectric film 32 of the capacitors 36 and recovering the film quality of the dielectric film 32. The flow rate of the oxygen gas to be fed into the chamber in the thermal processing is, e.g., 20 liters/minute. The thermal processing is made with, e.g., a vertical furnace annealer.

Figure 5A:
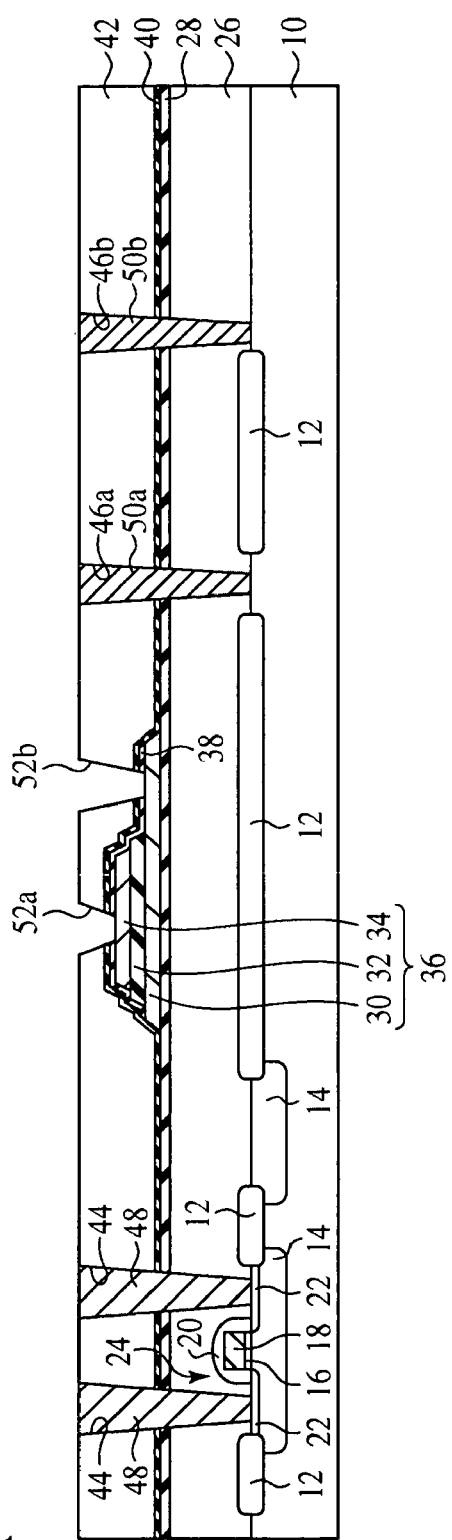
FIGS. 5A and 5B are sectional views of the semiconductor device according to the first embodiment in the steps of the method for manufacturing the semiconductor device, which illustrate the method (Part 3).
Figure 5B:
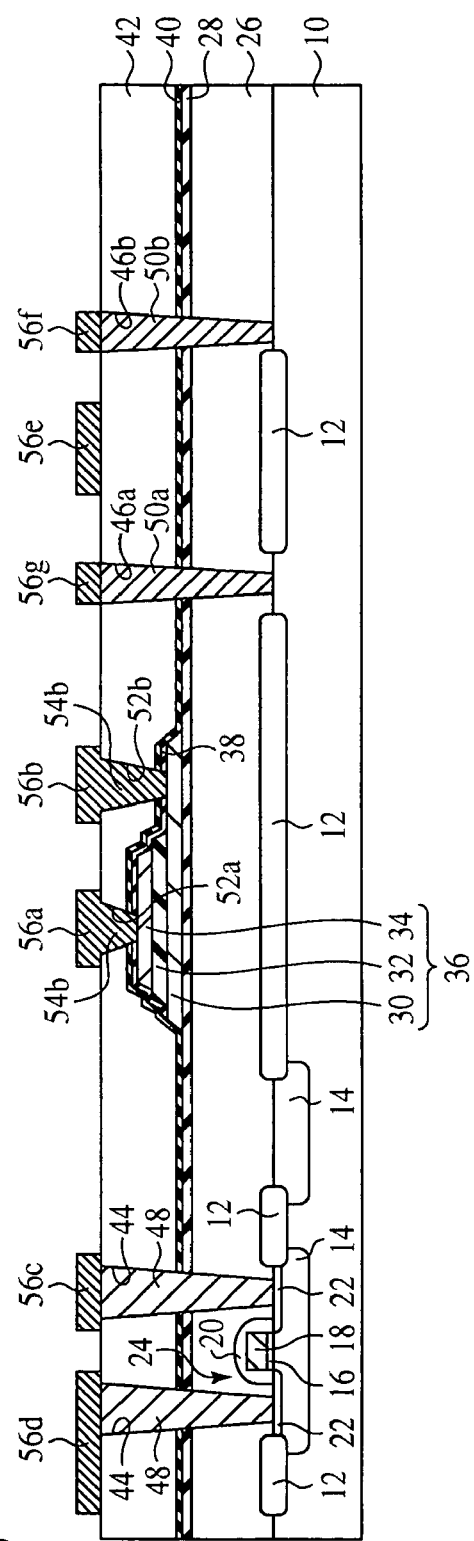

Next, as illustrated in FIG. 5A, by, e.g., the total surface etching-back, the silicon nitride oxide film 86 present on the inter-layer insulation film 42 is removed.

Next, on the entire surface, a 150 nm-thickness TiN film, a 550 nm-thickness Al—Cu alloy film, a 5 nm-thickness Ti film and a 150 nm-thickness TiN film are sequentially formed by, e.g., PVD. Thus, the layer film of the TiN film, the Al—Cu alloy film, the Ti film and the TiN film is formed.

Then, by photolithography, the layer film is patterned. Thus, in the contact holes 52a and on the inter-layer insulation film 42, the conductor plugs 54a and the interconnections 56a are integrally formed of the layer film. In the contact holes 52b and on the inter-layer insulation film 42, the conductor plugs 54b and the interconnections 56b are integrally formed of the layer film. On the inter-layer insulation film 42, the interconnections 56c-56d are formed of the layer film. On the inter-layer insulation film 42, the electrodes 56e are formed. On the metal layer 50b, the metal layer 56f of the layer film is formed. On the metal layer 50a, the metal layer 56g of the layer film is formed. The metal layer 56g is to be parts of the inner seal rings 75a. The metal layer 56f is to be parts of the outer seal rings 75b (see FIG. 5B).

Then, thermal processing of, e.g., 350° C. and 30 minutes is made in a nitrogen atmosphere. By this thermal processing, the adhesion of the insulative barrier film 58 to the base can be improved in forming the insulative barrier film 58 in a later step. The flow rate of nitrogen gas to be fed into the chamber in the thermal processing is, e.g., 20 liters/minute. The thermal processing is made with, e.g., a vertical furnace annealer.

Figure 6:
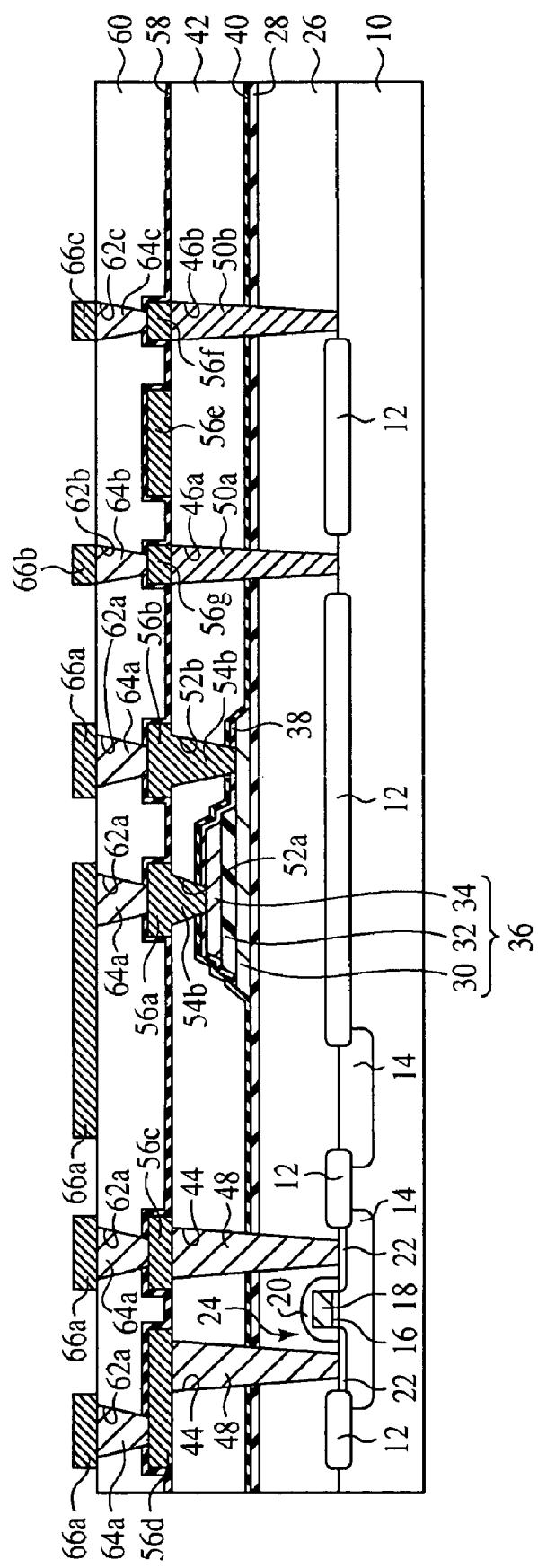
FIG. 6 is a sectional view of the semiconductor device according to the first embodiment in the step of the method for manufacturing the semiconductor device, which illustrates the method (Part 4).
Figure 7:
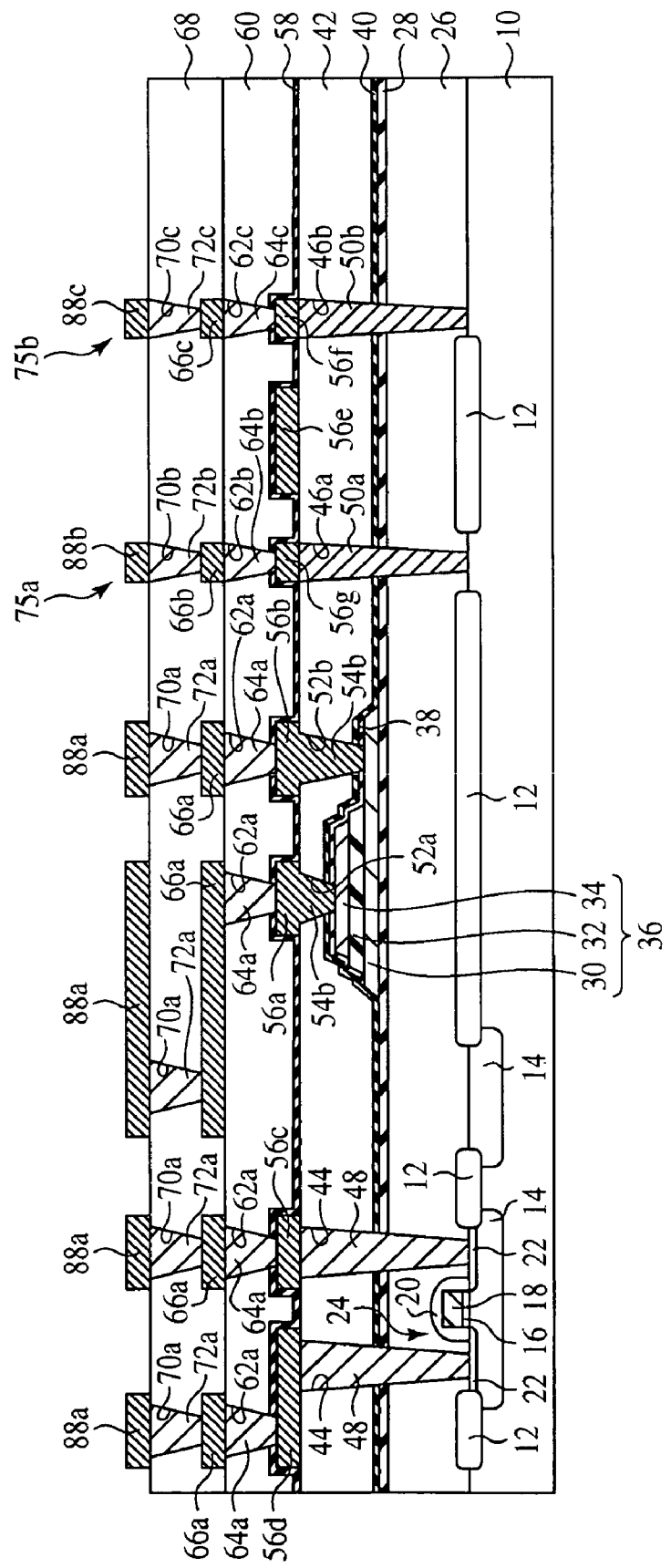
FIG. 7 is a sectional view of the semiconductor device according to the first embodiment in the step of the method for manufacturing the semiconductor device, which illustrates the method (Part 5).
Figure 8:
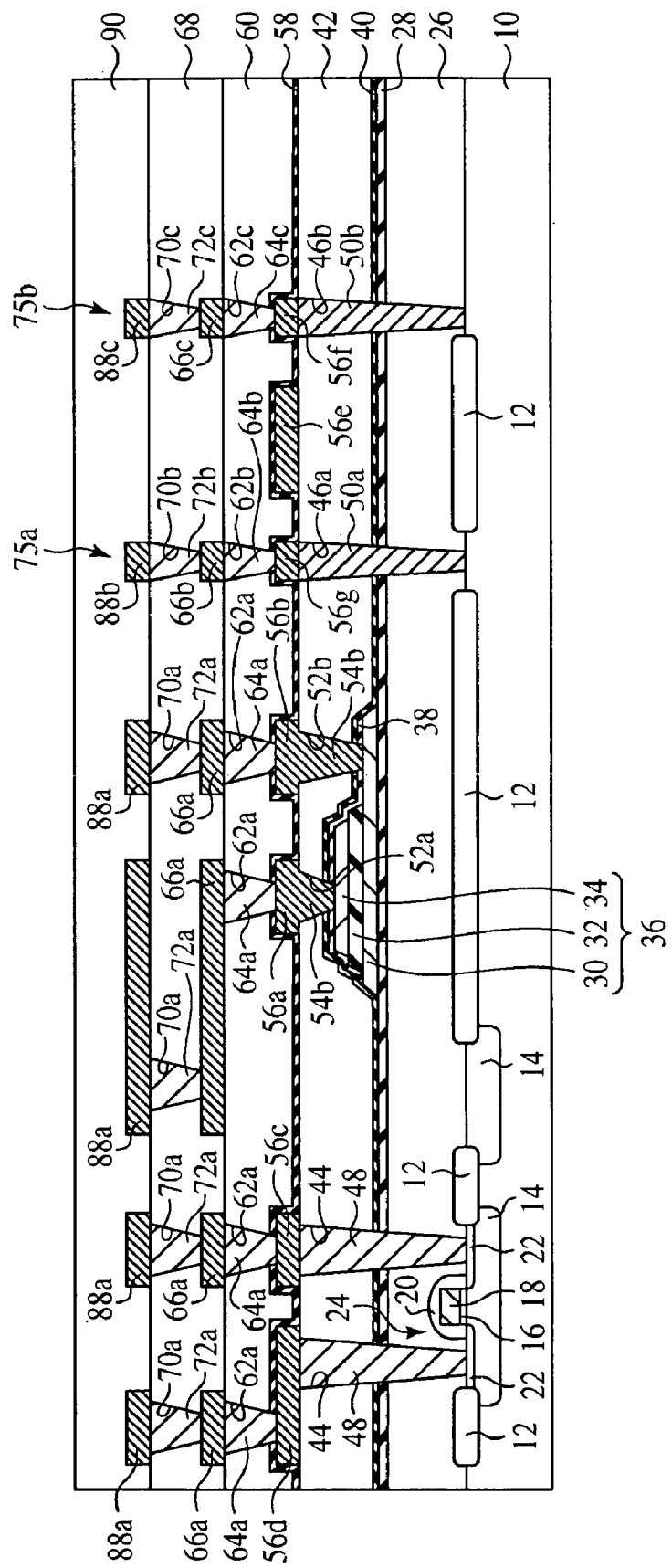
FIG. 8 is a sectional view of the semiconductor device according to the first embodiment in the step of the method for manufacturing the semiconductor device, which illustrates the method (Part 6).
Figure 9:
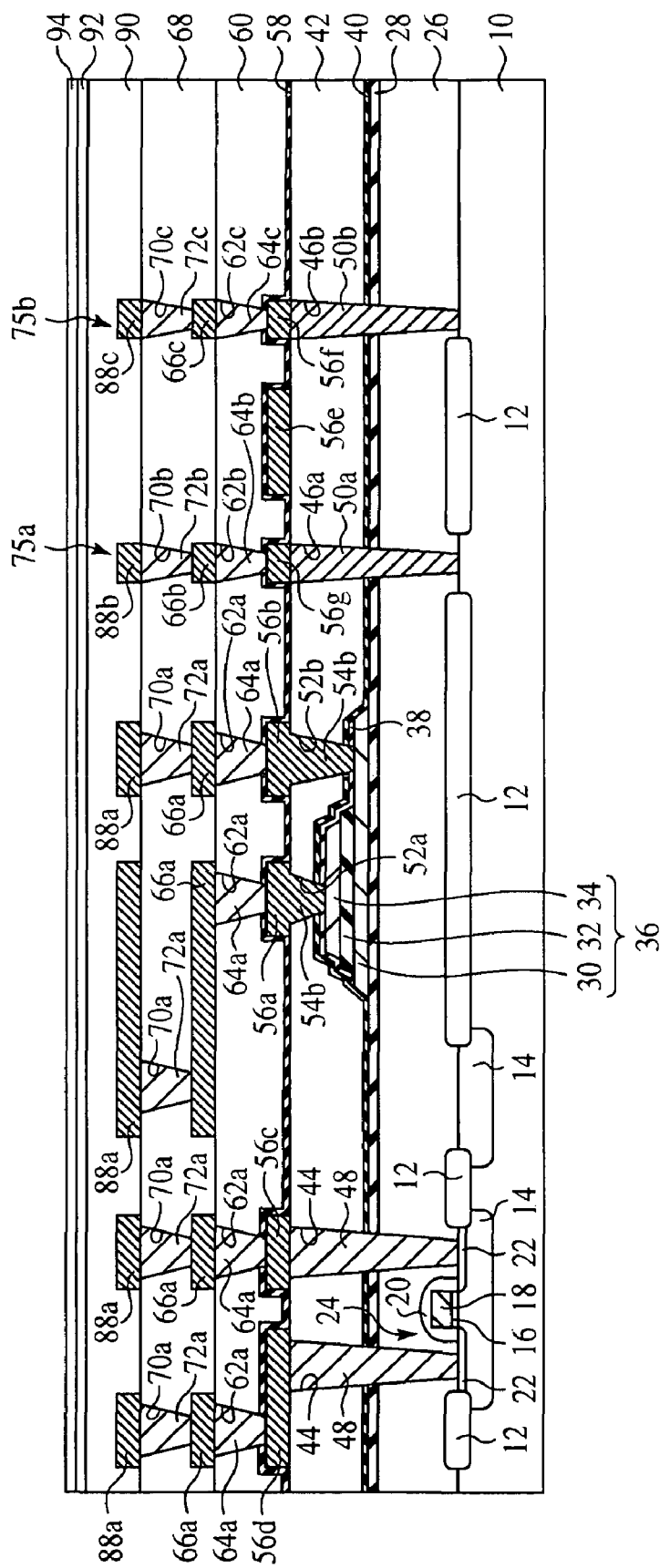
FIG. 9 is a sectional view of the semiconductor device according to the first embodiment in the step of the method for manufacturing the semiconductor device, which illustrates the method (Part 7).

Next, as illustrated in FIG. 6, on the entire surface, the insulative barrier film 58 of, e.g. a 20 nm-thickness aluminum oxide film is formed by, e.g., PVD. The insulative barrier film 58 is for preventing the arrival of hydrogen and water at the dielectric film 32 of the capacitors 36.

Next, on the entire surface, a 2600 nm-thickness silicon oxide film (not illustrated) is formed by, e.g., plasma TEOSCVD.

Then, the surface of the silicon oxide film is planarized by, e.g., CMP.

Then, in a plasma atmosphere generated with N₂O gas, thermal processing is made (plasma anneal). The plasma anneal is for removing the water present inside the silicon oxide film and nitriding the surface of the silicon oxide film. The plasma anneal can be made with, e.g., a CVD system. The conditions for the plasma anneal are, e.g., 350° C. and 4 minutes.

Next, on the entire surface, a 100 nm-thickness silicon oxide film (not illustrated) is formed by, e.g., plasma TEOSCVD.

Next, in a plasma atmosphere generated with N₂O gas, thermal processing is made (plasma anneal). The plasma anneal is for removing the water present inside the silicon oxide film and nitriding the surface of the silicon oxide film. The plasma anneal can be made with, e.g., a CVD system. The conditions for the plasma anneal are, e.g., 350° C. and 2 minutes.

Thus, the silicon oxide film and the inter-layer insulation film 60 of the silicon oxide film are formed. The surface of the inter-layer insulation film 60 is flat.

Next, by photolithography, the contact holes 62a down to the interconnections 56a-56d, the openings 62b down to the metal layer 56g and the openings 62c down to the metal layer 56f are formed.

Next, on the entire surface, a 50 nm-thickness TiN film is formed by, e.g., PVD (not shown).

Next, on the entire surface, a 650 nm-thickness tungsten film is formed by, e.g., CVD.

Then, the tungsten film and the barrier metal film are etched back until the surface of the inter-layer insulation film 60 is exposed. Thus, the conductor plugs 64a of tungsten are buried in the contact holes 62a, and in the openings 62b, 62c, the metal layer 64b, 64c of tungsten is buried.

The conductor plugs 64a, 64 and the metal layer 64c may be formed by polishing the tungsten film and the barrier metal film by CMP until the surface inter-layer insulation film 60 is exposed.

Next, on the entire surface, a 550 nm-thickness Al—Cu alloy film, a 5 nm-thickness Ti film and a 150 nm-thickness TiN film are sequentially formed by, e.g., PVD. Thus, the layer film of the Al—Cu alloy film, the Ti film and TiN film is formed.

Next, by photolithography, the layer film is patterned. Thus, the interconnections 66a and the metal layer 66b, 66c of the layer film are formed.

Next, on the entire surface, a 2200 nm-thickness silicon oxide film (not illustrated) is formed by, e.g., plasma TEOSCVD.

Next, the surface of the silicon oxide film is planarized by, e.g., CMP.

Next, thermal processing is made in a plasma atmosphere generated with N₂O gas (plasma anneal). The plasma anneal is for removing the water present inside the silicon oxide film and nitriding the surface of the silicon oxide film. The plasma anneal can be made with, e.g., a CVD system. The conditions for the plasma anneal are, e.g., 350° C. and 4 minutes.

Next, on the entire surface, a 100 nm-thickness silicon oxide film (not illustrated) is formed by, e.g., plasma TEOSCVD.

Next, thermal processing is made in a plasma atmosphere generated with N₂O gas (plasma anneal). The plasma anneal is for removing the water present inside the silicon oxide film and nitriding the surface of the silicon oxide film. The plasma anneal can be made with, e.g., a CVD system. The conditions for the plasma anneal are, e.g., 350° C. and 2 minutes. Thus, the inter-layer insulation film 68 of the silicon oxide film and the silicon oxide film are formed (see FIG. 7).

Next, by photolithography, the contact holes 70a down to the interconnection 66a and the openings 70b down to the metal layer 66b and the openings 70c down to the metal layer 66c are formed in the inter-layer insulation film 68.

Next, on the entire surface, a barrier metal film (not illustrated) of a 50 nm-thickness TiN film is formed by, e.g., PVD.

Next, on the entire surface, a 650 nm-thickness tungsten film is formed by, e.g, CVD.

Then, the tungsten film and the barrier metal film are etched back until the surface of the inter-layer insulation film is exposed. Thus, in the contact holes 70a, the conductor plugs 72a of the tungsten are buried. In the openings 70b, the metal layer 72b of the tungsten is buried. In the openings 70c, the metal layer 72c of the tungsten is buried.

The conductor plugs 72a and the metal layers 72b, 72c may be formed by polishing the tungsten film and the barrier metal film by CMP until the surface of the inter-layer insulation film 86 is exposed.

Next, on the entire surface, a 550 nm-thickness Al—Cu alloy film, a 5 nm-thickness Ti film and a 150 nm-thickness TiN film are sequentially formed by, e.g., PVD. Thus, the layer film of the Al—Cu alloy film, the Ti film and the TiN film are formed.

Next, by photolithography, the layer film is patterned. Thus, the interconnections 88a, the metal layers 88b, 88c are formed of the layer film.

The inner seal rings 75a are formed of the metal layer 50a, the metal layer 56g, the metal layer 64b, the metal layer 66c, the metal layer 72b and the metal layer 88b. The outer seal rings 75b are formed of the metal layer 50b, the metal layer 56f, the metal layer 64c, the metal layer 66c, the metal layer 72c and the metal layer 88c. Then, the photoresist film is released.

Next, on the entire surface, a 2200 nm-thickness silicon oxide film (not illustrated) is formed by, e.g., plasma TEOSCVD.

Next, the surface of the silicon oxide film is planarized by, e.g., CMP.

Next, thermal processing is made in a plasma atmosphere generated with $N_2O$ gas (plasma anneal). The plasma anneal is for removing the water present inside the silicon oxide film and for nitriding the surface of the silicon oxide film. The plasma anneal can be made with, e.g., a CVD system. The conditions for the plasma anneal are, e.g. 350° C. and 4 minutes.

Next, on the entire surface, a 100 nm-thickness silicon oxide film (not illustrated) is formed by, e.g., plasma TEOSCVD.

Next, thermal processing is made in a plasma atmosphere generated with $N_2O$ gas (plasma anneal). The plasma anneal is for removing the water present inside the silicon oxide film and for nitriding the surface of the silicon oxide film. The plasma anneal can be made with, e.g., a CVD system. The conditions for the plasma anneal are, e.g., 350° C. and 2 minutes. Thus, the inter-layer insulation film 90 of the silicon oxide film and the silicon oxide film is formed (see FIG. 8).

Next, on the inter-layer insulation film 90 with the surface planarized, the flat insulative barrier film 92 of a 20-80 nm-thickness aluminum oxide film is formed by, e.g., PVD. The film thickness of the aluminum oxide film forming the insulative barrier film 92 is, e.g., 50 nm. The insulative barrier film 92 is flat so as to form the insulative barrier film 92 on the planarized inter-layer insulation film 90. The flat insulative barrier film 92 has good coverage and can sufficiently prevent the diffusion of hydrogen and water.

Next, on the insulative barrier film 92, a 100 nm-thickness silicon oxide film 94 is formed by, e.g., plasma TEOSCVD. The silicon oxide film 94 is for preventing the insulative barrier film 92 from being etched in the patterning for forming the electrode pads 102, etc. (see FIG. 9).

Next, on the entire surface, a photoresist film 112 is formed by, e.g., spin coating.

Figure 10:
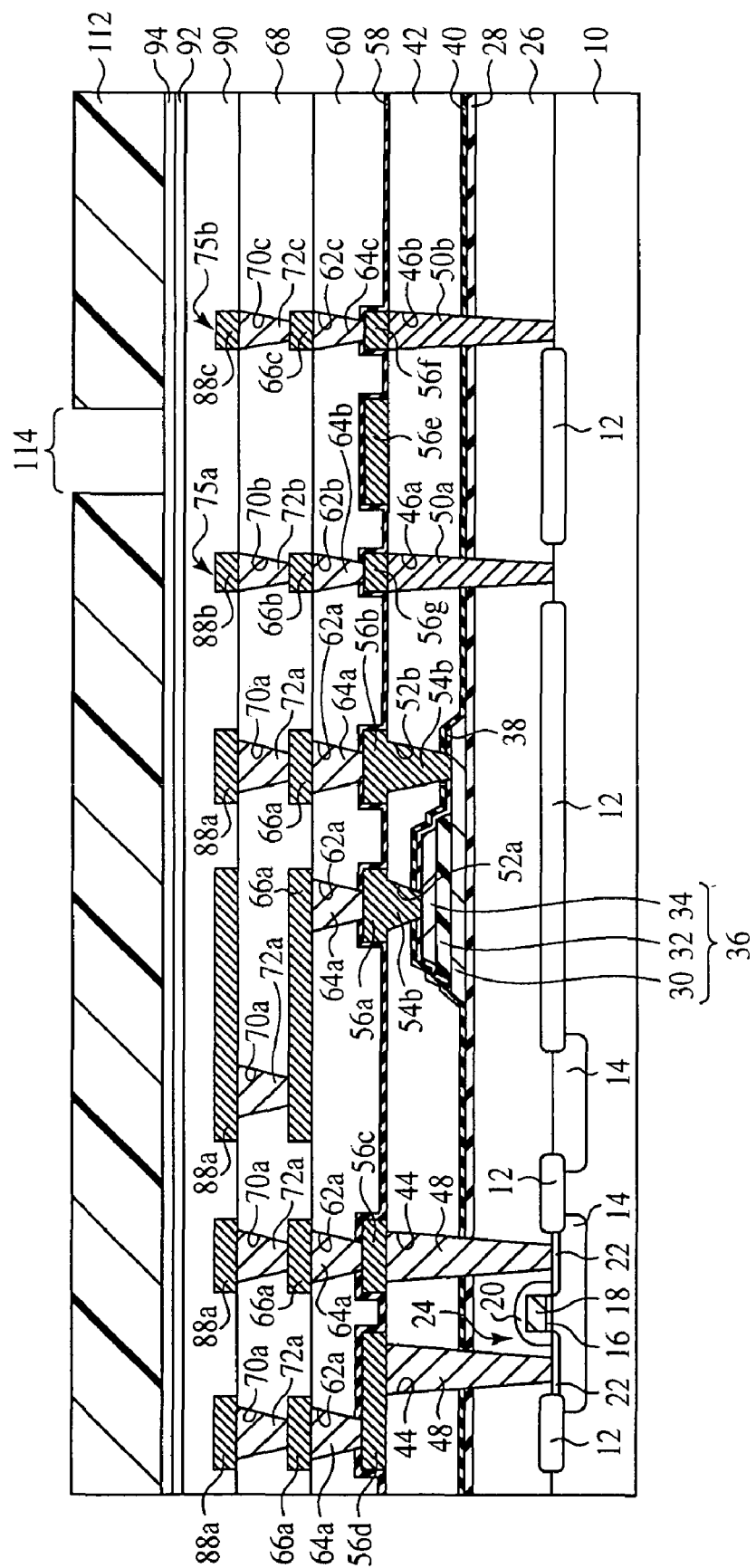
FIG. 10 is a sectional view of the semiconductor device according to the first embodiment in the step of the method for manufacturing the semiconductor device, which illustrates the method (Part 8).

Next, by photolithography, the openings 114 are formed in the photoresist film 112 (see FIG. 10). The openings 114 are for forming the openings 96.

Figure 11:
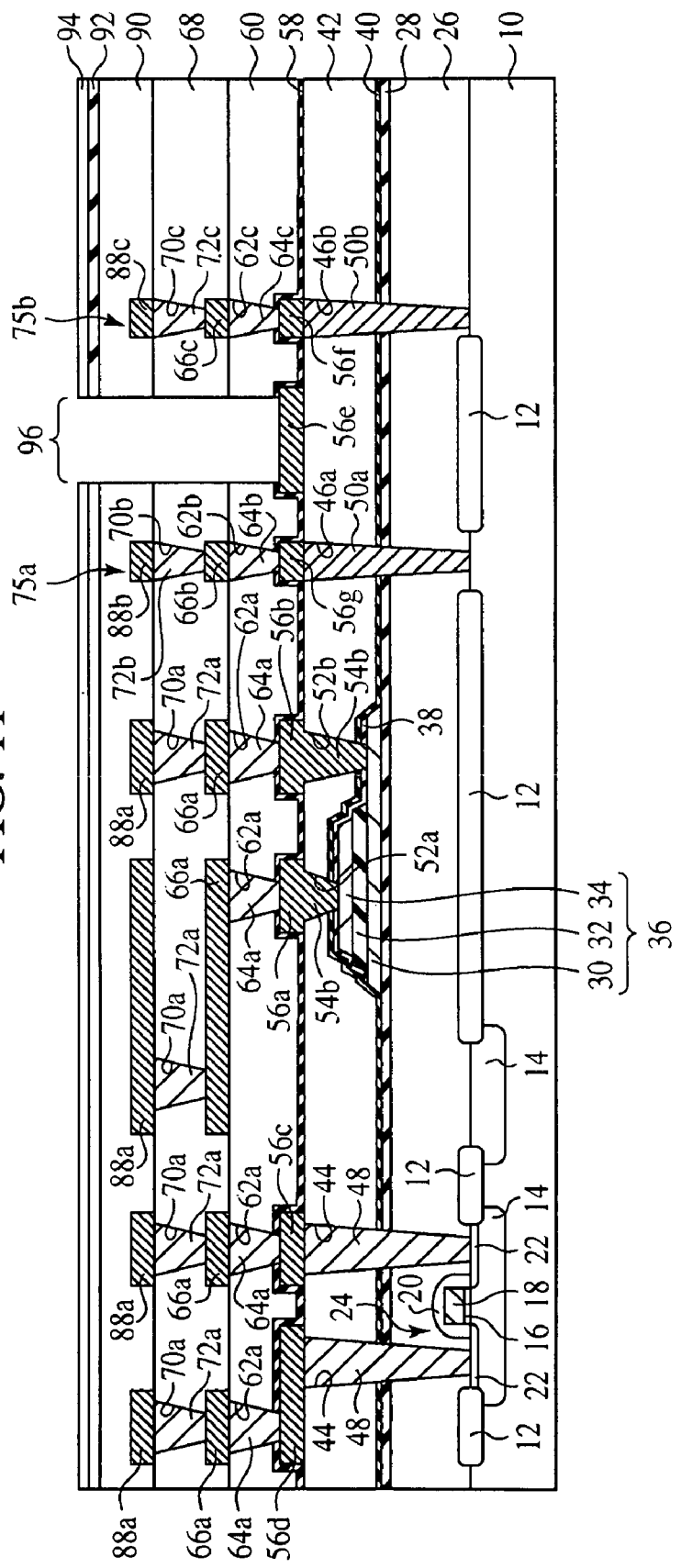
FIG. 11 is a sectional view of the semiconductor device according to the first embodiment in the step of the method for manufacturing the semiconductor device, which illustrates the method (Part 9).

Next, with the photoresist film 112 as the mask and with the electrodes 56e as the etching stopper, the openings 96 are formed down to the electrodes 56e in the silicon oxide film 94, the insulative barrier film 92, the inter-layer insulation film 90, the inter-layer insulation film 68, the inter-layer insulation film 60 and the insulative barrier film 58 (see FIG. 11).

Next, in the openings 96 and on the silicon oxide film 94, the barrier metal film 98 of, e.g., a 150 nm-thickness Ti—Al—N alloy is formed. The barrier film 98 prevents the diffusion the material forming the conductors 100 into the inter-layer insulation films 60, 68, 90, etc. and functions as the seed layer for forming the conductors 100 by electroplating.

Figure 12:
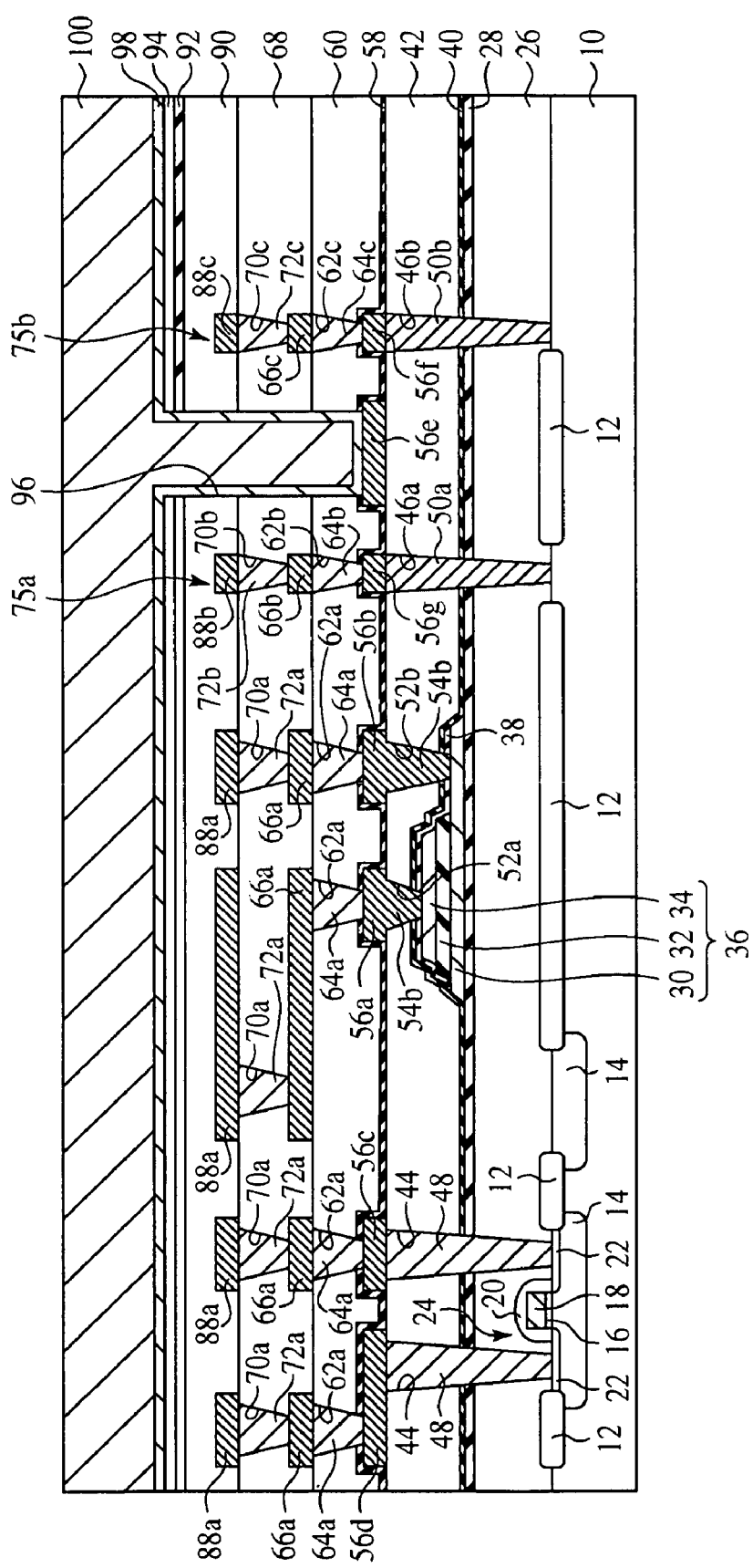
FIG. 12 is a sectional view of the semiconductor device according to the first embodiment in the step of the method for manufacturing the semiconductor device, which illustrates the method (Part 10).
Figure 13:
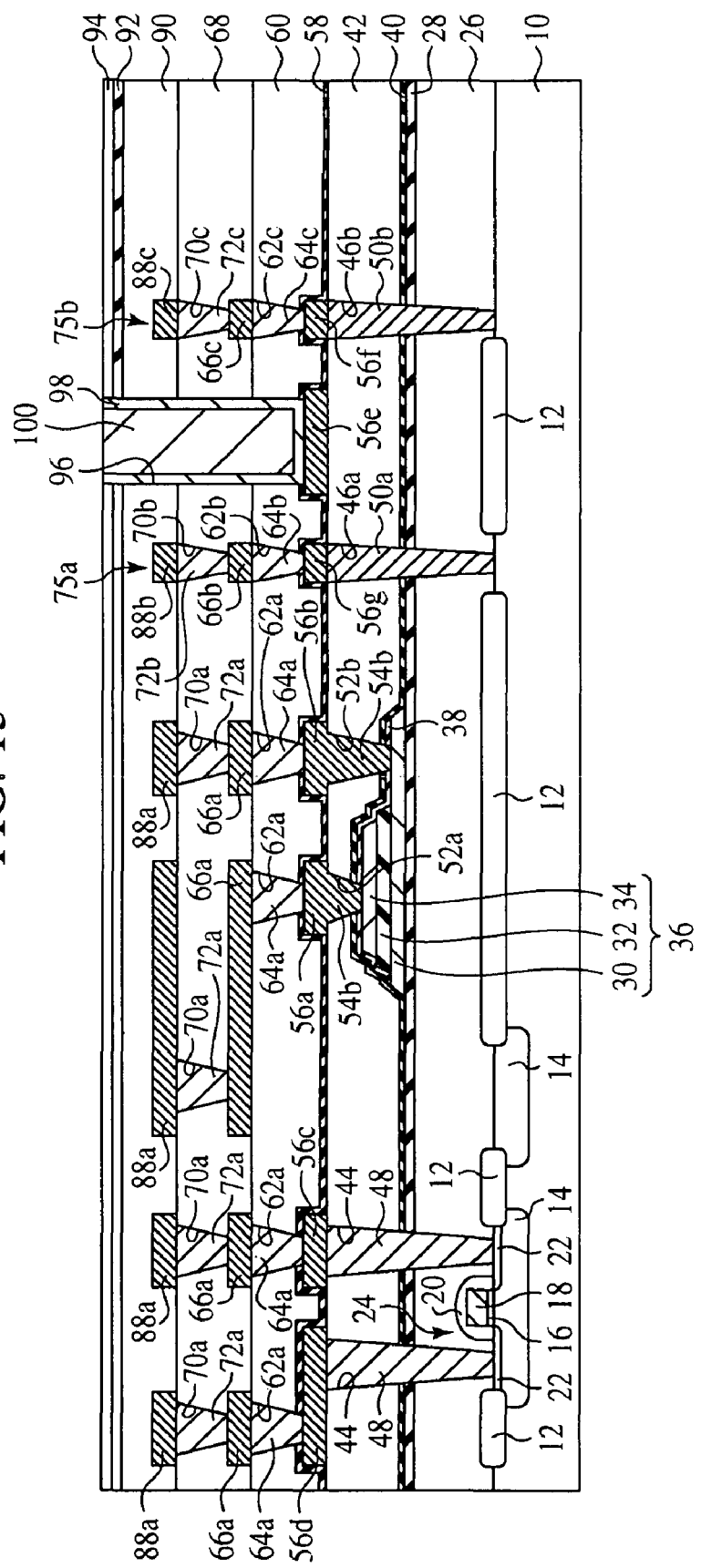
FIG. 13 is a sectional view of the semiconductor device according to the first embodiment in the step of the method for manufacturing the semiconductor device, which illustrates the method (Part 11).

Next, by electroplating, the conduction layer 100 of, e.g., a 3 μm-thickness Cu film is formed (see FIG. 12).

The conduction layer 100 is formed by electroplating here but is not formed essentially by electroplating. For example, the conduction layer 100 can be formed by coating. For example, a coated conductors film is formed on the entire surface and is etched back to bury the conductors 100 of the coated conductor film in the openings 96. The coated conductor film is formed on the entire surface and is polished by CMP until the surface of the silicon oxide film 94 is exposed to thereby the conductors 100 of the coated conductor film can be buried in the openings 96.

As the material of the barrier metal film 98, Ti—Al—N alloy is used here, but the material of the barrier metal film 98 is not limited to Ti—Al—N alloy. For example, TiN, Ti, Ta, etc. may be used as the material of the barrier metal film 98. The composite material of the Ti—Al—N alloy and Ta may be used as the material of the barrier metal film 98.

As the material of the conduction layer 100, Cu is used here. However, the material of the conduction layer 100 is not limited to Cu.

For example, Al can be used as the material of the conduction layer 100. Al has a higher hardness than Cu. Accordingly, using Al as the material of conduction layer 100 can make the conductors 100 harder in comparison with using Cu as the material of the conduction layer 100. The use of Al as the material of the conduction layer 100 allows TiN, TiW, etc. to be used as the material of the barrier metal film 98.

Au may be used as the material of the conductor layer 100. Au has a higher hardness than Al. Accordingly, using Au as the material of conduction layer 100 can make the conductors 100 harder in comparison with using Al as the material of the conduction layer 100. The use of Au as the material of the conduction layer 100 allows TiN, TiW, etc. to be used as the material of the barrier metal film 98.

Next, the barrier metal film 98 and the conduction layer 100 are polished by CMP until the surface of the silicon oxide film 94 is exposed. Thus, in the openings 96, the conductors 100 of the conductor layer are buried (see FIG. 13).

Figure 14:
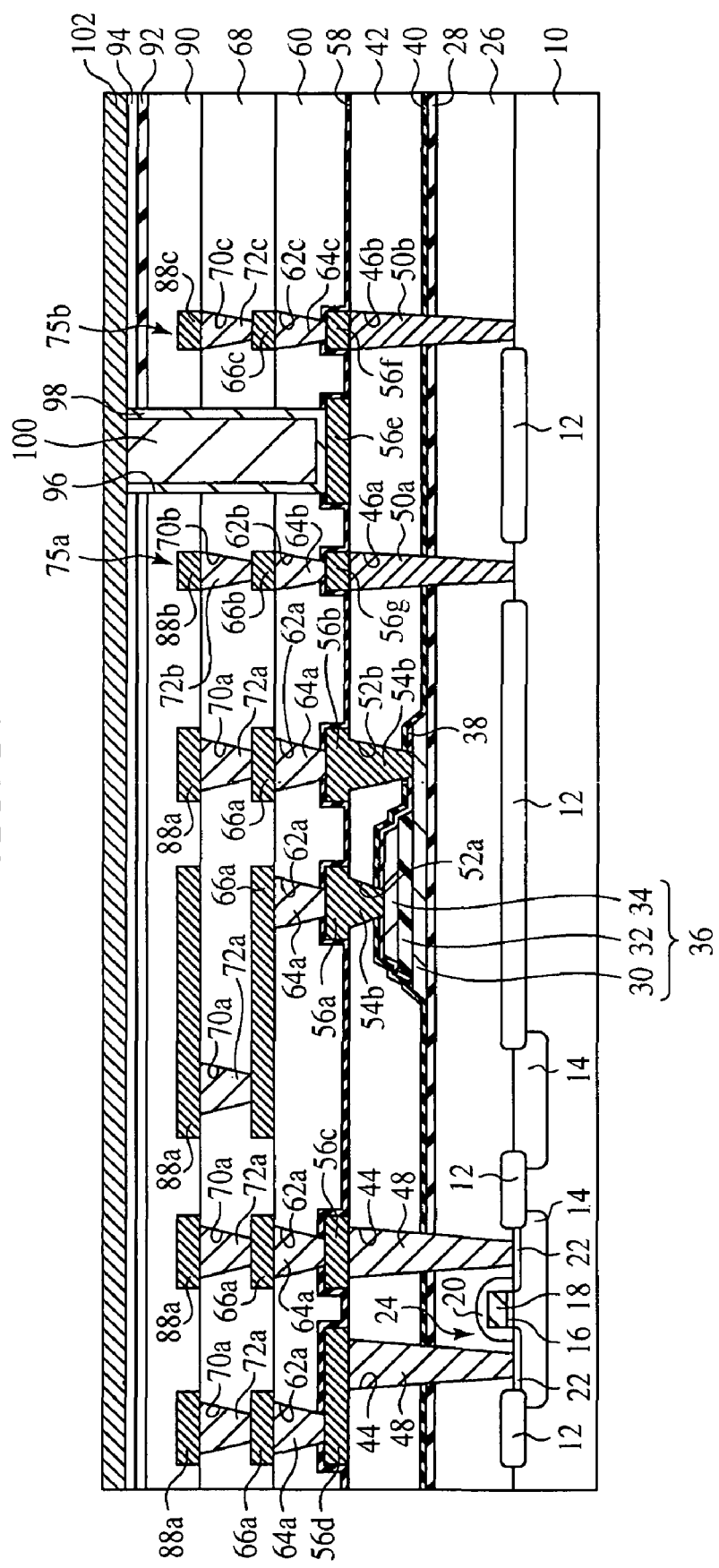
FIG. 14 is a sectional view of the semiconductor device according to the first embodiment in the step of the method for manufacturing the semiconductor device, which illustrates the method (Part 12).
Figure 15:
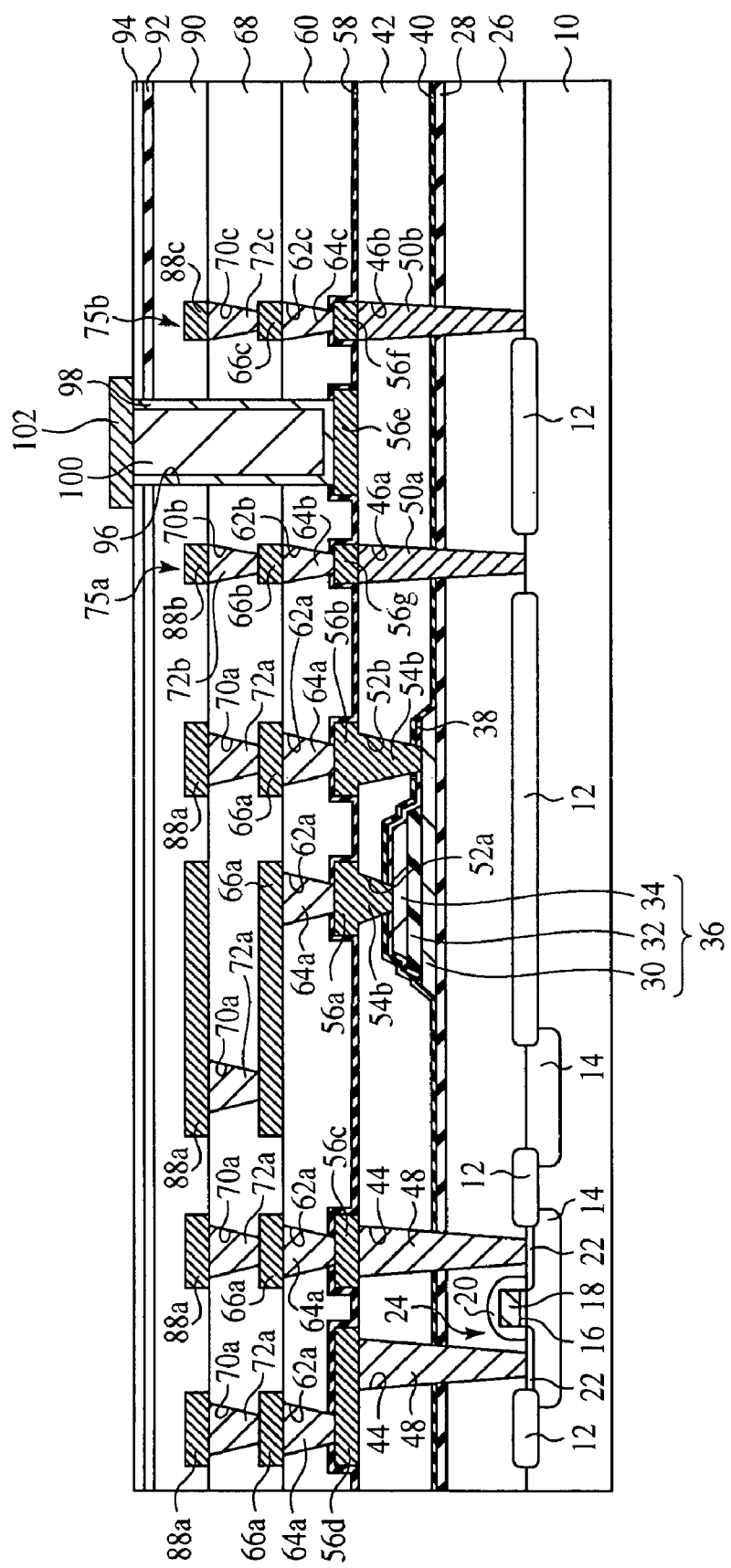
FIG. 15 is a sectional view of the semiconductor device according to the first embodiment in the step of the method for manufacturing the semiconductor device, which illustrates the method (Part 13).

Next, on the entire surface, a 0.5 μm-thickness conduction film 102 is formed by, e.g., PVD (see FIG. 14). The conduction film 102 is to be the electrode pads. As the material of the conduction film 102, Al (aluminum) or Al—Cu (aluminum-copper) alloy or others are used.

Next, by photolithograpy, the conduction film 102 is patterned. Thus, the electrode pads 102 of the conduction film are formed (see FIG. 15).

Figure 16:
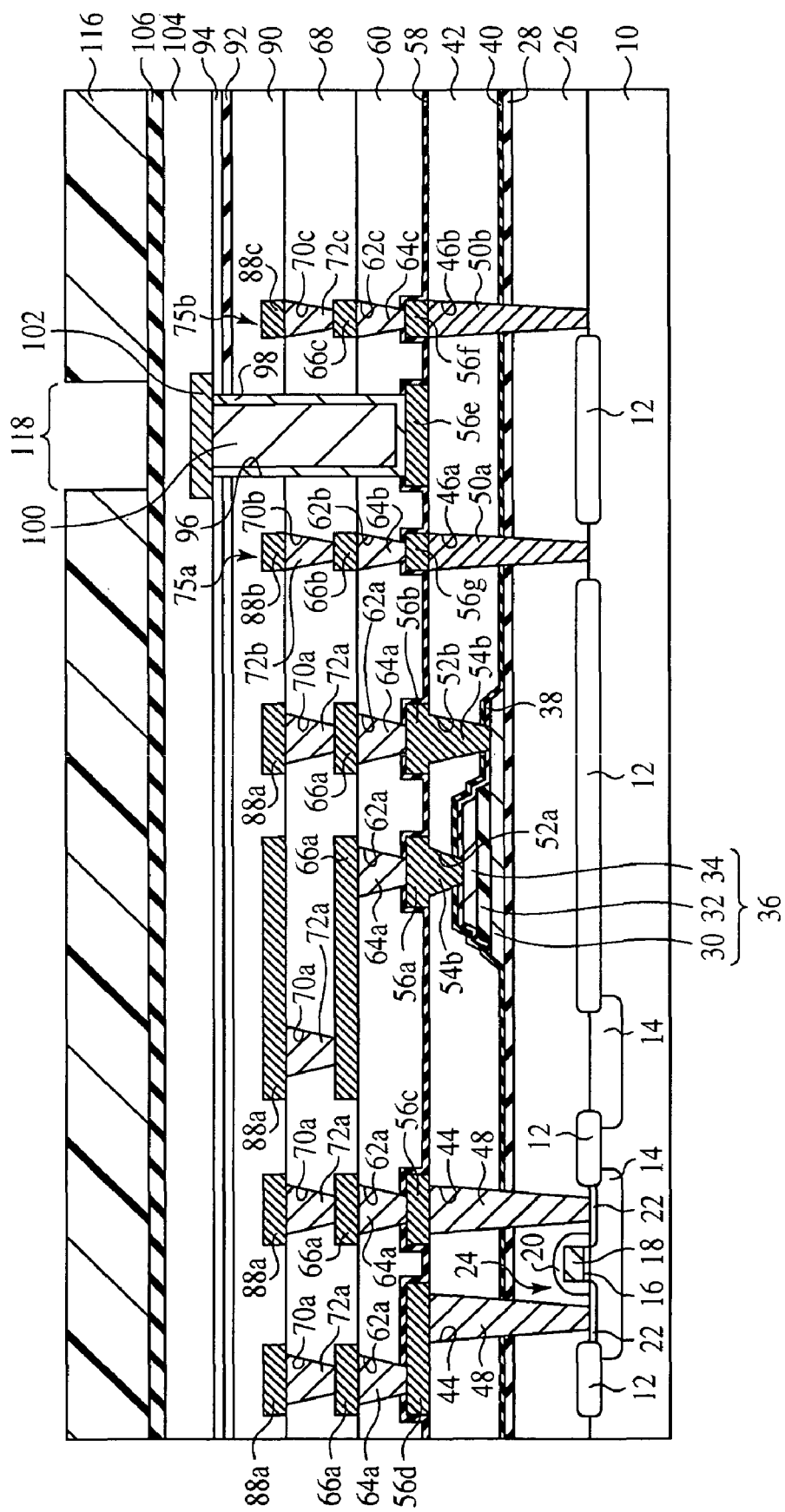
FIG. 16 is a sectional view of the semiconductor device according to the first embodiment in the step of the method for manufacturing the semiconductor device, which illustrates the method (Part 14).

Next, as illustrated in FIG. 16, on the entire surface, by, e.g., plasma TEOSCVD, the protection film 104 of, e.g., a 100 nm-thickness silicon oxide film is formed.

Next, on the entire surface, the protection film 106 of, e.g., a 350 nm-thickness silicon nitride film is formed.

Next, on the entire surface, a photoresist film 116 is formed by spin coating.

Next, by photolithography, the openings 118 are formed in the photoresist film 116 (see FIG. 16). The openings 118 are for forming the contact holes 110a (see FIG. 17) in the protection films 104, 106.

Figure 17:
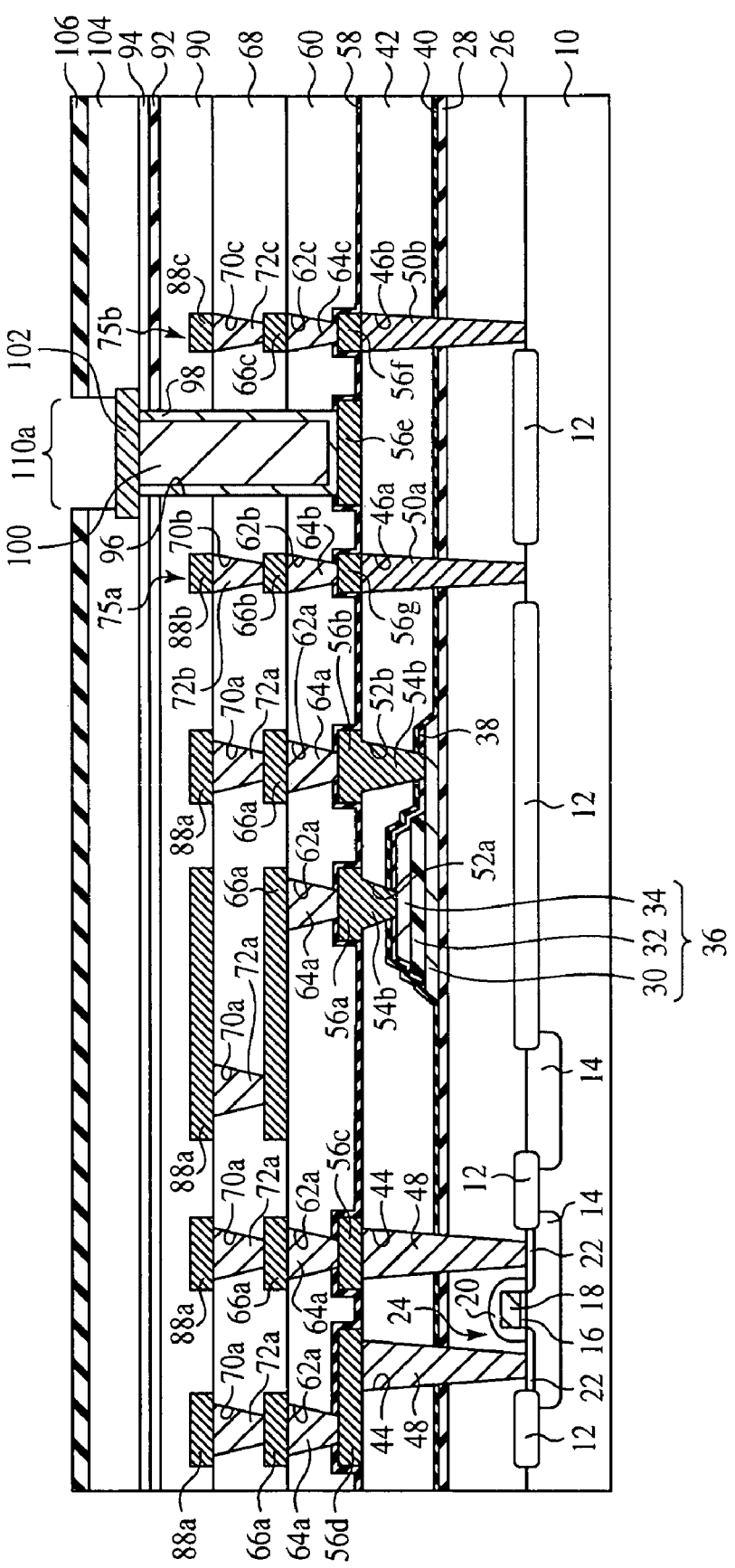
FIG. 17 is a sectional view of the semiconductor device according to the first embodiment in the step of the method for manufacturing the semiconductor device, which illustrates the method (Part 15).

Next, with the photoresist film 116 as the mask, the protection films 104, 106 are etched to form the openings 110a down to the electrode pads 102 (see FIG. 17).

Next, on the entire surface, by spin coating, the protection film 80 of, e.g., photosensitive polyimide is formed. The film thickness of the protection film 80 is, e.g., about 3 μm.

Figure 18:
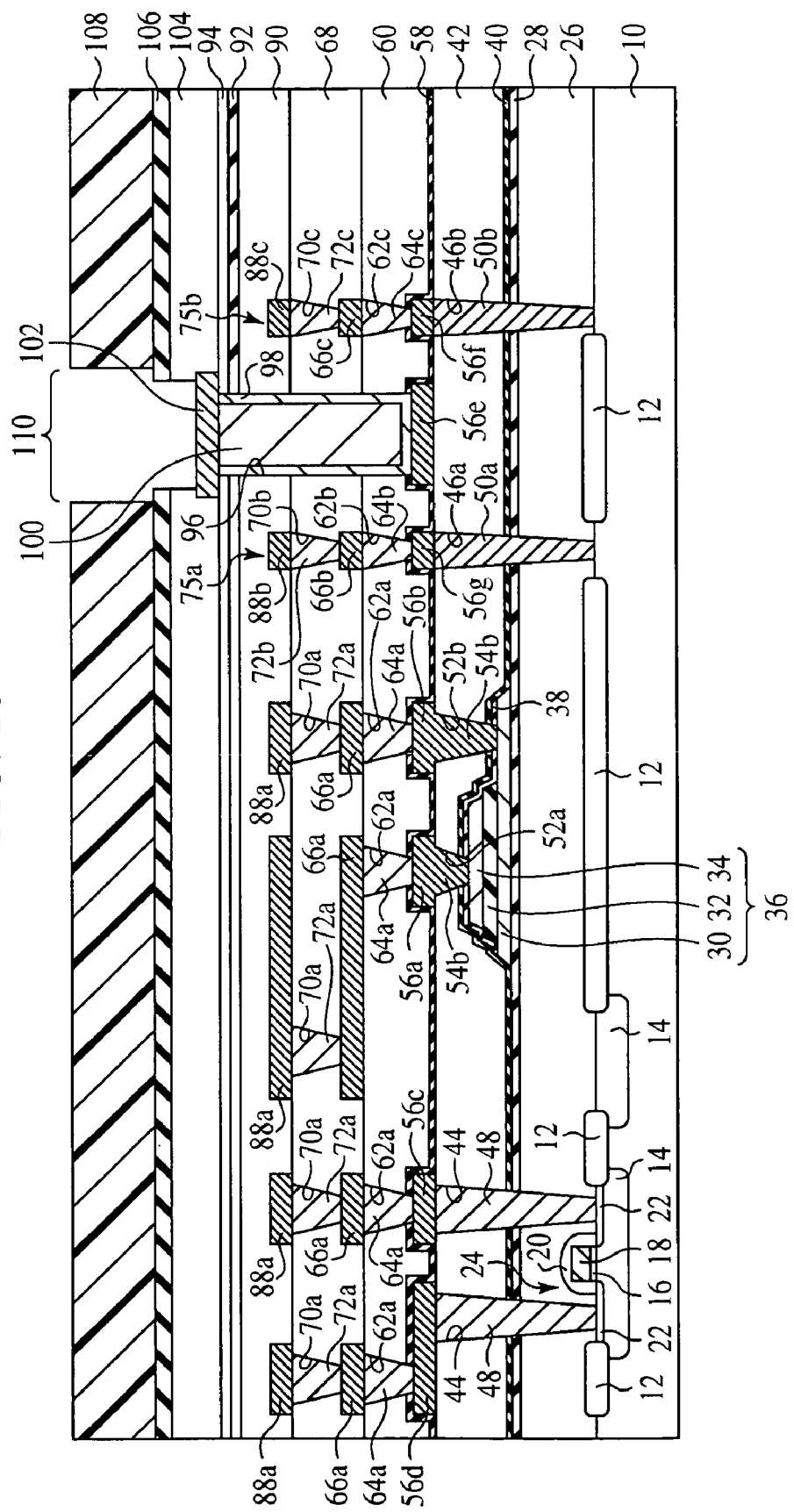
FIG. 18 is a sectional view of the semiconductor device according to the first embodiment in the step of the method for manufacturing the semiconductor device, which illustrates the method (Part 16).
Figure 19:
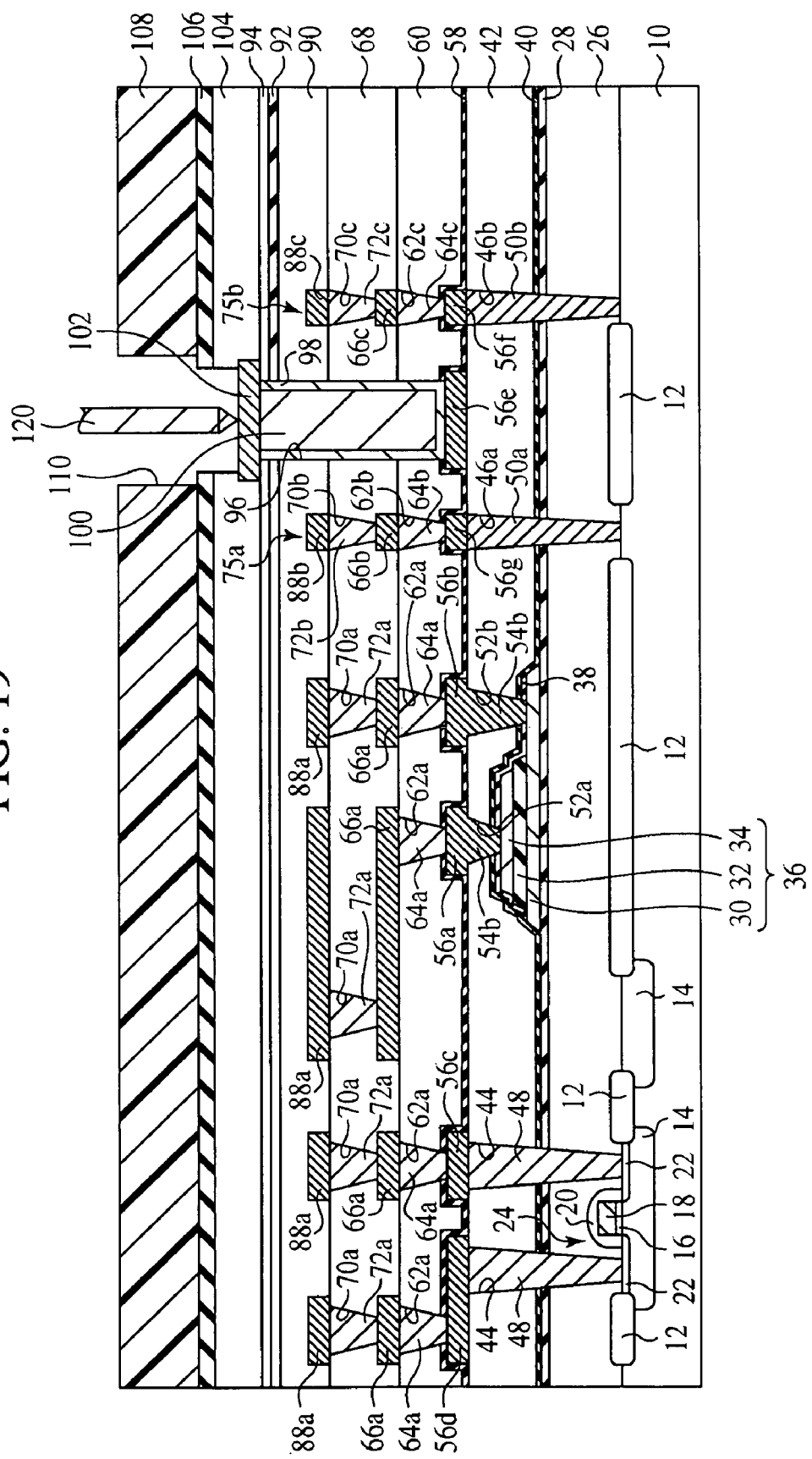
FIG. 19 is a sectional view of the semiconductor device according to the first embodiment in the step of the method for manufacturing the semiconductor device, which illustrates the method (Part 17).

Next, by photolithography, the openings 110 are formed down to the electrode pads 102 in the protection film 80 (see FIG. 18).

Next, in a nitrogen atmosphere, thermal processing of, e.g., 310° C. and 40 minutes is made. This thermal processing is for solidifying the protection film 80 of polyimide. The flow rate of the nitrogen gas to be fed into the chamber in the thermal processing is, e.g., 100 litters/minute. The thermal processing is made with, e.g., a vertical furnace annealer.

Next, the probe needle 120 of a semiconductor tester is contacted to the electrode pads 102 to thereby make prescribed tests, etc. on the semiconductor device according to the present embodiment. In the present embodiment, because of the strong conductors 100 being present immediately below the electrode pads 102, even when the probe needle is contacted to the electrode pads 102 with some force in tests, etc., the electrode pads 102 are prevented from being broken or deformed. Even if the electrode pads 102 should be broken or deformed, because of the conductors 100 present immediately below the electrode pads 102, which are formed very strong, no cracks that arrive at the inter-layer insulation films 60, 68, 90 take place in the conductors 100. Thus, according to the present embodiment, the intrusion of hydrogen and water from the electrode pad part 6 into the inside of the semiconductor device can be surely prevented by the conductors 100.

Then, the semiconductor wafer 10 is severed in the scribe region 8. The one-dot-chain line in FIG. 19 indicates the part where the semiconductor wafer 10 is cut.

Thus, the semiconductor device according to the present embodiment is manufactured.

According to the present embodiment, because of the strong conductors 100 being present immediately below the electrode pads 102, even when the probe needle is contacted to the electrode pads 102 with some force in tests, etc., the electrode pads 102 are prevented from being broken or deformed. Even if the electrode pads 102 should be broken or deformed, because of the conductors 100 present immediately below the electrode pads 102, which are formed very strong, no cracks that arrive at the inter-layer insulation films 60, 68, 90 take place in the conductor 100. According to the present embodiment, the arrival of hydrogen and water at the dielectric film 32 of the conductor 36 via the inter-layer insulation films 60, 68, 90, etc. can be prevented, and the ferroelectric forming the dielectric film 32 can be surely prevented from being deteriorated with hydrogen and water. As described above, according to the present embodiment, the dielectric film 32 of the capacitors 36 can be surely prevented from being deteriorated with hydrogen and water, and a semiconductor device including the capacitors 36 having good electric characteristics and a long life can be provided.

[Modifications]

Figure 20:
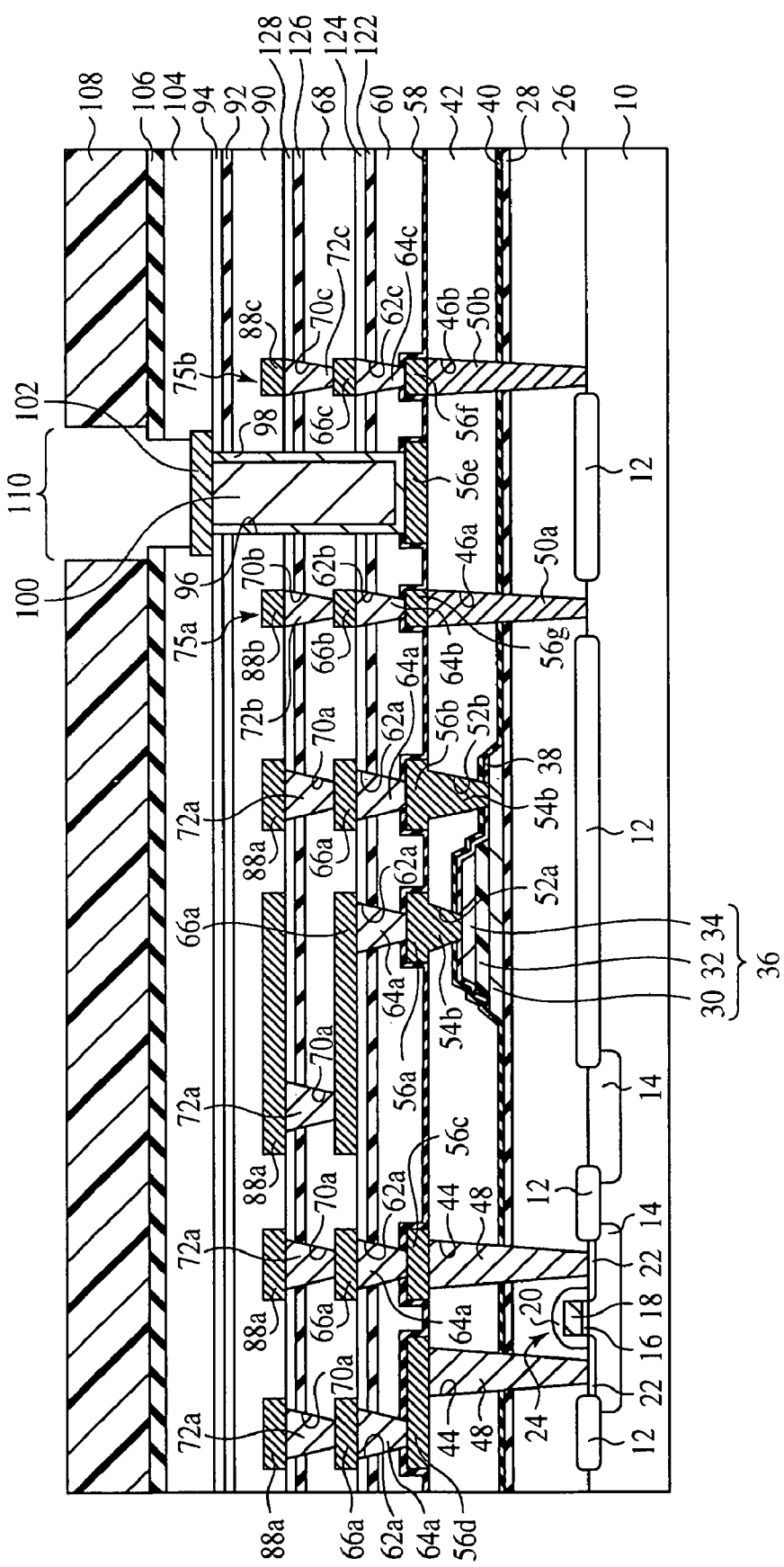
FIG. 20 is a sectional view of the semiconductor device according to a modification of the first embodiment.

Next, a modification of the semiconductor device according to the first embodiment will be explained with reference to FIG. 20. FIG. 20 is a sectional view of the semiconductor device according to the present modification. The same members of the present modification as those of the semiconductor device according to the first embodiment and the method for manufacturing the semiconductor device illustrated in FIGS. 1 to 19 are represented by the same reference numbers not to repeat or to simplify their explanation.

The semiconductor device according to the present modification is characterized mainly in that flat insulative barrier films 122, 126, 94 are suitably formed.

As illustrated in FIG. 20, on the inter-layer insulation film 60 having the surface planarized, the flat insulative barrier film 122 of, e.g., a 20-80 nm-thickness aluminum oxide film is formed. The film thickness of the aluminum oxide film forming the insulative barrier film 122 is, e.g., 50 nm here. The insulative barrier film 122, which is formed on the planarized inter-layer insulation film 60, is flat. The flat insulative barrier film 122 has good coverage and can sufficiently present the diffusion of hydrogen and water.

On the insulative barrier film 122, a 100 nm-thickness silicon oxide film 124, for example, is formed. The silicon oxide film 124 is for preventing the insulative barrier film 122 form being etched in patterning for forming the interconnections 66a-66d and the metal layers 66f, 66g.

On the inter-layer insulation film 68 having the surface planarized, the flat barrier film 126 of, e.g., a 20-80 nm-thickness aluminum oxide film is formed. The film thickness of the aluminum oxide film forming the insulative barrier film 126 is e.g., 50 nm. The insulative barrier film 126, which is formed on the planarized inter-layer insulation film 68, is flat. The flat insulative barrier film 126 has good coverage and can sufficiently prevent the diffusion of hydrogen and water.

On the insulative barrier film 126, a 100 nm-thickness silicon oxide film 128, for example, is formed. The silicon oxide film 128 is for preventing the insulative barrier film 126 from being etched in patterning for forming the interconnections 88a, the metal layers 88b, 88c.

On the inter-layer insulation film 90 having the surface planarized, the flat insulative barrier film 92 of, e.g., a 20-80 nm-thickness aluminum oxide film is formed. The film thickness of the aluminum oxide film forming the insulative barrier film 92 is, e.g., 50 nm. The insulative barrier film 92, which is formed on the planarized inter-layer insulation film 90, is flat. The flat insulative barrier film 92 has good coverage and can sufficiently prevent the diffusion of hydrogen and water.

On the insulative barrier film 92, a 100 nm-thickness silicon oxide film 94, for example, is formed. As described above, the silicon oxide film 94 is for preventing the insulative barrier film 92 from being etched in patterning for forming the electrode pads 102, etc.

As described above, according to the present modification, the planarized insulative barrier films 122, 126, 92 are suitably formed, whereby the arrival of hydrogen and water at the dielectric film 32 of the capacitors 36 can be more surely prevented.

A Second Embodiment

Figure 21:
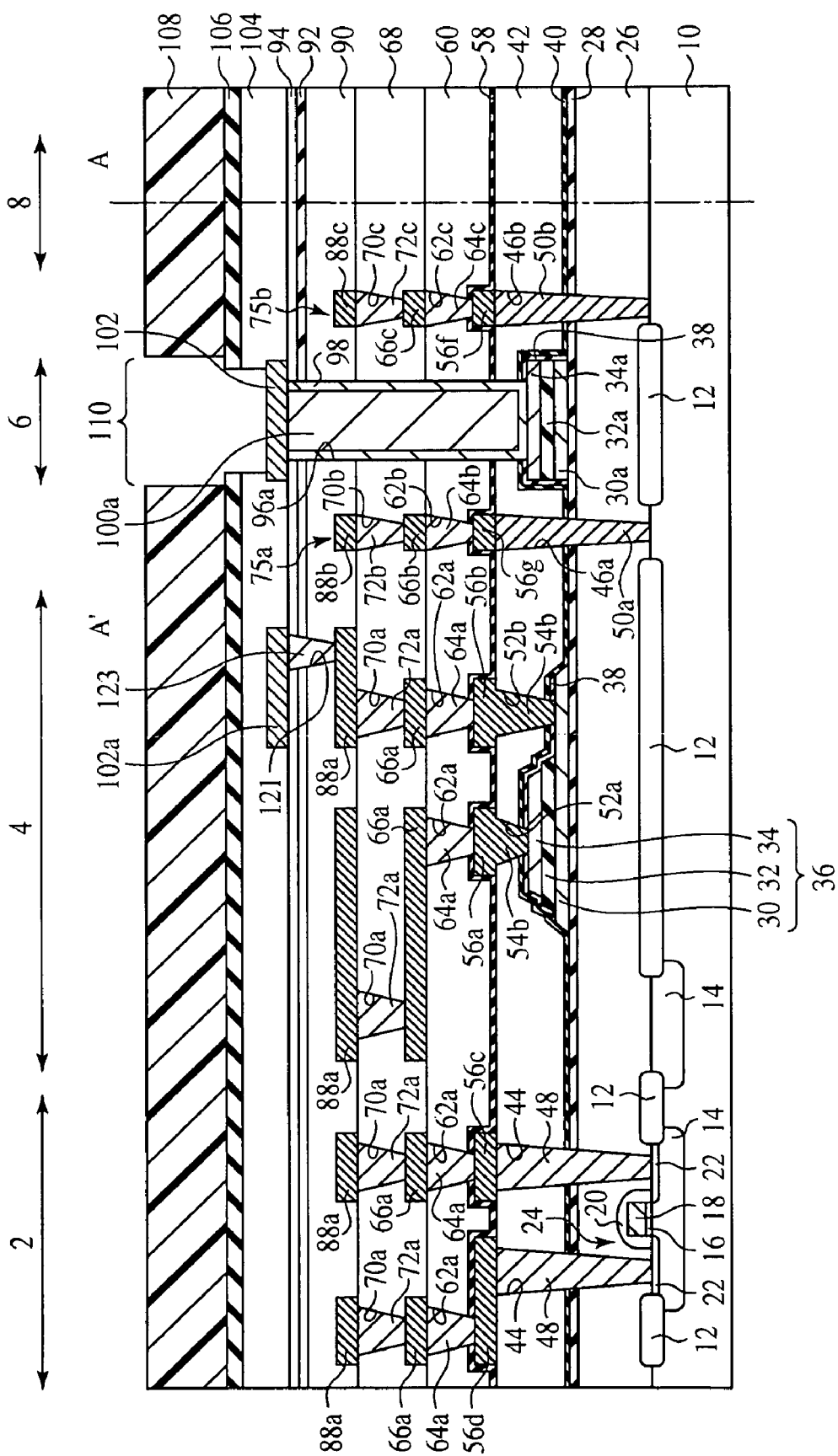
FIG. 21 is a sectional view of the semiconductor device according to a second embodiment.
Figure 22A:
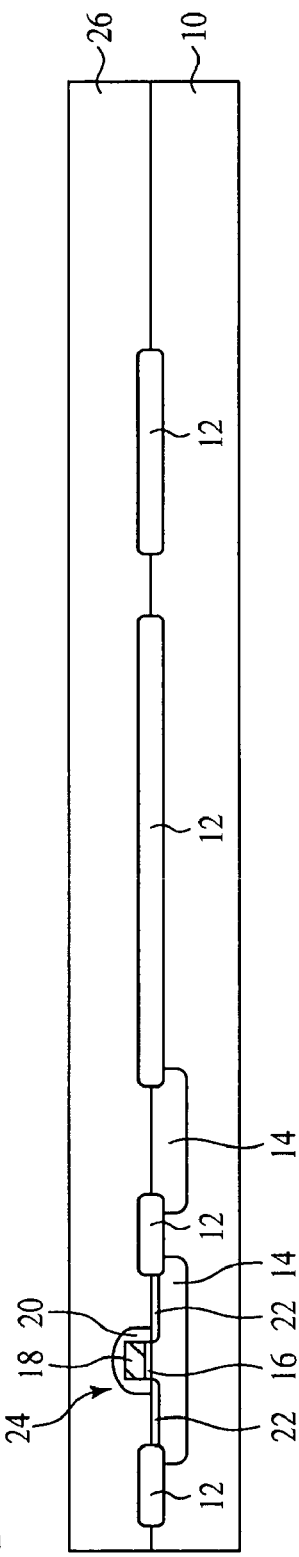
FIGS. 22A and 22B are sectional views of the semiconductor device according to the second embodiment in the steps of the method for manufacturing the semiconductor device, which illustrate the method (Part 1).
Figure 22B:
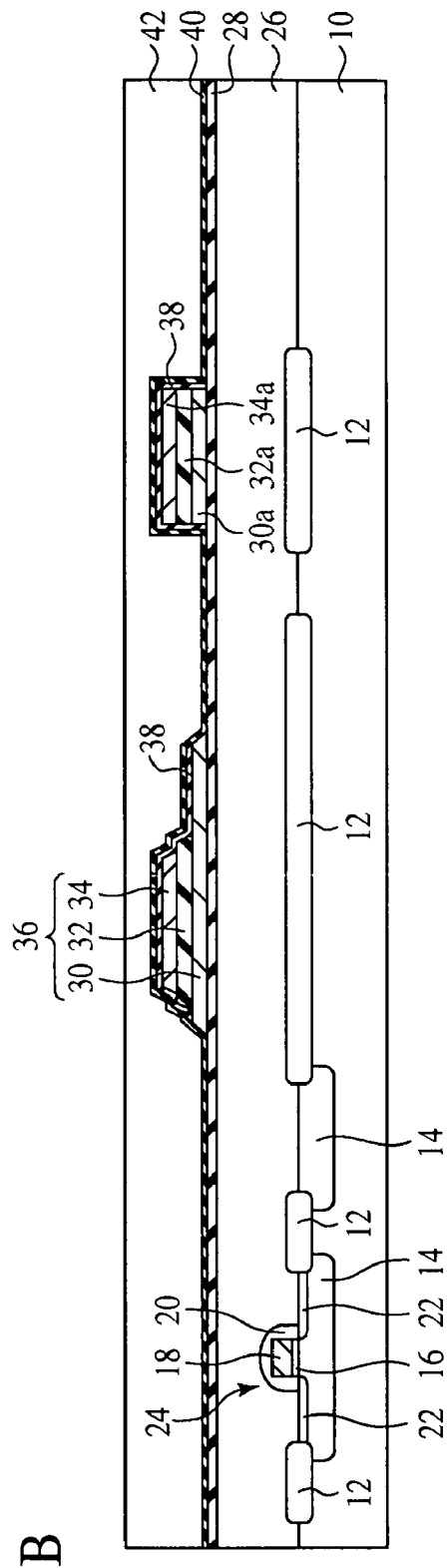
Figure 23A:
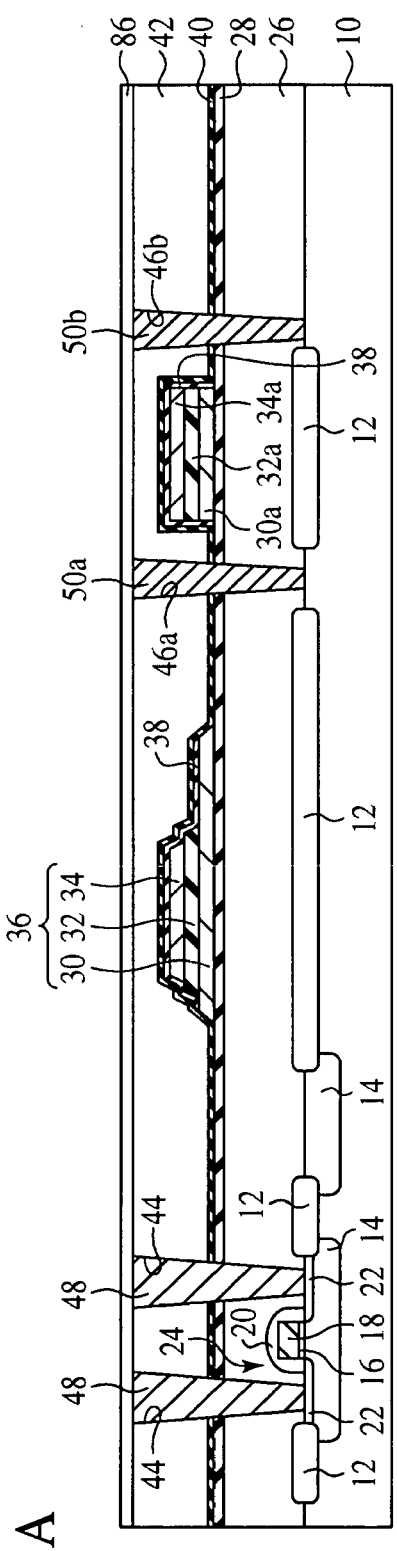
FIGS. 23A and 23B are sectional views of the semiconductor device according to the second embodiment in the steps of the method for manufacturing the semiconductor device, which illustrate the method (Part 2).
Figure 23B:
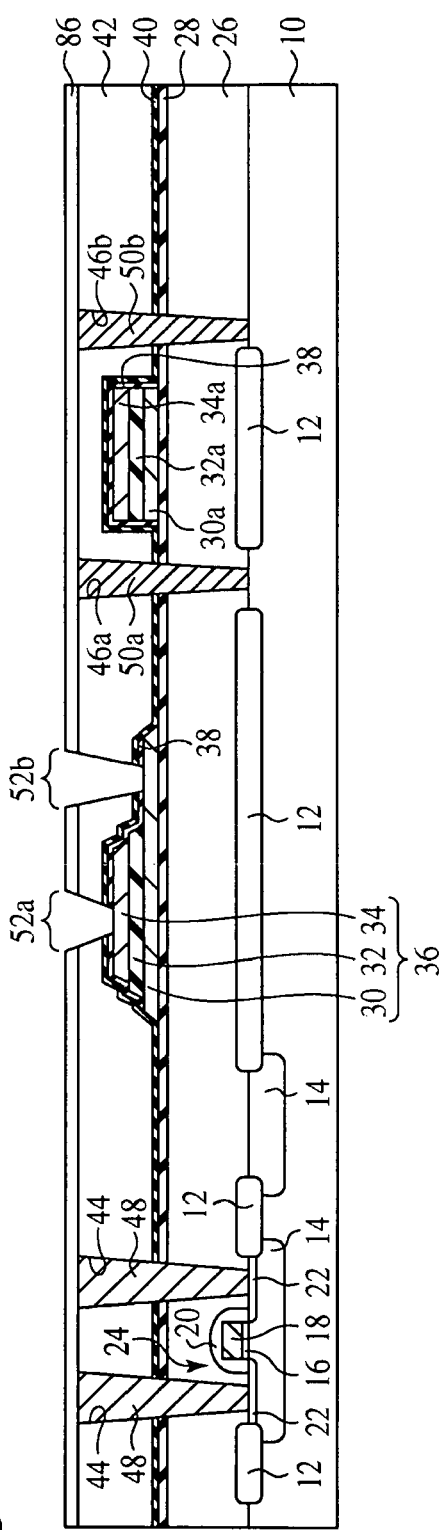
Figure 24A:
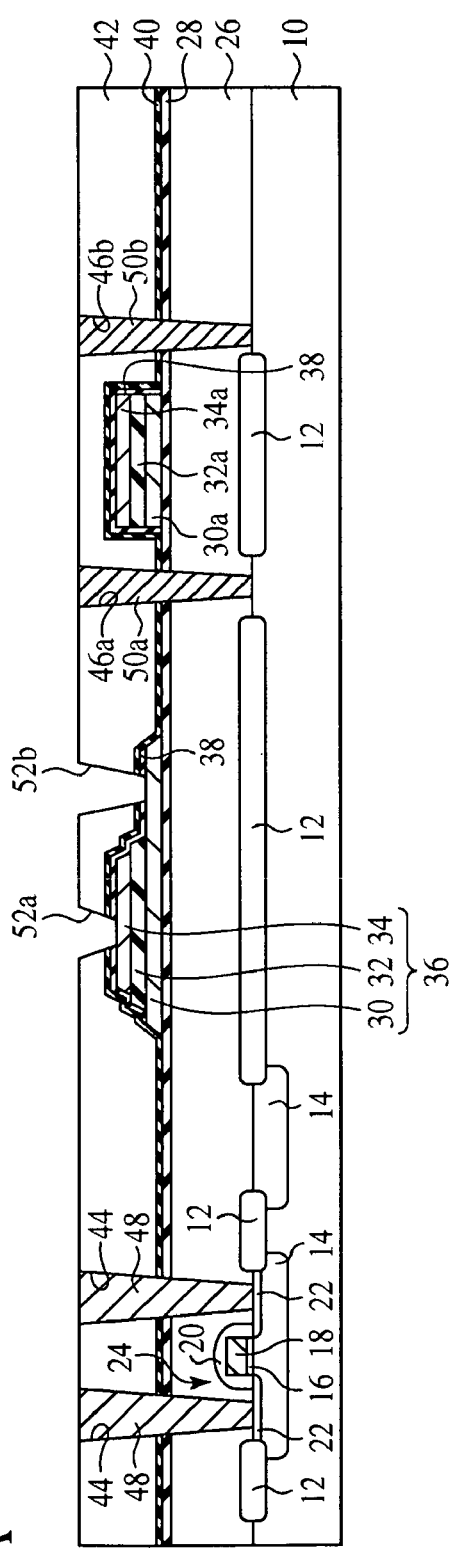
FIGS. 24A and 24B are sectional views of the semiconductor device according to the second embodiment in the steps of the method for manufacturing the semiconductor device, which illustrate the method (Part 3).
Figure 24B:
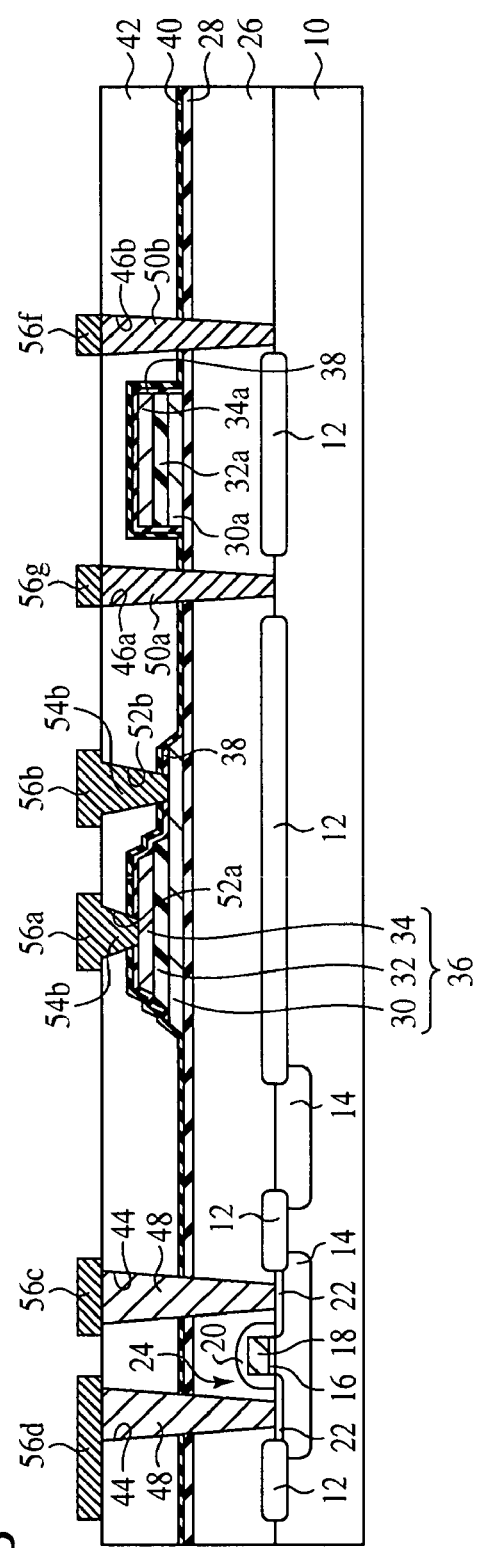

The semiconductor device according to a second embodiment will be explained with reference to FIGS. 21 to 32. FIG. 21 is a sectional view of the semiconductor device according to the present embodiment. The same members of the present embodiment as those of the semiconductor device according to the first embodiment and the method for manufacturing the semiconductor device illustrated in FIGS. 1 to 20 are represented by the same reference numbers not to repeat or to simplify their explanation.

The semiconductor device according to the present embodiment is characterized mainly in that openings 96a are formed down to a conduction film 34a of one and the same conductor film as the upper electrodes 34 of capacitors 36, and conductor 100a are buried in the openings 96.

As illustrated in FIG. 21, below the electrode pads 102, a conduction film 30a of one and the same conductor film as the lower electrodes 30 of the capacitors 36 is formed.

On the conduction film 30a, dielectric film 32a of one and the same dielectric film as the dielectric film 32 of the capacitors 36.

On the dielectric film 32a, the conduction film 34a of one and the same conductor film as the upper electrodes 34 of the capacitors 36.

In a silicon oxide film 94, an insulative barrier film 92, an inter-layer insulative film 90, an inter-layer insulative film 68, an inter-layer insulative film 60, an insulative barrier film 58, an inter-layer insulation film 42, an insulative barrier film 40 and an insulative barrier film 38, openings 96a are formed down to the conduction film 34a.

In the openings 96a, a barrier metal film 98 is formed.

In the openings 96a with the barrier metal film 98 formed in, conductors 100a are buried.

In the silicon oxide film 94, the insulative barrier film 92 and the inter-layer insulation film 90, contact holes 121 are formed down to interconnections 88a.

In the contact holes 121, conductor plugs 123 are buried.

On the silicon oxide film 94, electrode pads 102 connected to the conductors 100a, and interconnections 102a connected to the conductor plugs 123 are formed.

The electrode pads 102 are electrically connected to those of a plurality of the interconnections 102a.

As described above, the semiconductor device according to the present embodiment is characterized mainly in that, as described above, the openings 96a are formed down to the conduction film 34a of one and the same conductor film as the upper electrodes 34 of the capacitors 36, and the conductors 100a are buried in the openings 96. According to the present embodiment, the conductors 100a can be formed stronger. According to the present embodiment, because of such very strong conductors 100a present immediately below the electrode pads 102, even when a probe needle is contact to the electrode pads 102 with some force in tests, etc., the breakage and deformation of the electrode pads 102 can be prevented. Even when the electrode pads 102 should be broken or deformed, because of the conductors 100a present immediately below the electrode pads 102, which are formed very strong, cracks which will arrive at the inter-layer insulation film 42, 60, 68, 90 never take place in the conductors 10a. Thus, according to the present embodiment, the arrival of hydrogen and water at the dielectric film 32 of the capacitors 36 via the inter-layer insulation films 42, 60, 68, 90, etc. can be prevented, and the ferroelectric forming the dielectric film 32 is prevented from being reduced with hydrogen. As described above, according to the present embodiment, the dielectric film 32 of the capacitors 36 can be surely prevented form being deteriorated with hydrogen and water, and the semiconductor device including the capacitors 36 having good electric characteristics and a long life can be provided.

(Method for Manufacturing the Semiconductor Device)

Next, the method for manufacturing the semiconductor device according to the present embodiment will be explained with reference to FIGS. 22A to 32. FIGS. 22A to 32 are sectional views of the semiconductor device according to the embodiment in the steps of the method for manufacturing the semiconductor device, which illustrate the method.

First, the steps of forming device isolation regions 12 for defining device regions on a semiconductor substrate 10 of, e.g., silicon to the step of forming the insulative barrier film 28 on the inter-layer insulation film 26 are the same as those of the method for manufacturing the semiconductor device according to the first embodiment described above with reference to FIGS. 3A to 3B, and they are not explained here.

Next, in the same way as in the method for manufacturing the semiconductor device according to the first embodiment, the conduction film 30 of a 155 nm-thickness Pt film is formed on the entire surface by, e.g., PVD. The conduction film 30 is to be the lower electrodes of the capacitors 36 and the conduction film 36a of the electrode pad part 6.

Next, in the same way as in the method for manufacturing the semiconductor device according to the first embodiment, the dielectric film 32 is formed on the entire surface by, e.g., PVD. The dielectric film 32 is to be the dielectric film of the capacitors and the dielectric film 32a of the electrode pad part 6. As the dielectric film 32, a ferroelectric film, for example, is formed. More specifically, as the dielectric film 32, a PZT film of, e.g., an about 150-200 nm-thickness is formed.

Next, in the same way as in the method for manufacturing the semiconductor device according to the first embodiment, thermal processing of, e.g., 585° C. and 90 seconds is made in an oxygen atmosphere by, e.g., RTA.

Then, in the same way as in the method for manufacturing the semiconductor device according to the first embodiment, a 50 mm-thickness $IrO_2$ film (not illustrated), for example, is formed by, e.g., PVD.

Next, in the same way as in the method for manufacturing the semiconductor device according to the first embodiment, thermal processing of, e.g., 725° C. and 20 seconds is made in an oxygen atmosphere by, e.g., RTA.

Next, in the same way as in the method for manufacturing the semiconductor device according to the first embodiment, a 200 nm-thickness $IrO_2$ film (not illustrated) is formed by, e.g., PVD. Thus, a layer film 34 of the two laid $IrO_2$ films is formed. The layer film 34 is to be the upper electrodes of the capacitors 36 and the conduction film 34a of the electrode pad part 6.

Next, in the same way as in the method for manufacturing the semiconductor device according to the first embodiment, a photoresist film (not illustrated) is formed on the entire surface by spin coating.

Then, in the same way as in the method for manufacturing the semiconductor device according to the present embodiment, by photolithography, the photoresist film is patterned into the plane shape of the upper electrodes 34 of the capacitors 36 and the plane shape of the conduction film 34a.

Next, in the same way as in the method for manufacturing the semiconductor device according to the first embodiment, with the photoresist film as the mask the layer film 34 is etched. Thus, the upper electrodes 34 of the layer film are formed. In the electrode pad part 6 as well, the conduction film 34a of one and the same conductor film as the upper electrodes 34 is formed. Then, the photoresist film is released.

Next, in the same way as in the method for manufacturing the semiconductor device according to the first embodiment, thermal processing of, e.g., 650° C. and 60 minutes is made in an oxygen atmosphere.

Next, in the same way as the method for manufacturing the semiconductor device according to the first embodiment, a photoresist film is formed on the entire surface by spin coating.

Next, in the same way as in the method for manufacturing the semiconductor device according to the first embodiment, by photolithography, the photoresist film is patterned into the plane shape of the dielectric film 32 of the capacitors.

Next, in the same way as in the method for manufacturing the semiconductor device according to the first embodiment, with the photoresist film as the mask, the dielectric film 32 is etched. At this time, the dielectric film 32a of one and the same dielectric film 32 is formed. Then, the photoresist film is released.

Next, in the same way as in the method for manufacturing the semiconductor device according to the first embodiment, thermal processing of, e.g., 350° C. and 60 minutes is made in an oxygen atmosphere.

Next, in the same way as in the method for manufacturing the semiconductor device according to the first embodiment, on the entire surface, the insulative barrier film (not illustrated) of a 50 nm-thickness aluminum oxide film is formed by, e.g., PVD.

Next, in the same way as in the method for manufacturing the semiconductor device according to the first embodiment, thermal processing of, e.g., 550° C. and 60 minutes is made in an oxygen atmosphere.

Next, in the same way as in the method for manufacturing the semiconductor device according to the first embodiment, a photoresist film is formed on the entire surface by spin coating.

Next, in the same way as in the method for manufacturing the semiconductor device according to the first embodiment, by photolithography, the photoresist film is patterned into the plane shape of the lower electrodes 30 of the capacitors and the plane shape of the conduction film 30a.

Next, in the same way as in the method for manufacturing the semiconductor device according to the first embodiment, with the photoresist film as the mask, the insulative barrier film 38 and the conduction film 30 are etched. Thus, the lower electrodes 30 of the conduction film are formed, and the conduction film 30a of one and the same conduction film as the lower electrodes 30 is formed in the electrode pad part 6. The insulative barrier film 38 is left, covering the upper electrodes 34 and the dielectric film 32. Then, the photoresist film is released.

Next, in the same way as in the method for manufacturing the semiconductor device according to the first embodiment, thermal processing of, e.g., 650° C. and 60 minutes is made in an oxygen atmosphere.

Then, in the same way as in the method for manufacturing the semiconductor device according to the first embodiment, the insulative barrier film 40 of a 20 nm-thickness aluminum oxide film is formed on the entire surface by, e.g., PVD.

Next, in the same way as in the method for manufacturing the semiconductor device according to the first embodiment, thermal processing of, e.g., 550° C. and 60 minutes is made in a oxygen atmosphere.

Hereafter, the step of forming the inter-layer insulation film 42 on the entire surface to the step of removing the silicon nitride oxide film 86 present on the inter-layer insulation film 42 are the same as those of the method for manufacturing the semiconductor device according to the first embodiment described above with reference to FIGS. 3B to 5A, and they are not explained here (see FIGS. 22B to 24A).

Then, in the same way as in the method for manufacturing the semiconductor device according to the first embodiment, a 150 nm-thickness TiN film, a 550 nm-thickness Al—Cu alloy film, a 5 nm-thickness Ti film and a 150 nm-thickness TiN film are sequentially formed on the entire surface by, e.g., PVD. Thus, the layer film of the TiN film, the Al—Cu alloy film, the Ti film and the TiN film is formed.

Next, the layer film is patterned by photolithography. Thus, in the contact holes 52a and on the inter-layer insulation film 42, the conductor plugs 54a and the interconnection 56a of the layer film are formed integral. In the contact holes 52b and on the inter-layer insulation film 42, the conductor plugs 54b and the interconnection 56b of the layer film are formed integral. On the inter-layer insulation film 42, the interconnections 56c-56d of the layer film are formed. On the metal layer 50b as well, the metal layer 56f of the layer film is formed. On the metal layer 50a as well, the metal layer 56g of the layer film is formed. The metal layer 56g is to be parts of the inner seal rings 75a. The metal layer 56f is to be parts of the outer seal rings 75b (see FIG. 24B).

Next, in the same way as in the method for manufacturing the semiconductor device according to the first embodiment, thermal processing of, e.g., 350° C. and 30 minutes is made in a nitrogen atmosphere.

Figure 25:
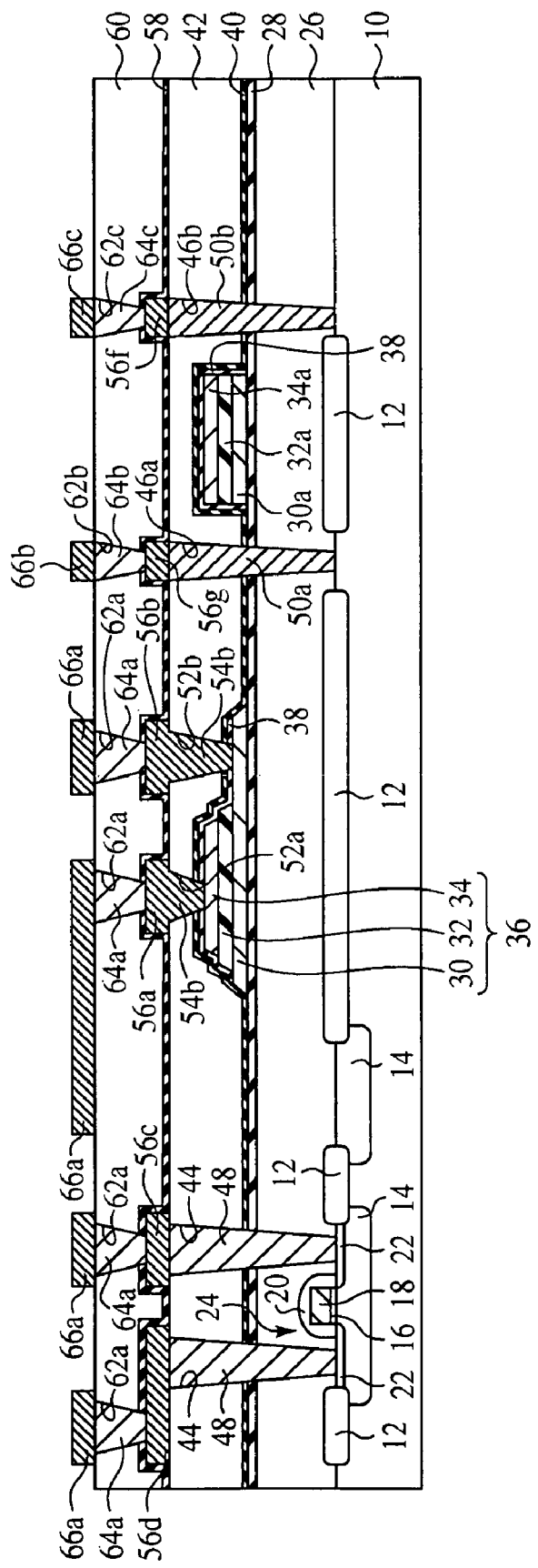
FIG. 25 is a sectional view of the semiconductor device according to the second embodiment in the step of the method for manufacturing the semiconductor device, which illustrates the method (Part 4).
Figure 26:
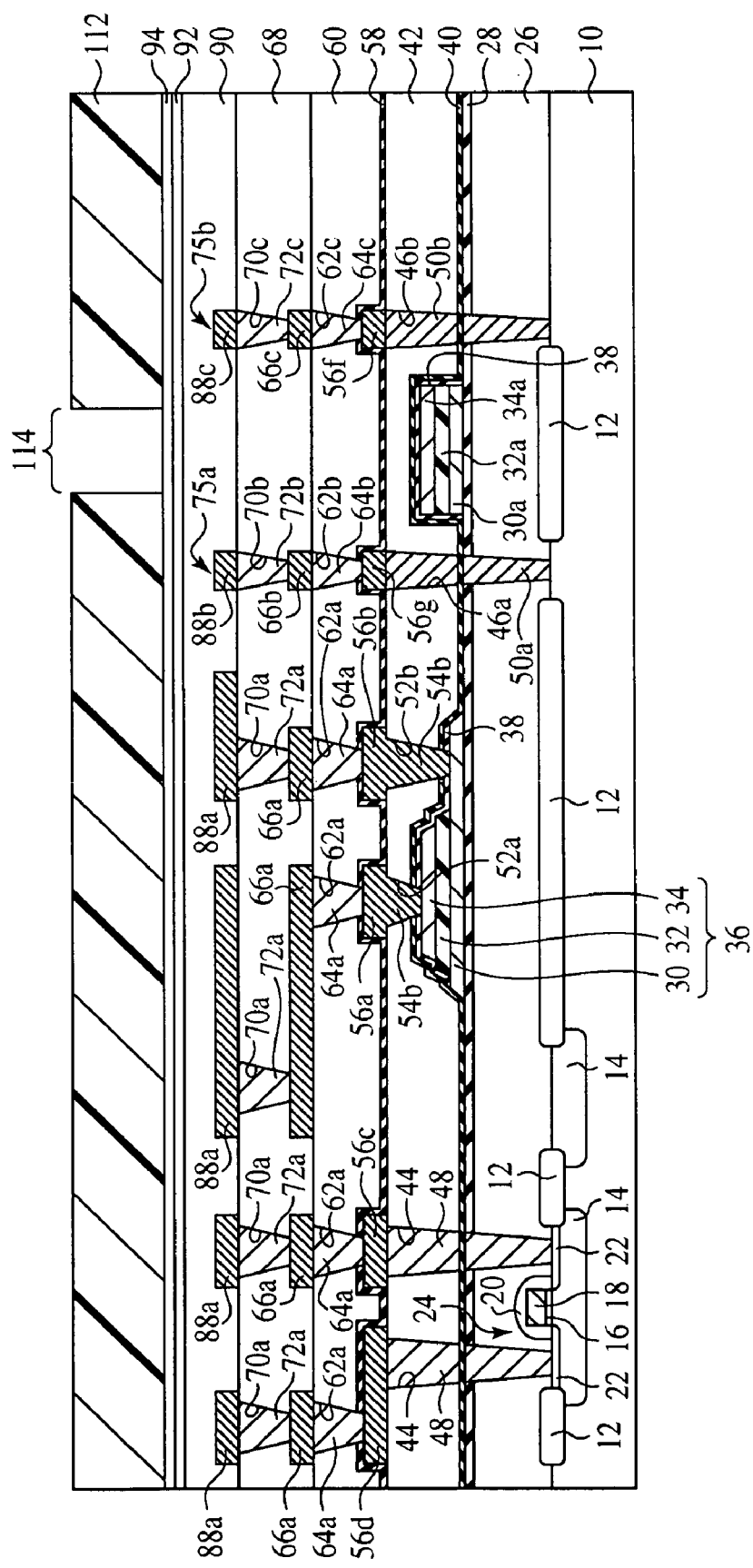
FIG. 26 is a sectional view of the semiconductor device according to the second embodiment in the step of the method for manufacturing the semiconductor device, which illustrates the method (Part 5).
Figure 27:
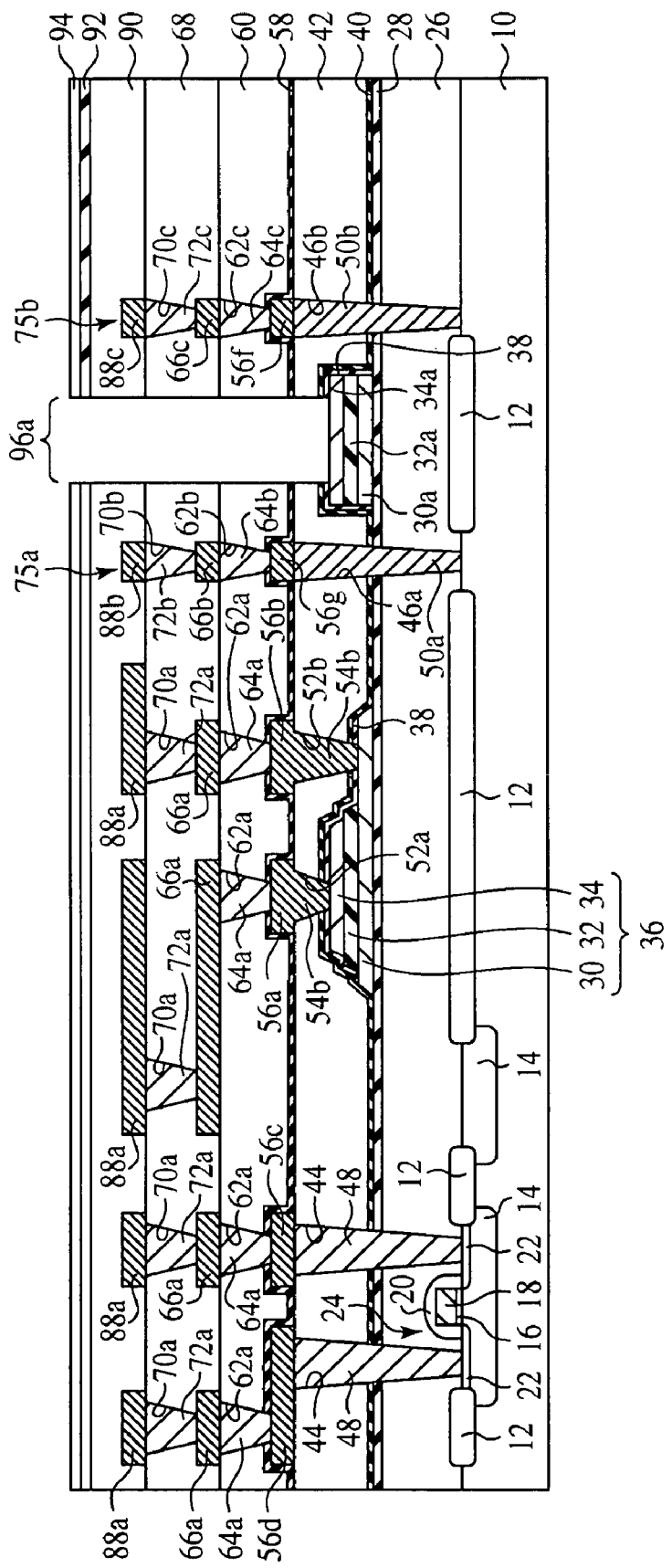
FIG. 27 is a sectional view of the semiconductor device according to the second embodiment in the step of the method for manufacturing the semiconductor device, which illustrates the method (Part 6).
Figure 28:
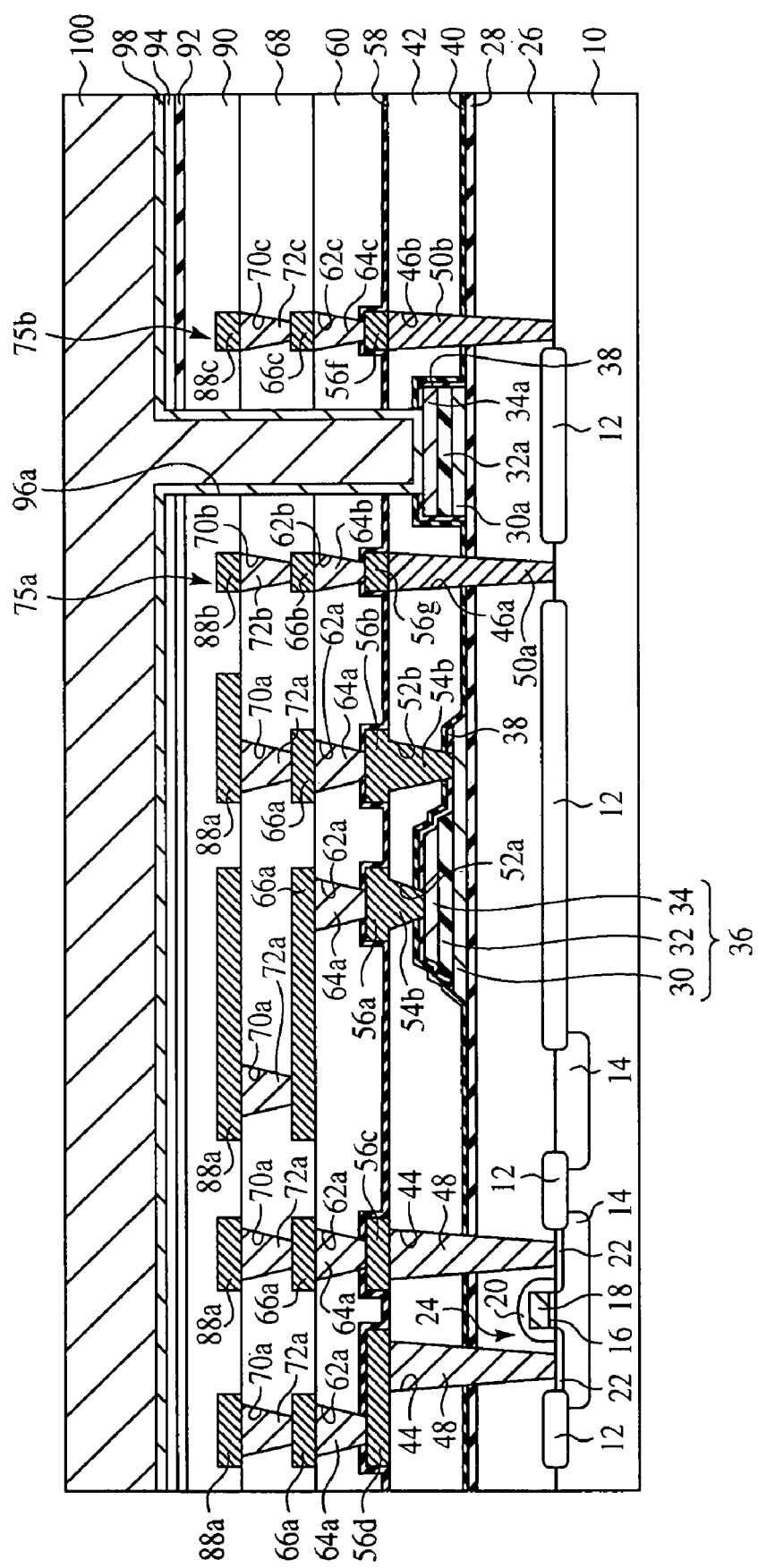
FIG. 28 is a sectional view of the semiconductor device according to the second embodiment in the step of the method for manufacturing the semiconductor device, which illustrates the method (Part 7).
Figure 29:
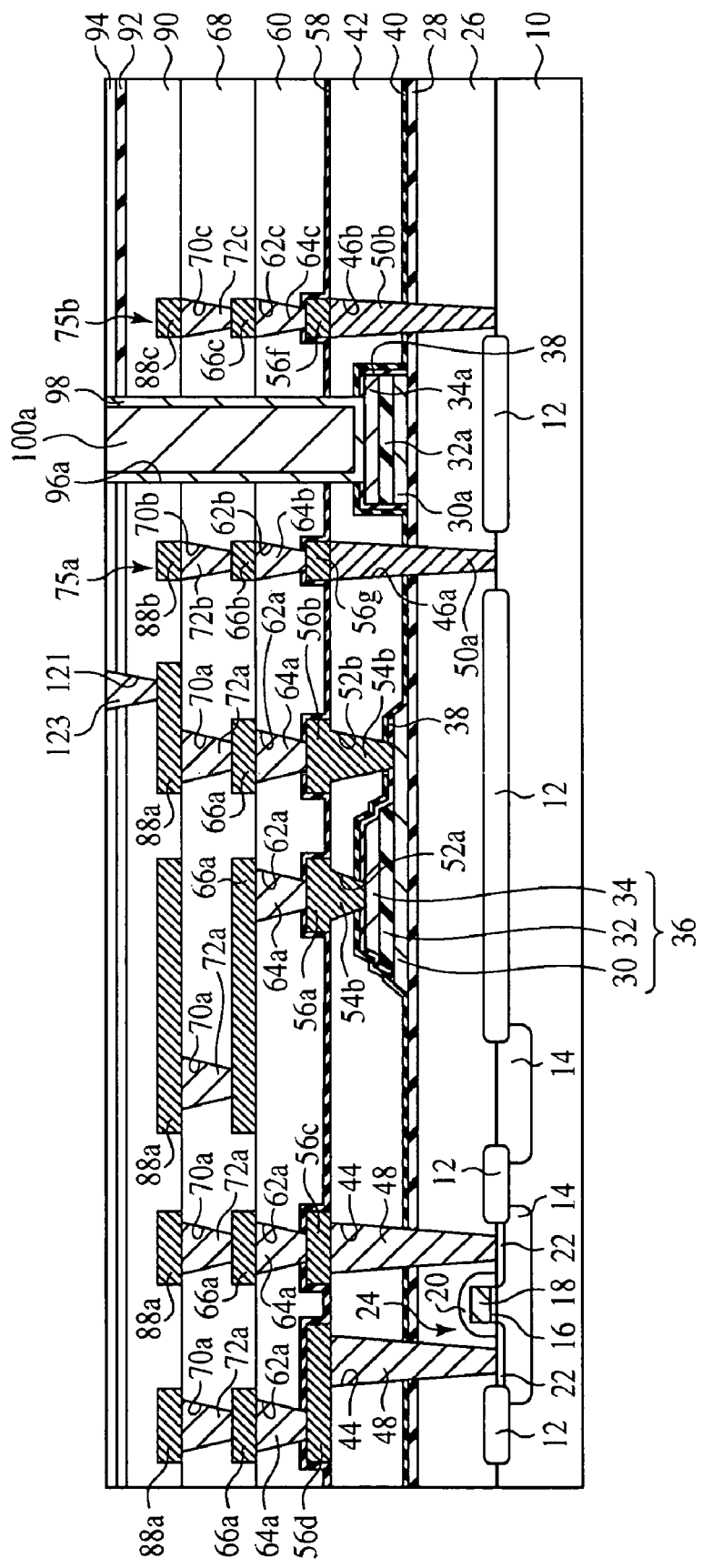
FIG. 29 is a sectional view of the semiconductor device according to the second embodiment in the step of the method for manufacturing the semiconductor device, which illustrates the method (Part 8).
Figure 30:
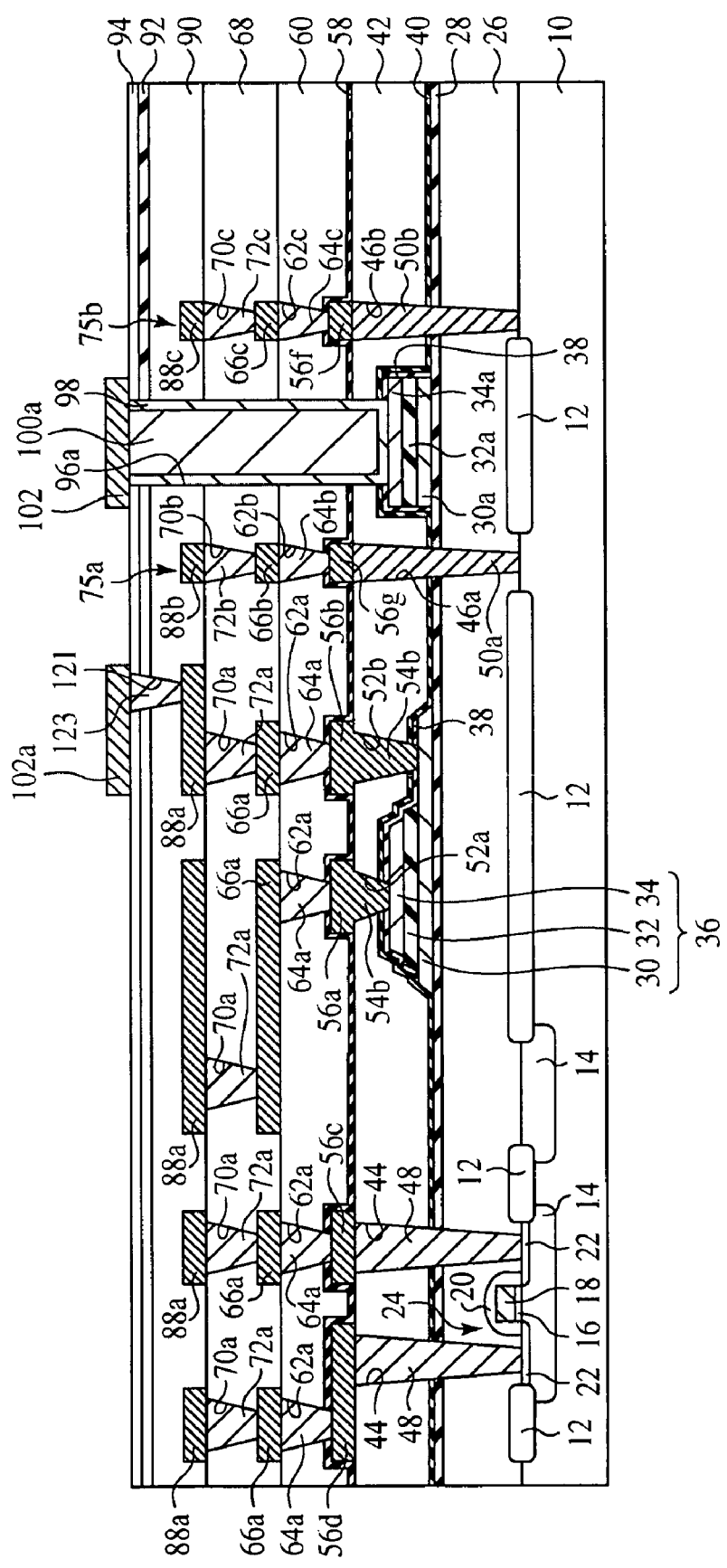
FIG. 30 is a sectional view of the semiconductor device according to the second embodiment in the step of the method for manufacturing the semiconductor device, which illustrates the method (Part 9).

Next, the step of forming the insulative barrier film 58 on the entire surface to the step of forming the openings 114 in the photoresist film 112 are the same as those of the method for manufacturing the semiconductor device according to the first embodiment described above with reference to FIGS. 6 to 10, and they are not explained here (see FIGS. 25 and 26).

Next, with the photoresist film 112 (see FIG. 26) as the mask and with the conduction film 34 as the etching stopper, in the silicon oxide film 94, the insulative barrier film 92, the inter-layer insulation film 90, the inter-layer insulation film 68, the inter-layer insulation film 60 and the insulative barrier film 58, the inter-layer insulation film 42, and the insulative barrier film 40 and the insulative barrier film 38, the openings 96a are formed down to the conduction film 34.

Then, in the same way as in the method for manufacturing the semiconductor device according to the first embodiment, in the openings 96a and on the silicon oxide film 94, the barrier metal film 98 of, e.g., a 150 nm-thickness Ti—Al—N alloy is formed.

Then, in the same way as in the method for manufacturing the semiconductor device according to the first embodiment, the conduction layer 100 of, e.g., a 3 µm-thickness Cu film is formed by electroplating (see FIG. 12). The parts of the conductor layer 100 buried in the openings 96 are to be the conductors 100a (see FIG. 29).

Next, in the same way as in the method for manufacturing the semiconductor device according to the first embodiment, the barrier metal film 98 and the conduction layer 100 are polished by CMP until the surface of the silicon oxide film 94 is exposed. Thus, the conductors 100a of the conduction layer are buried in the openings 96a (see FIG. 29).

Next, in the silicon oxide film 92, the insulative barrier film 94 and the inter-layer insulation film 90, the contact holes 121 are formed down to the interconnections 88a.

Next, on the entire surface, the barrier metal film (not illustrated) of a 50 nm-thickness TiN film is formed by, e.g., PVD.

Next, on the entire surface, a 650 nm-thickness tungsten film is formed by, e.g., CVD.

Then, the tungsten film and the barrier metal film are etch-backed until the surface of the inter-layer insulation film is exposed. Thus, in the contact holes 121, the conductor plugs 123 of the tungsten are buried.

Next, in the same way as in the method for manufacturing the semiconductor device according to the first embodiment, a 1 µm-thickness conductor film is formed on the entire surface by, e.g., PVD. The conductor film is to be the electrode pads 102. The conductor film is to be the interconnections 102a. As the material of the conductor film, Al (aluminum), Al—Cu alloy (aluminum-copper) alloy or others.

Next, by photolithography, the conductor film is patterned. Thus, the electrode pads 102 and the interconnections 102a of the conductor film are formed. Those of a plurality of the interconnections 102a are connected to the electrode pads 102 (see FIG. 30).

Figure 31:
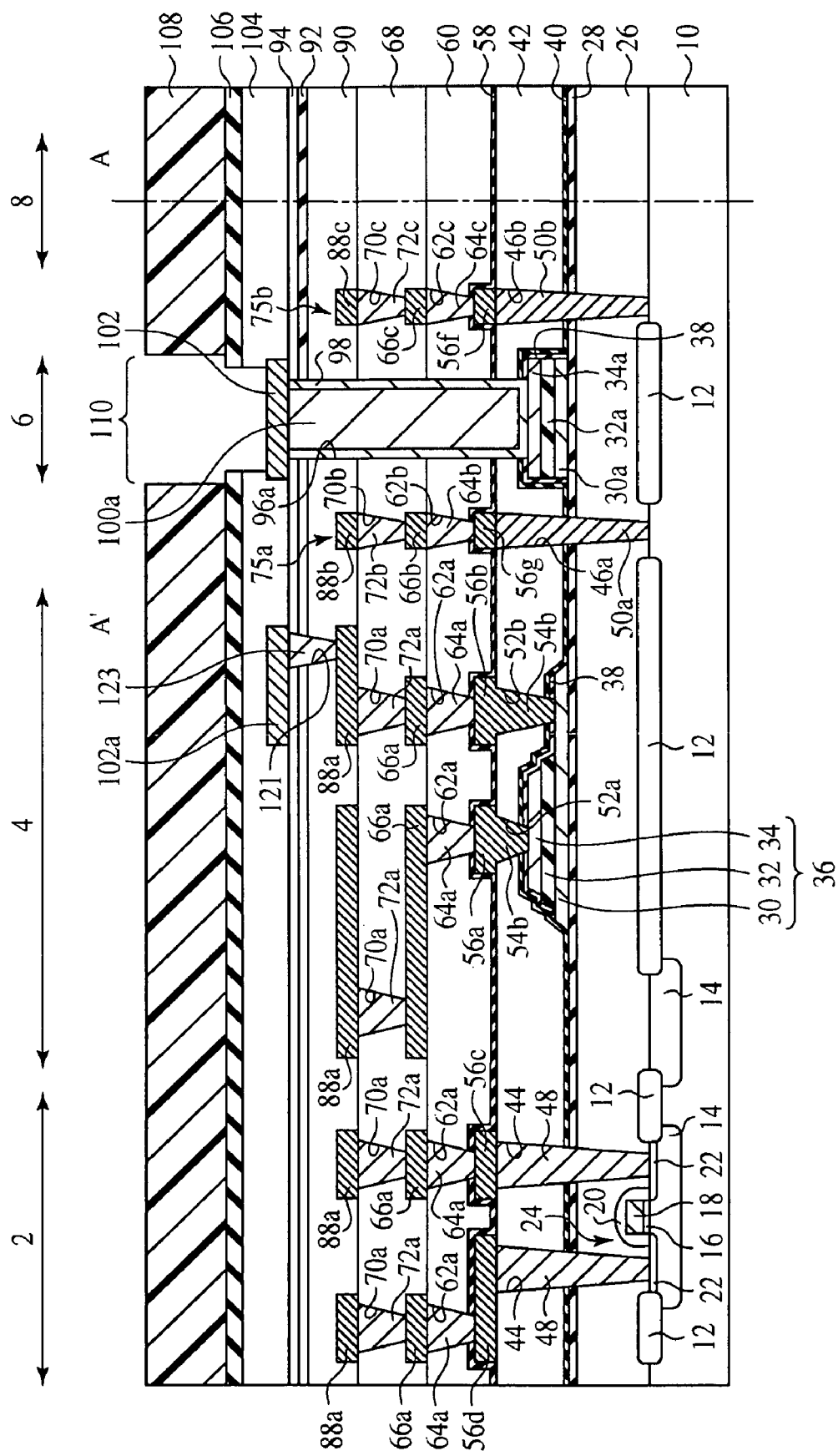
FIG. 31 is a sectional view of the semiconductor device according to the second embodiment in the step of the method for manufacturing the semiconductor device, which illustrates the method (Part 10).
Figure 32:
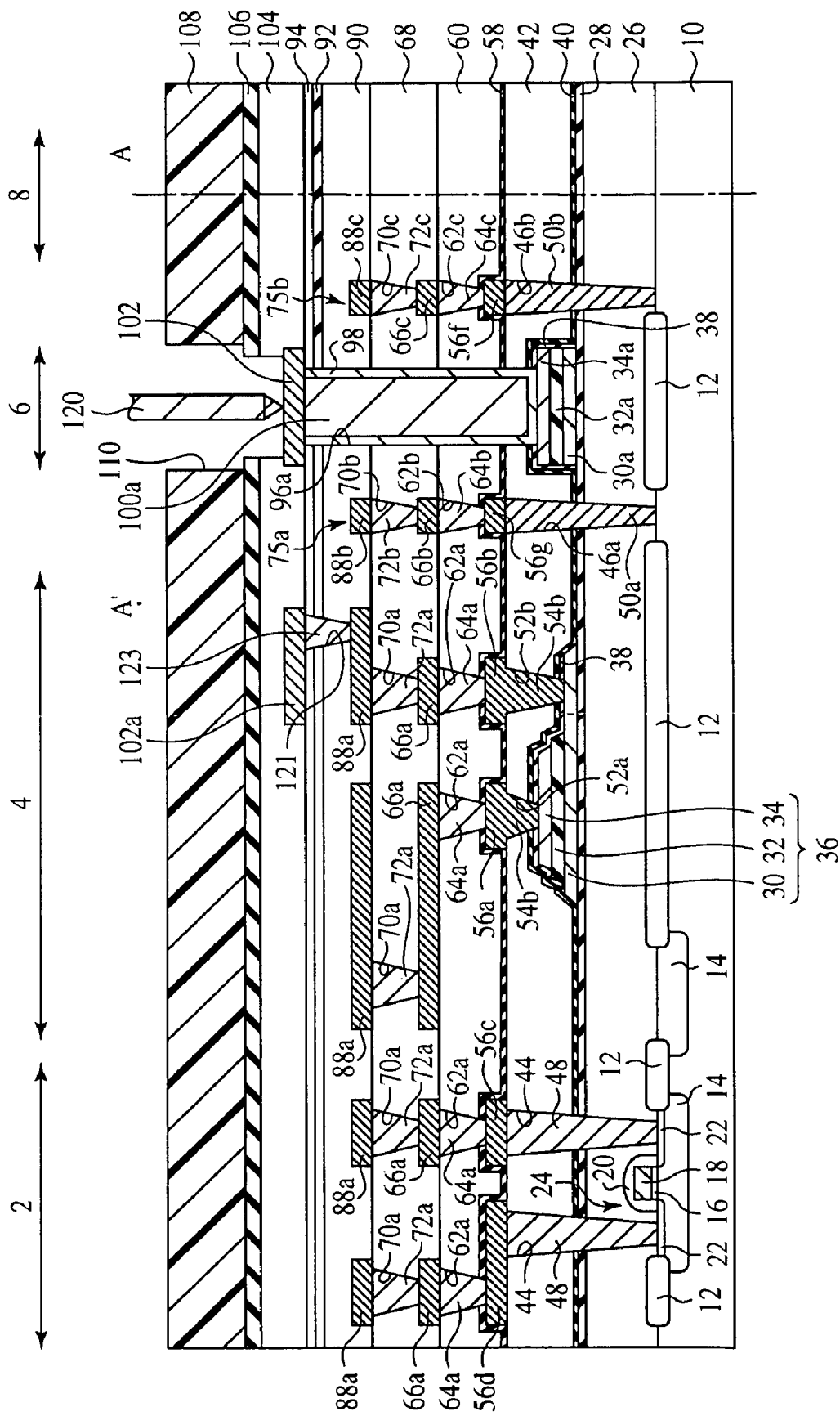
FIG. 32 is a sectional view of the semiconductor device according to the second embodiment in the step of the method for manufacturing the semiconductor device, which illustrates the method (Part 11).

The following steps of the method for manufacturing the semiconductor device are the same as those of the method for manufacturing the semiconductor device according to the first embodiment described above with reference to FIGS. 16 to 19, and they are not explained (see FIGS. 31 and 32).

Thus, the semiconductor device according to the present embodiment is manufactured.

As described above, according to the present embodiment, the conductors 10a are buried very deep immediately below the electrode pads 102, which makes it possible to form the conductors 100a very strong. According to the present embodiment, because of such strong conductors 100a formed immediately below the electrode pads 102, even when a probe needle is contacted to the electrode pads 102 with some force in tests, etc., the electrode pads 102 are prevented from being broken or deformed. Even if the electrode pads 102 should be broken or deformed, because of the conductors 100a immediately below the electrode pads 102, which are formed very strong, no cracks which arrive at the inter-layer insulation films 42, 60, 68, 90 never take place in the conductor 100a. Thus, according to the present embodiment, hydrogen and water are prevented from arriving at the dielectric film 32 of the capacitors 36 via the inter-layer insulation films 42, 60, 68, 90, etc., and the ferroelectric forming the dielectric film 32 is prevented from being reduced with hydrogen.

(Modifications)

Figure 33:
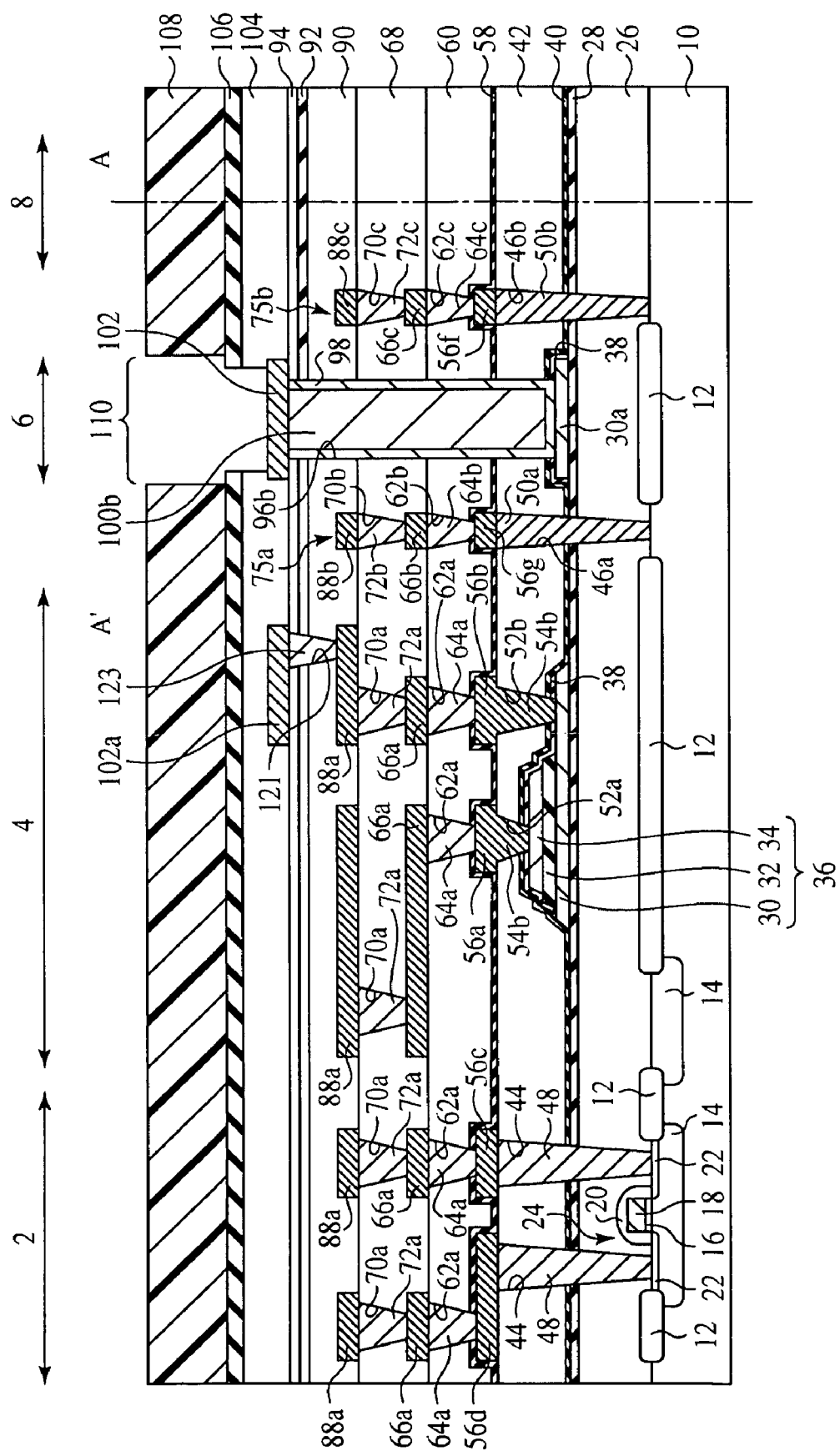
FIG. 33 is a sectional view of the semiconductor device according to a modification of the second embodiment.

Next, a modification of the semiconductor device according to the present embodiment will be explained with reference to FIG. 33. FIG. 33 is a sectional view of the semiconductor device according to the present modification.

The semiconductor device according to the present modification is characterized mainly in that the openings 96b are formed down to conduction film 30a of one and the same conductor film as the lower electrodes 30 of the capacitors 36, and the conductors 100b are buried in the openings 96b.

As illustrated in FIG. 33, the openings 96b are formed down to the conduction film 30a in the silicon oxide film 94, the insulative barrier film 92, the inter-layer insulation film 90, the inter-layer insulation film 68, the inter-layer insulation film 60, the insulative barrier film 58, the inter-layer insulation film 42, the insulative barrier film 40 and the insulative barrier film 38.

In the openings 96a, the barrier metal film 98 is formed.

In the openings 96b with the barrier metal film 98 formed in, the conductors 100b are buried.

In the silicon oxide film 94, the insulative barrier film 92 and the inter-layer insulative film 90, the contact holes 121 are formed down to the interconnections 88a.

The conductor plugs 123 are buried in the contact holes 121.

On the silicon oxide film 94, the electrode pads 102 connected to the conductors 100a and the interconnections 102a connected to the conductor plugs 123 are formed.

The electrode pads 102 are electrically connected to those of a plurality of the interconnections 102a.

As described above, the semiconductor device according to the present modification is characterized mainly in that, as described above, the openings 96b are formed down to the conduction film 30a of one and the same conductor film as the lower electrodes 30 of the capacitors 36, and the conductors 100b are buried in the openings 96b. Accordingly, in the semiconductor device according to the present modification as well as the semiconductor device according to the second embodiment, the conductors 100b can be formed strong. According to the present modification, because of such very strong conductors 100b present immediately below the electrode pads 102, even when a probe needle is contacted to the electrode pads 102 with some force in tests, etc., the electrode pads 102 are prevented from being deformed or deformed. Even when the electrode pads 102 should be broken or deformed, because of the very strong conductors 100b present immediately below the electrode pads 102, no cracks which arrive at the inter-layer insulation films 42, 60, 68, 90 never take place in the conductor 100b. In the present modification, hydrogen and water can be prevented from arriving at the dielectric film 32 of the capacitors 36 via the inter-layer insulation films 42, 60, 68, 90, etc., and the ferroelectric forming the dielectric film 32 can be prevented from being reduced with hydrogen.

A Third Embodiment

Figure 34:
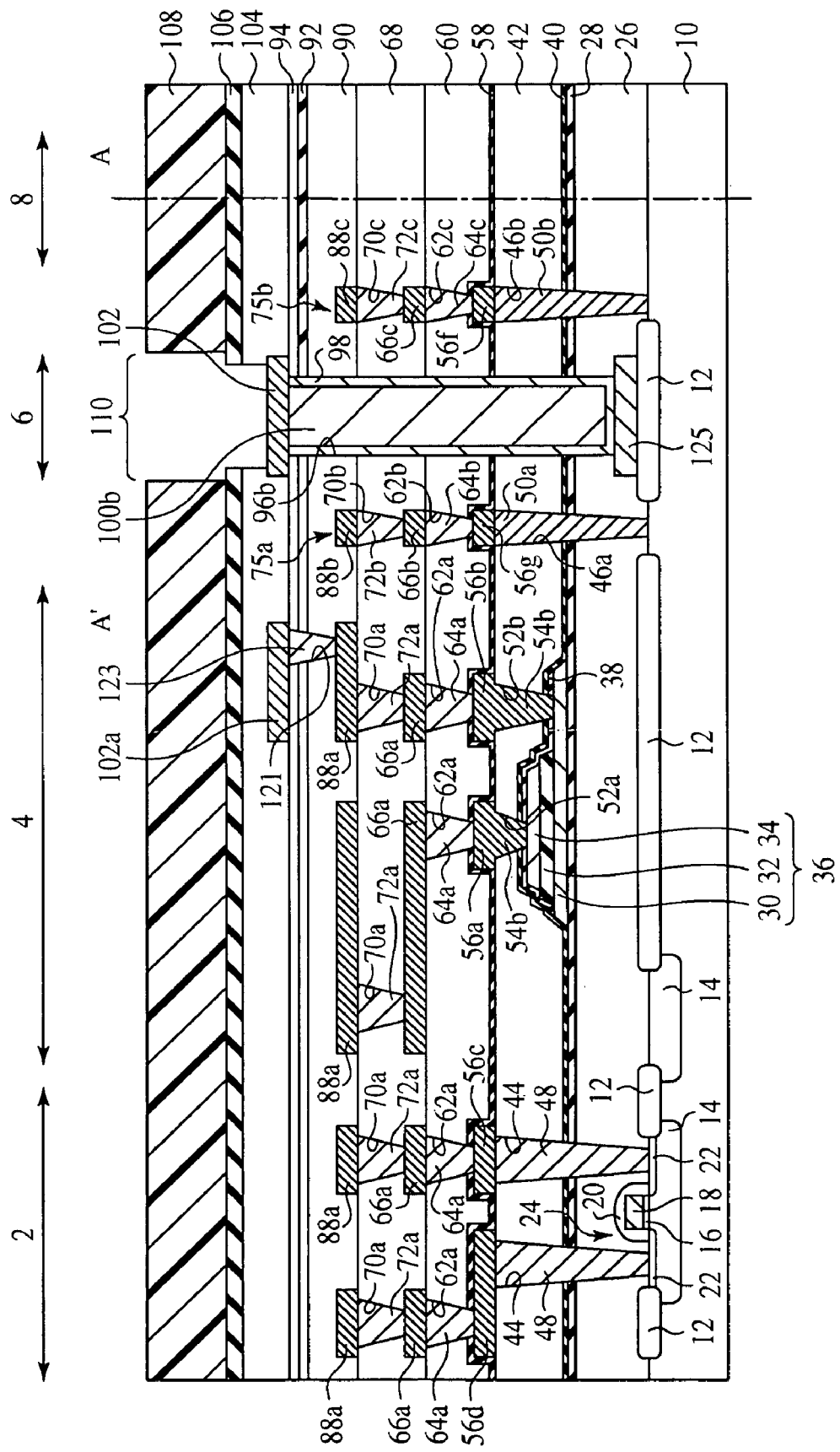
FIG. 34 is a sectional view of the semiconductor device according to a third embodiment.
Figure 35A:
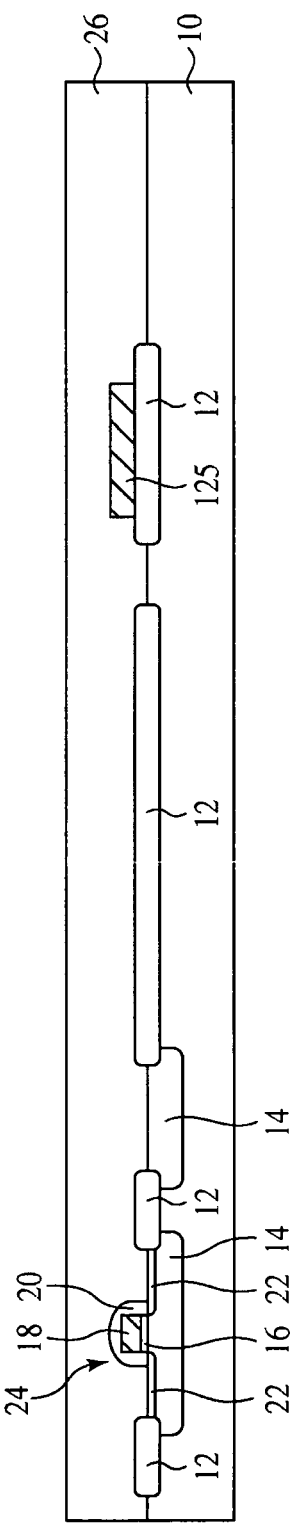
FIGS. 35A and 35B are sectional views of the semiconductor device according to the third embodiment in the steps of the method for manufacturing the semiconductor device, which illustrate the method (Part 1).
Figure 35B:
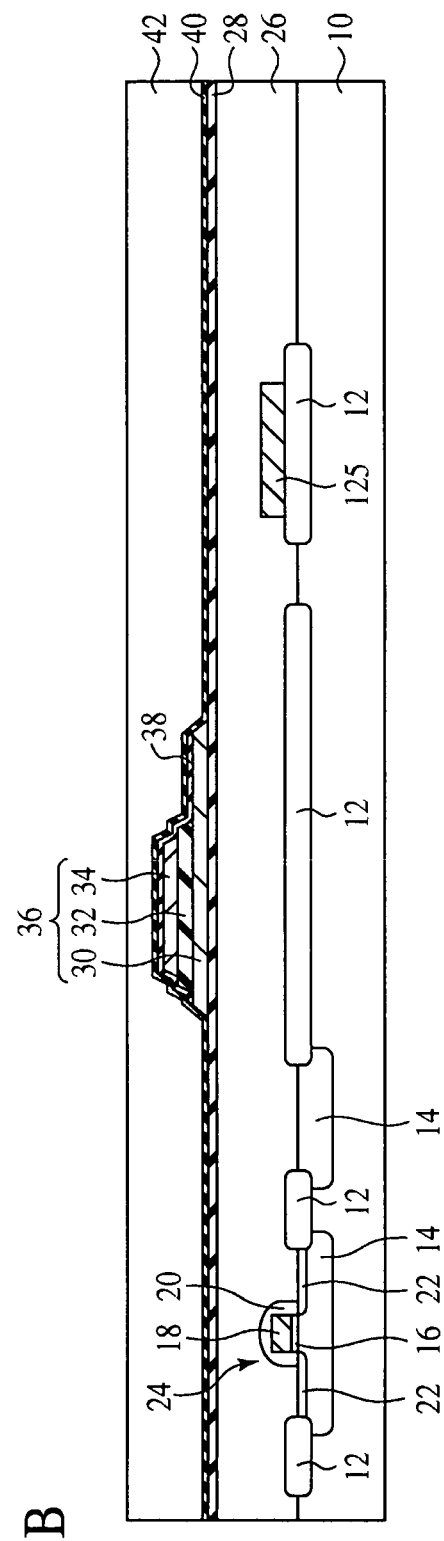
Figure 36A:
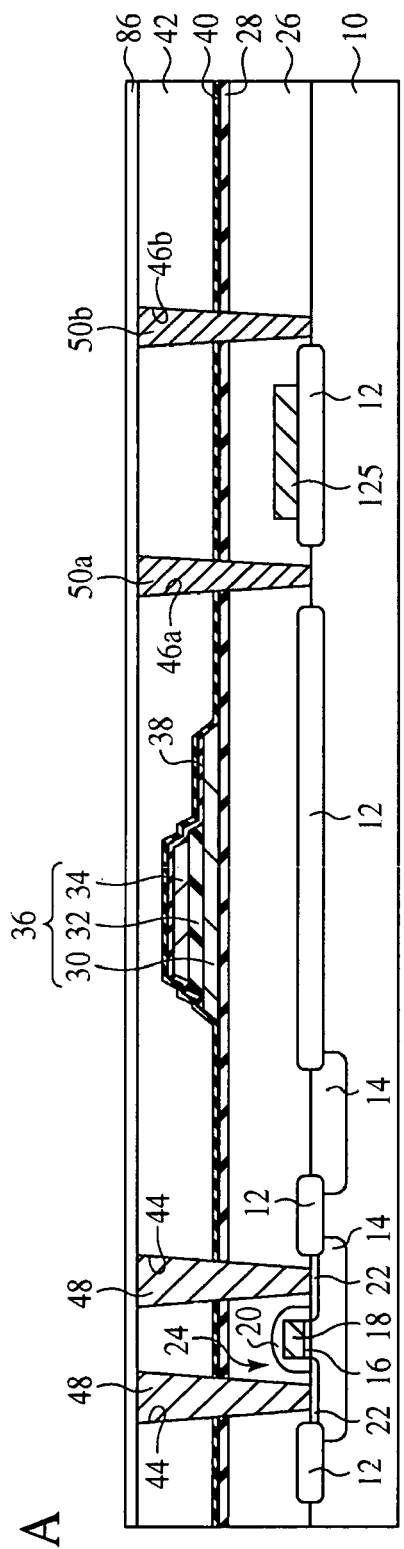
FIGS. 36A and 36B are sectional views of the semiconductor device according to the third embodiment in the steps of the method for manufacturing the semiconductor device, which illustrate the method (Part 2).
Figure 36B:
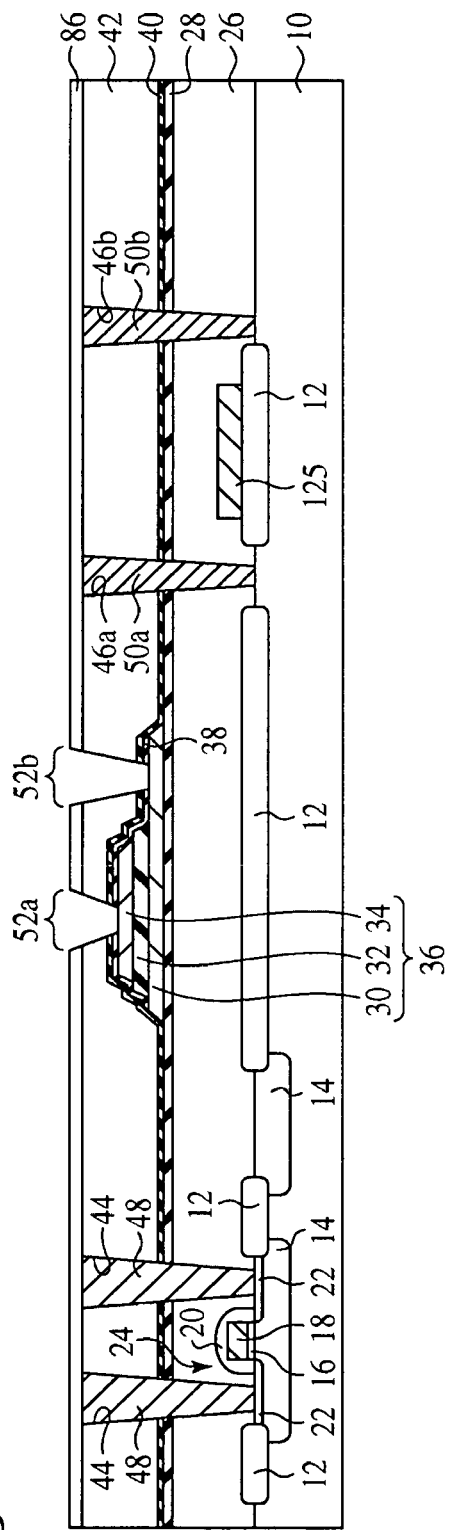
Figure 37A:
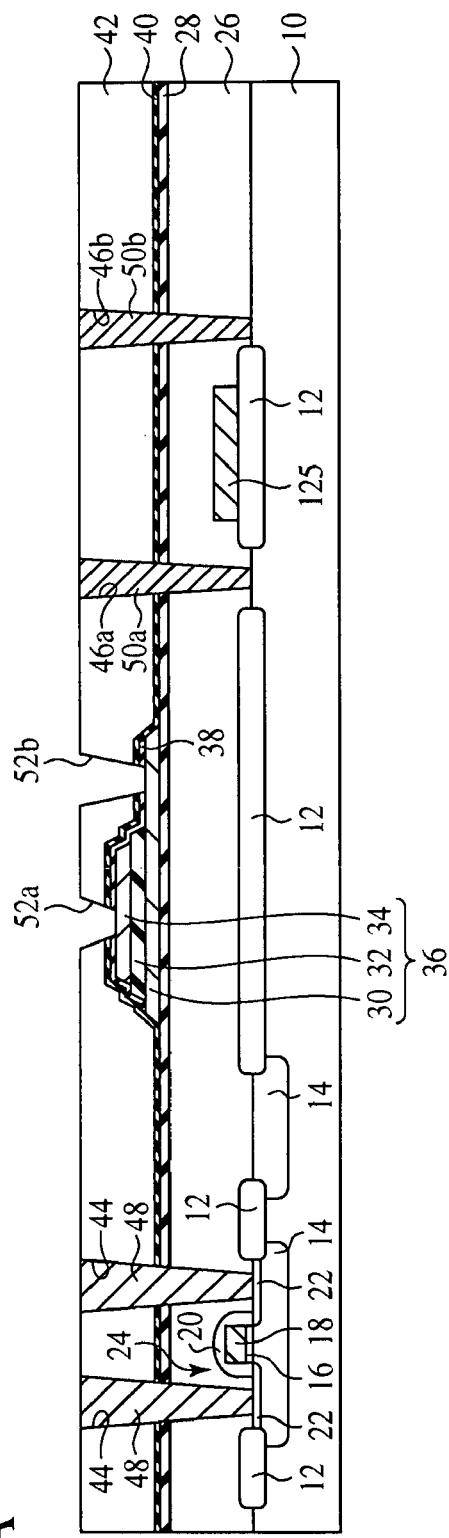
FIGS. 37A and 37B are sectional views of the semiconductor device according to the third embodiment in the steps of the method for manufacturing the semiconductor device, which illustrate the method (Part 3).
Figure 37B:
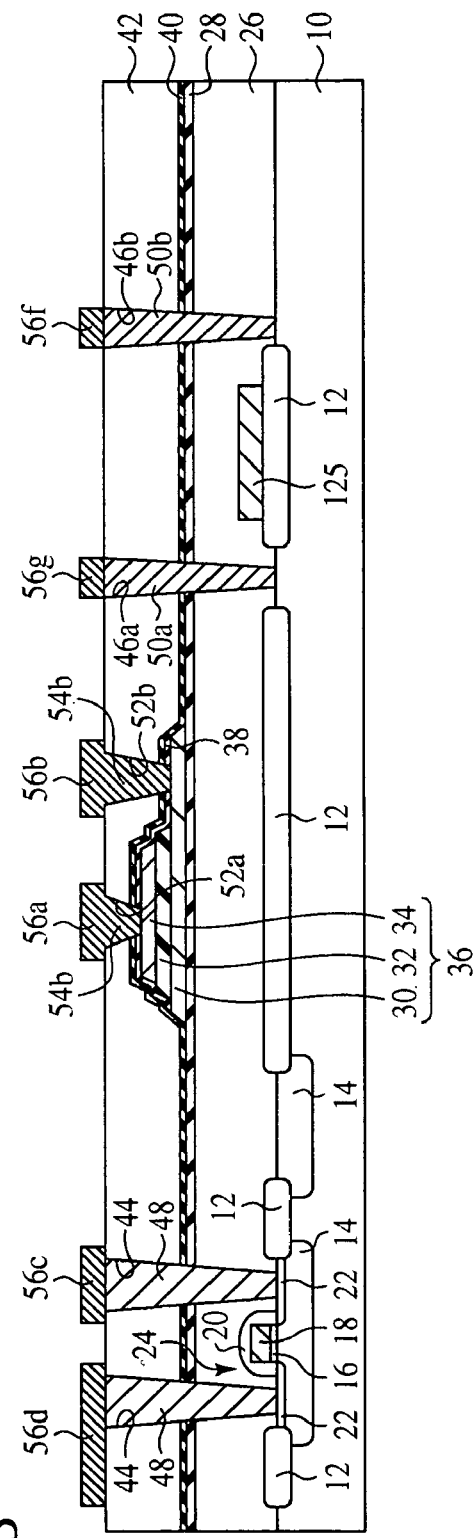
Figure 38:
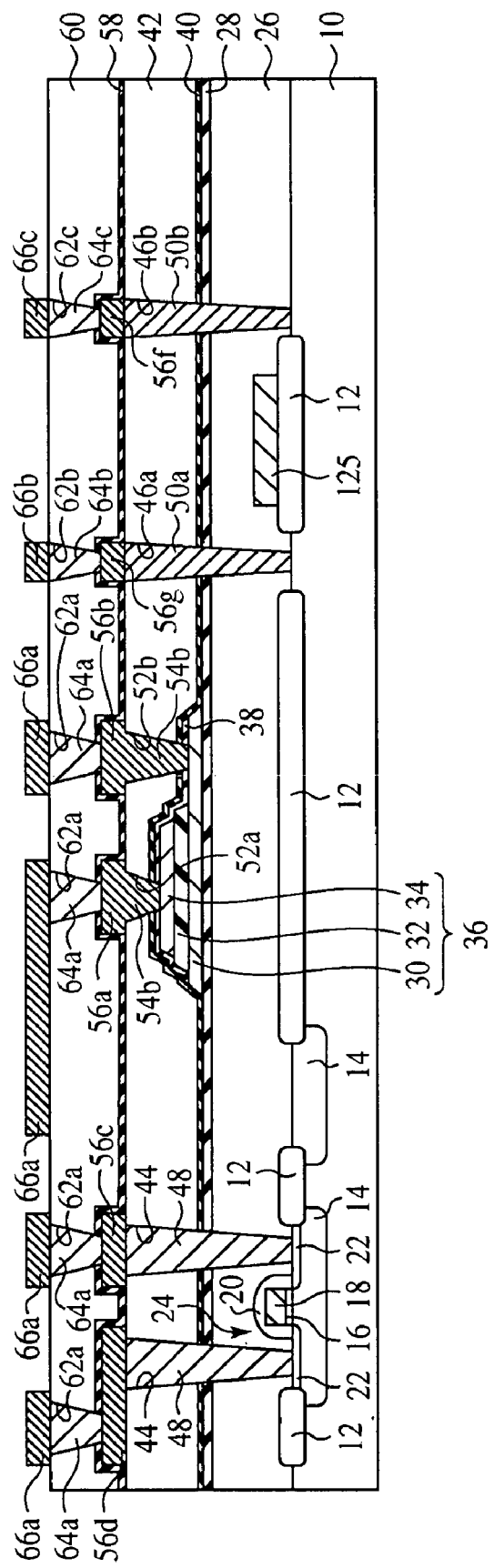
FIG. 38 is a sectional view of the semiconductor device according to the third embodiment in the steps of the method for manufacturing the semiconductor device, which illustrates the method (Part 4).
Figure 39:
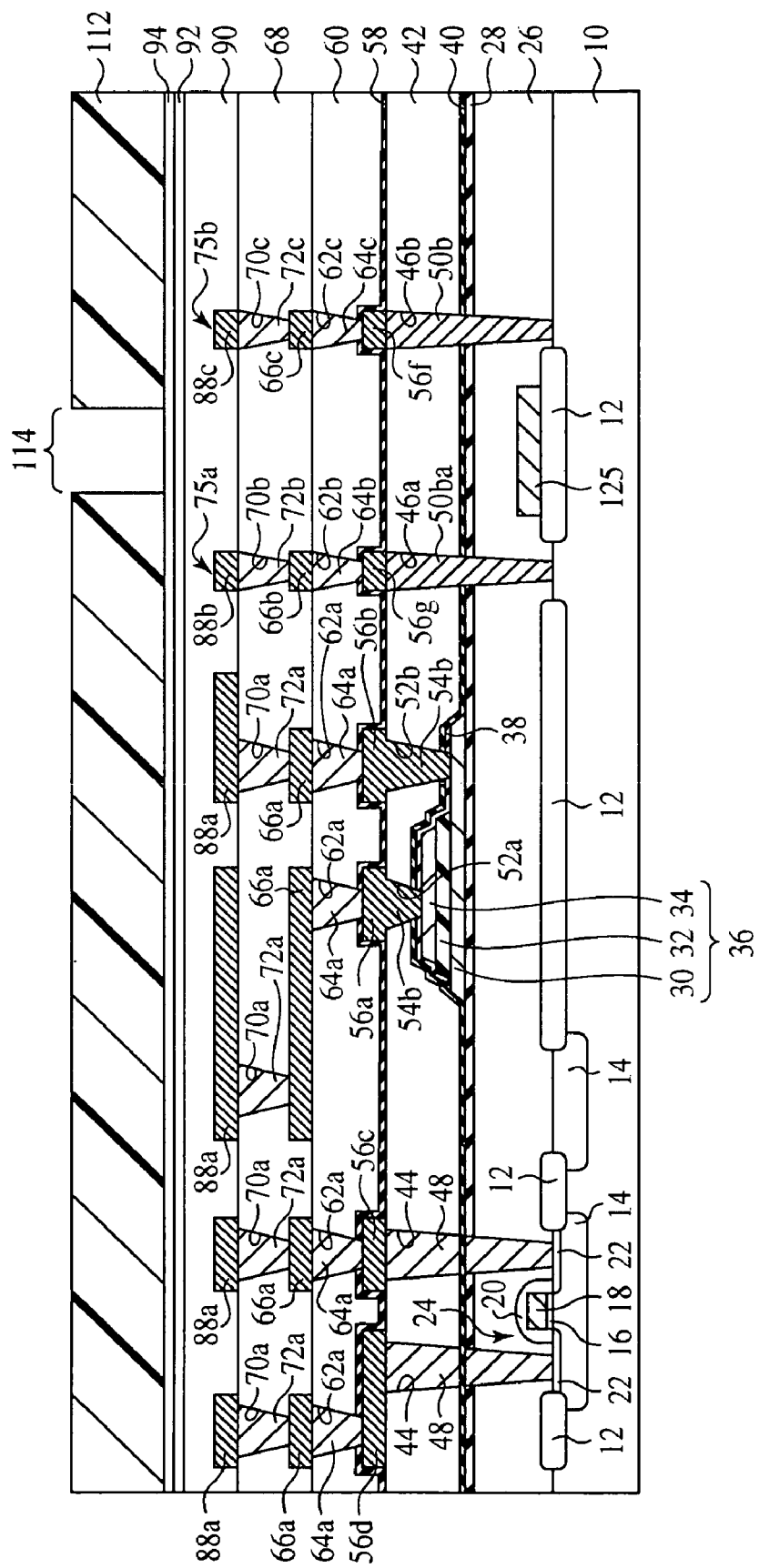
FIG. 39 is a sectional view of the semiconductor device according to the third embodiment in the steps of the method for manufacturing the semiconductor device, which illustrates the method (Part 5).

The semiconductor device according to a second embodiment will be explained with reference to FIGS. 34 to 48. FIG. 34 is a sectional view of the semiconductor device according to the present embodiment. The same members of the present embodiment as those of the semiconductor device according to the first or the second embodiment and the method for manufacturing the semiconductor device illustrated in FIGS. 1 to 33 are represented by the same reference numbers not to repeat or to simply their explanation.

The semiconductor device according to the present embodiment is characterized mainly in that openings 96b are formed down to a conduction film 125 formed on a semiconductor substrate 10 with a device isolation regions 12 formed therebetween, and a conductors 100b are buried in the openings 96b.

As illustrated in FIG. 34, on the semiconductor substrate 10 below electrode pads 102, the conduction film 125 is formed with the device isolation regions 12 formed therebetween. The conductor film 125 is not formed directly on the semiconductor substrate 10 so as to ensure the insulation between the conduction film 125 and the semiconductor substrate 10 and resultantly ensure the insulation between the conductors 100b and the semiconductor substrate 10.

Openings 96b are formed down to the conduction film 125 in the silicon oxide film 94, the insulative barrier film 92, the inter-layer insulation film 90, the inter-layer insulation film 68, the inter-layer insulation film 60, the insulative barrier film 58, the inter-layer insulation film 42, the insulative barrier film 40, the insulative barrier film 28 and the inter-layer insulation film 26.

In the openings 96b, a barrier metal film 98 is formed.

In the openings 96b with the barrier metal film 98 formed in, conductors 100b are buried.

On the silicon oxide film 94, electrode pads 102 connected to the conductors 100a and interconnections 102a connected to the conductor plugs 123 are formed.

The electrode pads 102 are electrically connected to those of a plurality of the interconnections 102a.

As described above, the semiconductor device according to the present embodiment is characterized mainly in that, as described above, the openings 96b are formed down to the conduction film 125 formed on the semiconductor substrate 10 with the device isolation regions 12 formed therebetween, and the conductors 100b are buried in the openings 96b. Thus, according to the present embodiment, the conductors 100b can be formed stronger. According to the present embodiment, because of such very strong conductors 100b present immediately below the electrode pads 102, even when a probe needle is contacted to the electrode pads 102 with some force in tests, etc., the electrode pad 102 can be prevented from being broken or deformed. Even when the electrode pads 102 should be broken or deformed, because of the very strong conductors 100b present immediately below the electrode pad 102, no cracks that arrive at the inter-layer insulation films 26, 42, 60, 68, 90 never take place in the conductors 100a. Thus, according to the present embodiment, the arrival of hydrogen and water at the dielectric film 32 of the capacitors 36 via the inter-layer insulation films 26, 42, 60, 68, 90, etc. can be prevented, and the ferroelectric forming the dielectric film 32 is prevented from being reduced with hydrogen. Thus, according to the present embodiment, the dielectric film 32 of the capacitors 36 are surely prevented from being deteriorated with hydrogen and water, and the semiconductor device including the capacitors 36 having good electric characteristics and a long life can be provided.

(Method for Manufacturing the Semiconductor Device)

Next, the method for manufacturing the semiconductor device according to the present embodiment will be explained with reference to FIGS. 35A to 48. FIGS. 35A to 48 are the sectional views of the semiconductor device according to the present embodiment in the steps of the method for manufacturing the semiconductor device, which illustrate the method.

First, the step of forming the device isolation regions 12 for defining the device regions on, e.g., the semiconductor substrate 10 to the step of forming the gate insulation film 16 are the same as those of the method for manufacturing the semiconductor device according to the first embodiment described above with reference to FIG. 3A, and they will not be explained.

Then, a 120 nm-thickness polysilicon film 18 is formed by, e.g., CVD. The polysilicon film 18 is to be the gate electrodes, etc. The polysilicon film 18 is to be the conduction film 125 to be formed below the electrode pad part 6.

Next, by photolithography, the polysilicon film 18 is patterned. Thus, the gate electrodes 18 of the polysilicon film are formed. The gate length is, e.g., 0.36 µm. In the electrode pad part 6, on the device isolation region 12, the conduction film 125 of polysilicon film is formed (see FIG. 35A).

Then, with the gate electrodes 18 as the mask, a dopant impurity is implanted into the semiconductor substrate 10 on both sides of the gate electrodes 18 by ion implantation. Thus, the extension regions (not illustrated) forming the shallow regions of the extension source/drain are formed.

Next, on the entire surface, a 150 nm-thickness silicon oxide film 20 is formed by, e.g., CVD.

Next, the silicon oxide film 20 is anisotropically etched. Thus, on the side walls of the gate electrodes 18, the sidewall insulation film 20 of the silicon oxide film is formed.

Next, by using as the mask, the gate electrodes 18 with the sidewall insulation film 20 formed on, a dopant impurity is implanted into the semiconductor substrate 10 on both sides of the gate electrodes 18 by ion implantation. Thus, the impurity diffused layer (not illustrated) forming the deep regions of the extension source/drain is formed. The extension regions and the deep impurity diffused layer form the source/drain diffused layer 22.

Thus, transistors 24 each including the gate electrode 18 and the source/drain diffused layer 22 are formed.

Then, the step of forming the inter-layer insulation film 26 to the step of forming the openings 114 in the photoresist film 112 are the same as those of the method for manufacturing the semiconductor device according to the first embodiment described above with reference to FIGS. 3B to 10, and they are not explained (see FIGS. 35B to 39).

Figure 40:
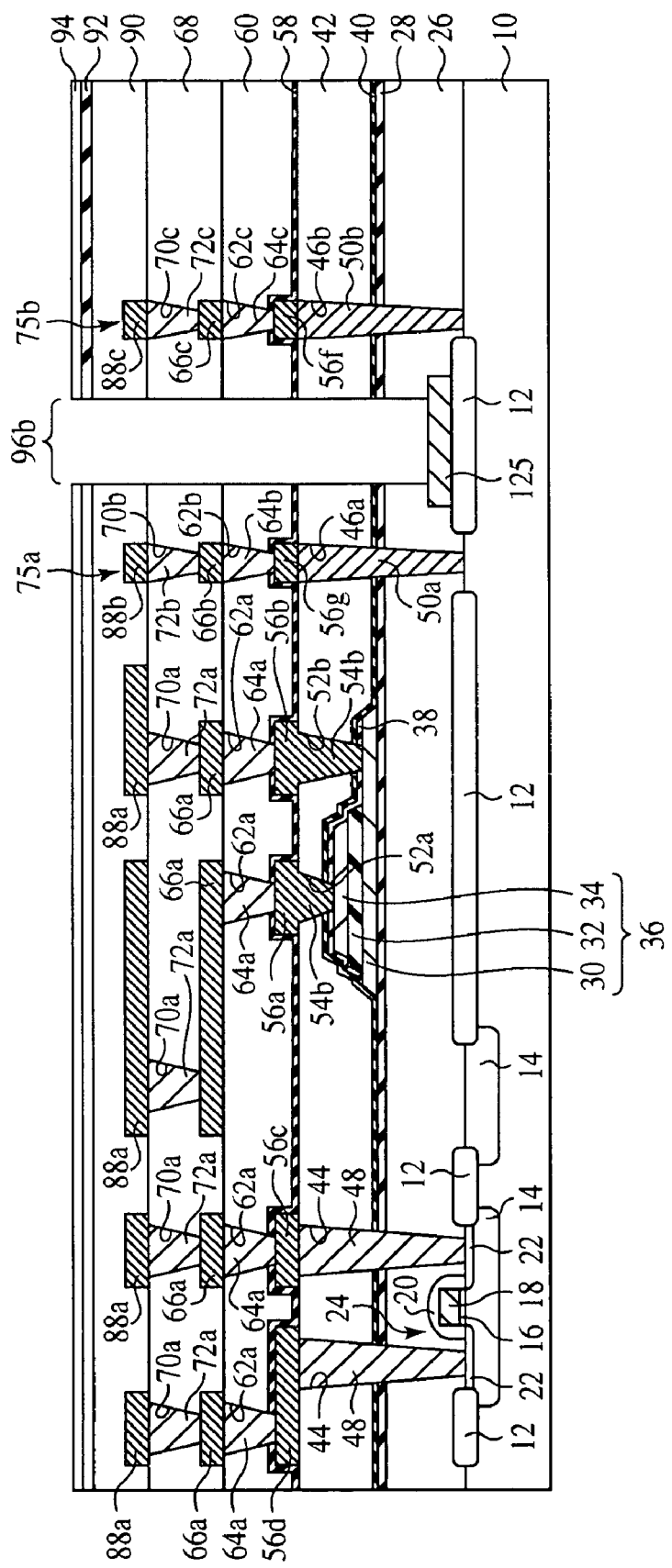
FIG. 40 is a sectional view of the semiconductor device according to the third embodiment in the steps of the method for manufacturing the semiconductor device, which illustrates the method (Part 6).
Figure 41:
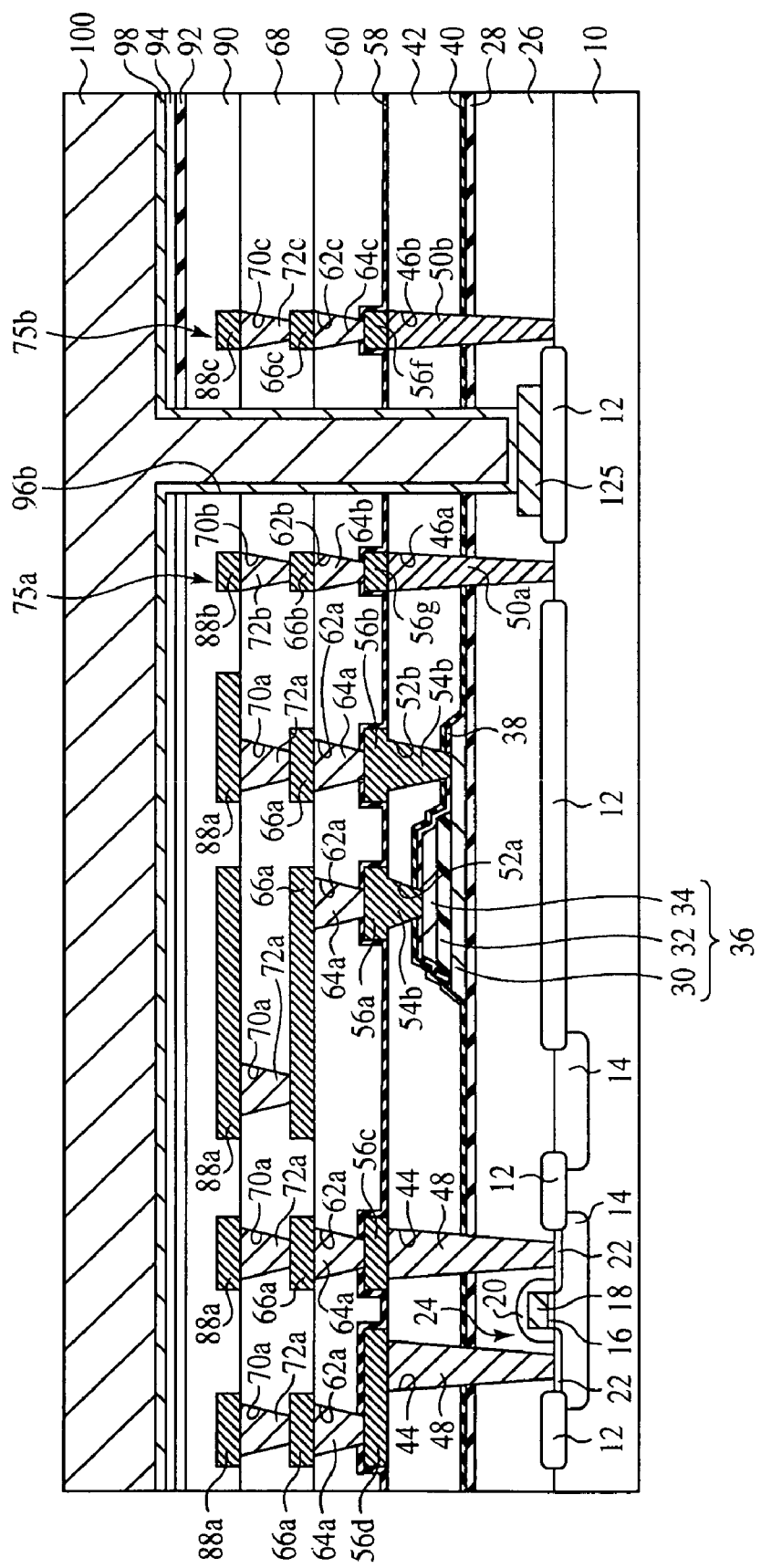
FIG. 41 is a sectional view of the semiconductor device according to the third embodiment in the steps of the method for manufacturing the semiconductor device, which illustrates the method (Part 7).
Figure 42:
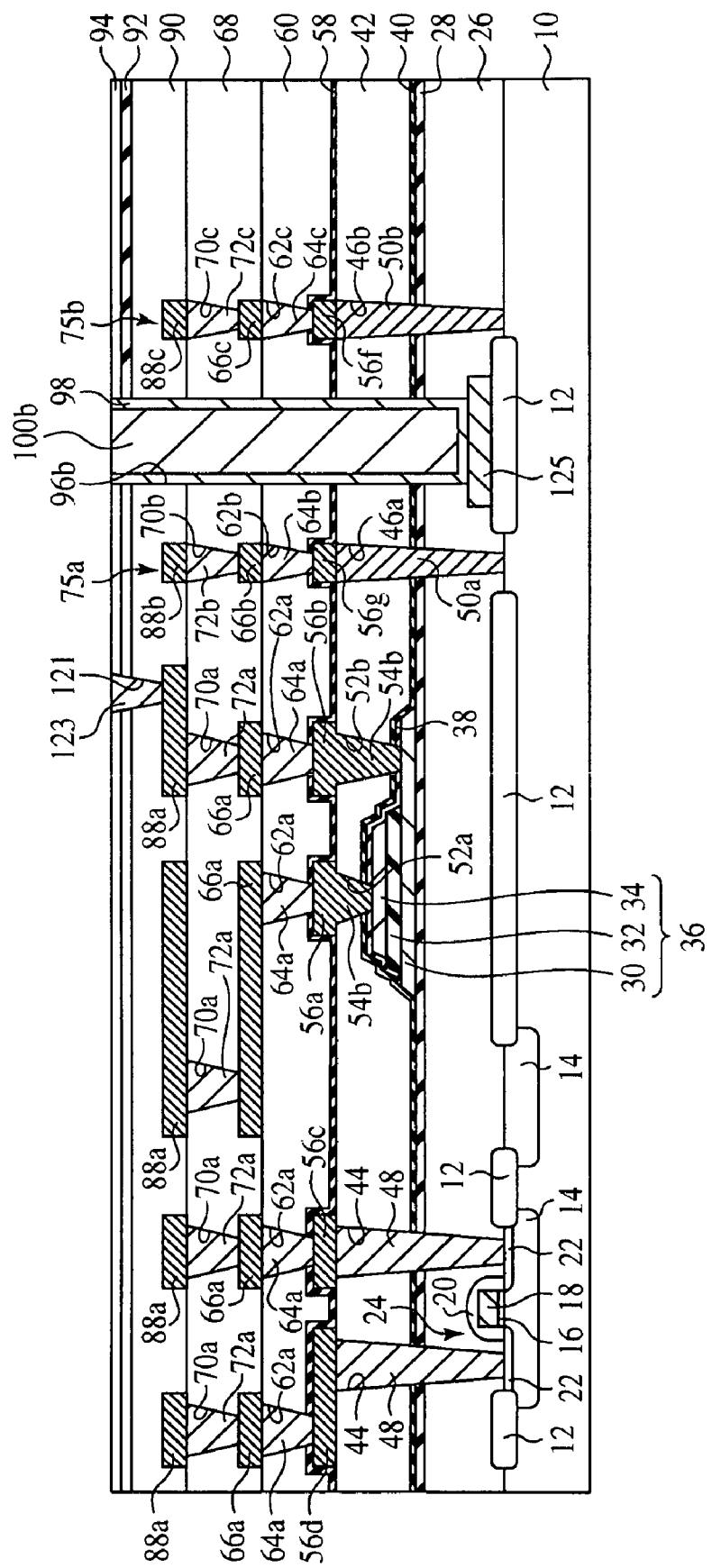
FIG. 42 is a sectional view of the semiconductor device according to the third embodiment in the steps of the method for manufacturing the semiconductor device, which illustrates the method (Part 8).
Figure 43:
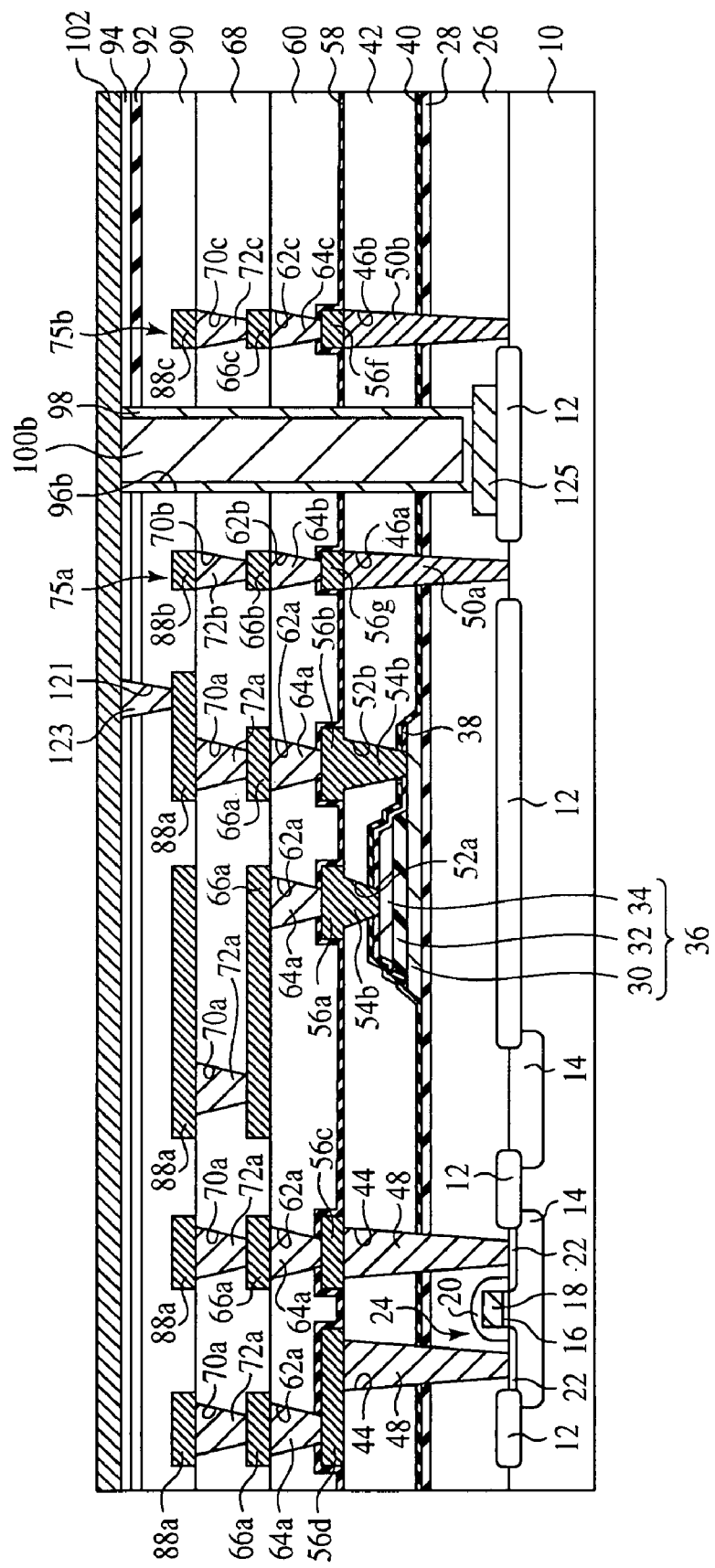
FIG. 43 is a sectional view of the semiconductor device according to the third embodiment in the steps of the method for manufacturing the semiconductor device, which illustrates the method (Part 9).
Figure 44:
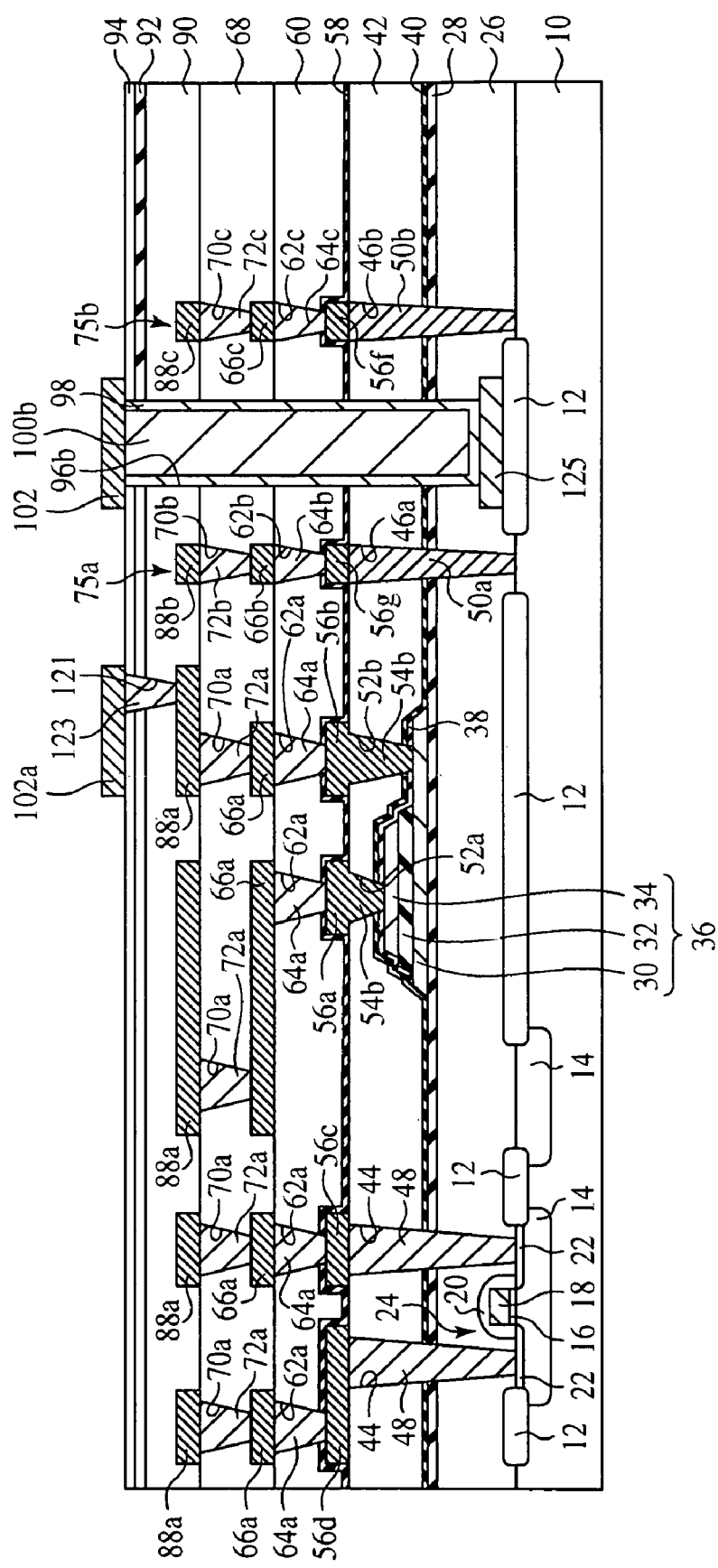
FIG. 44 is a sectional view of the semiconductor device according to the third embodiment in the steps of the method for manufacturing the semiconductor device, which illustrates the method (Part 10).
Figure 45:
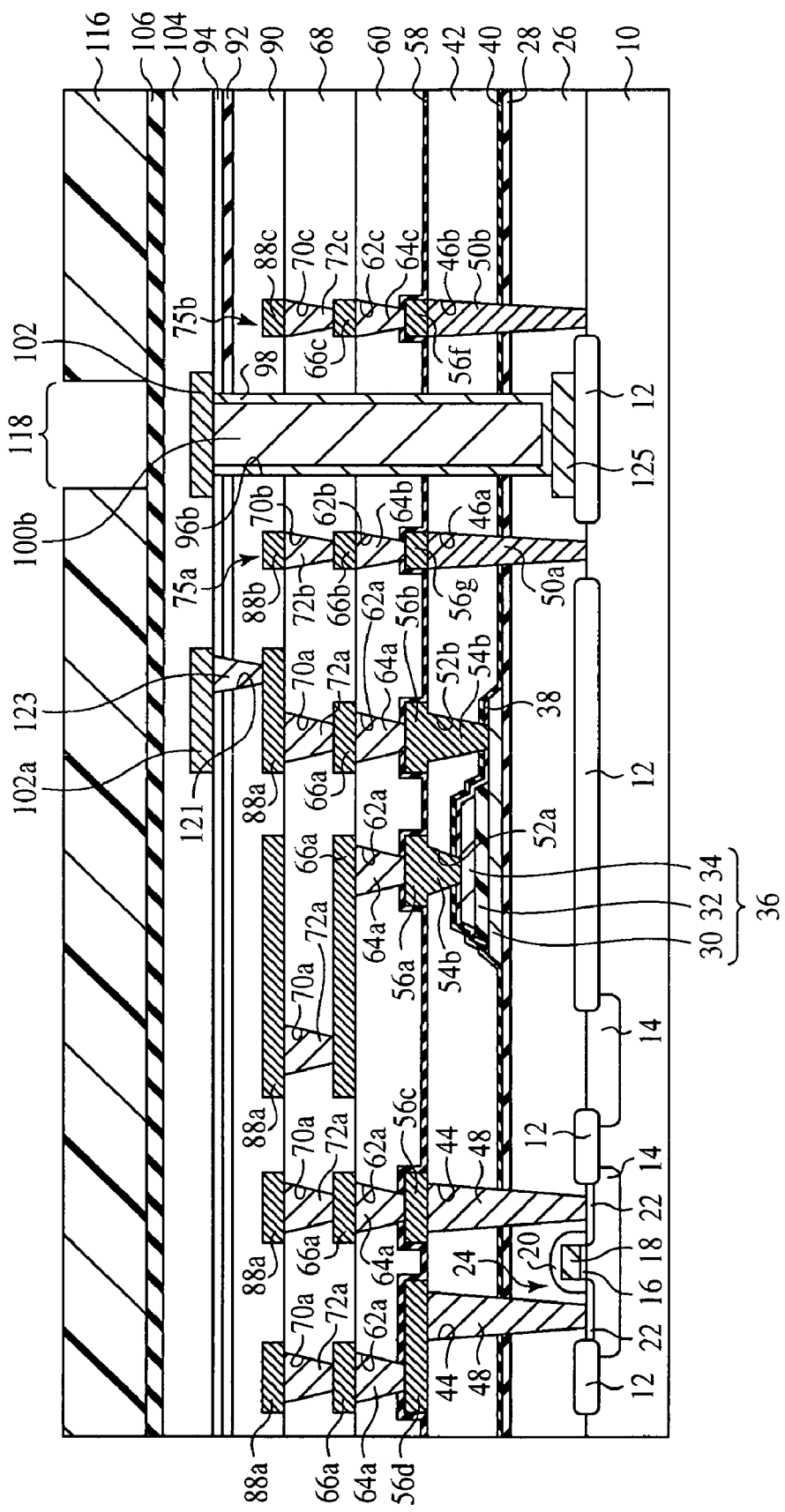
FIG. 45 is a sectional view of the semiconductor device according to the third embodiment in the steps of the method for manufacturing the semiconductor device, which illustrates the method (Part 11).
Figure 46:
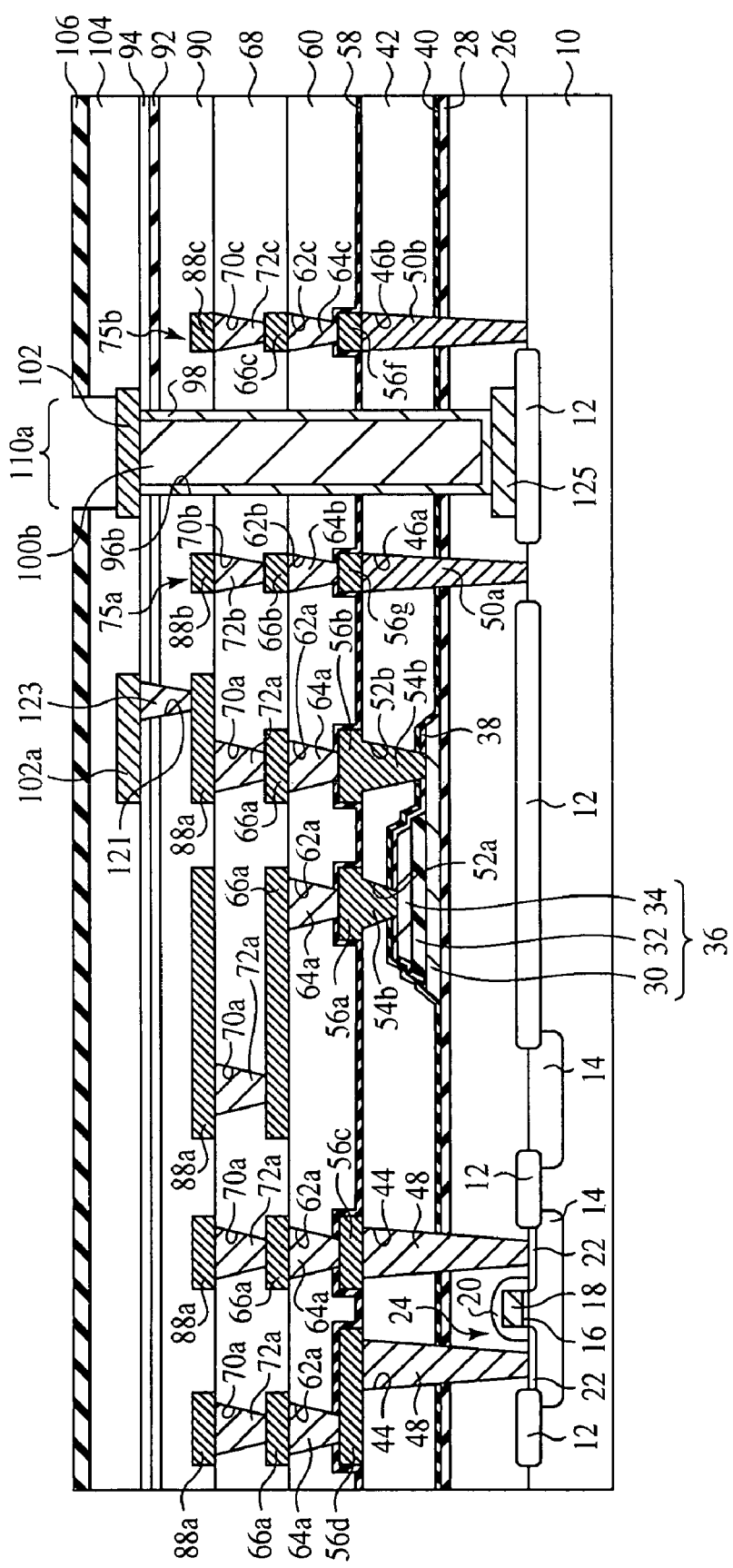
FIG. 46 is a sectional view of the semiconductor device according to the third embodiment in the steps of the method for manufacturing the semiconductor device, which illustrates the method (Part 12).
Figure 47:
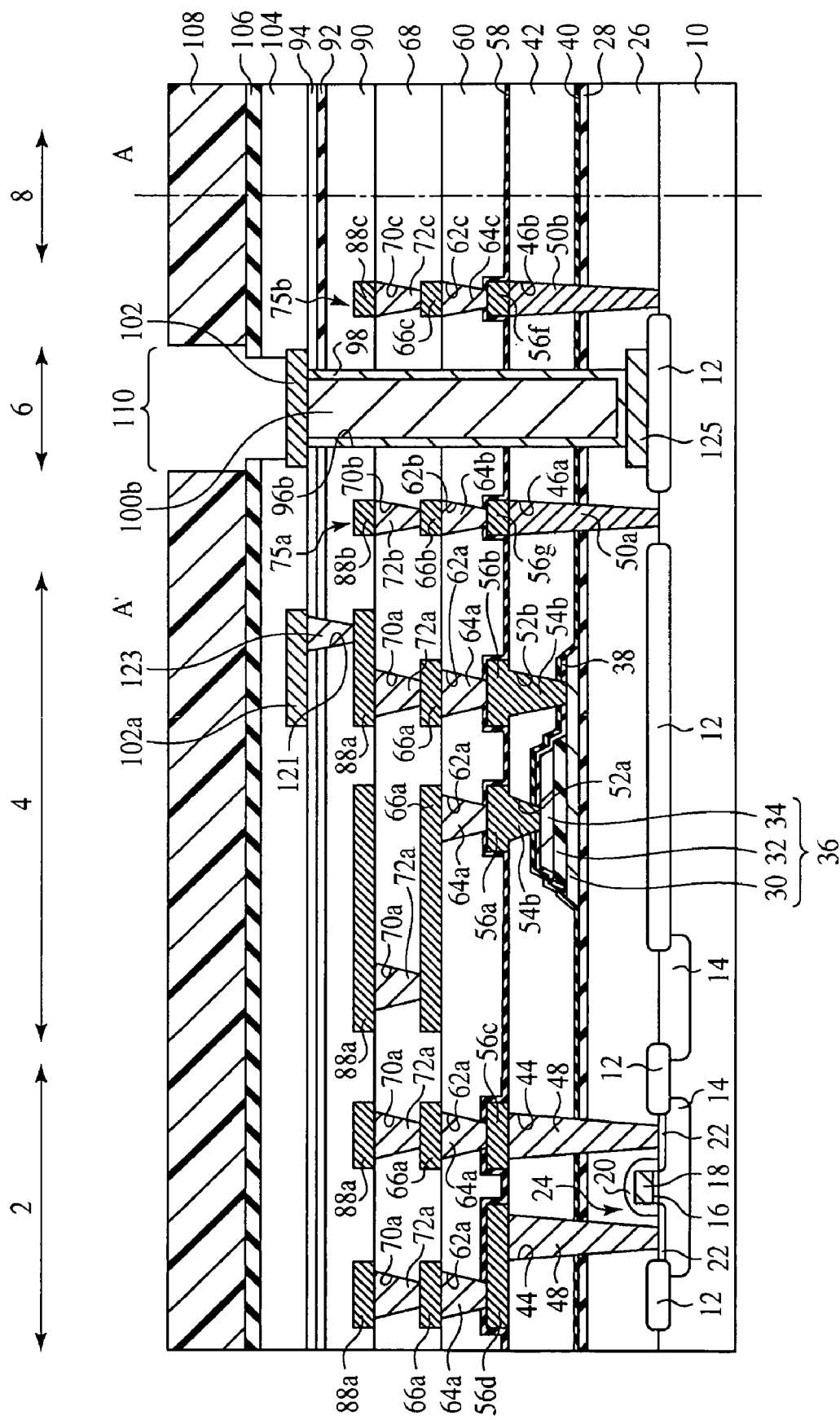
FIG. 47 is a sectional view of the semiconductor device according to the third embodiment in the steps of the method for manufacturing the semiconductor device, which illustrates the method (Part 13).
Figure 48:
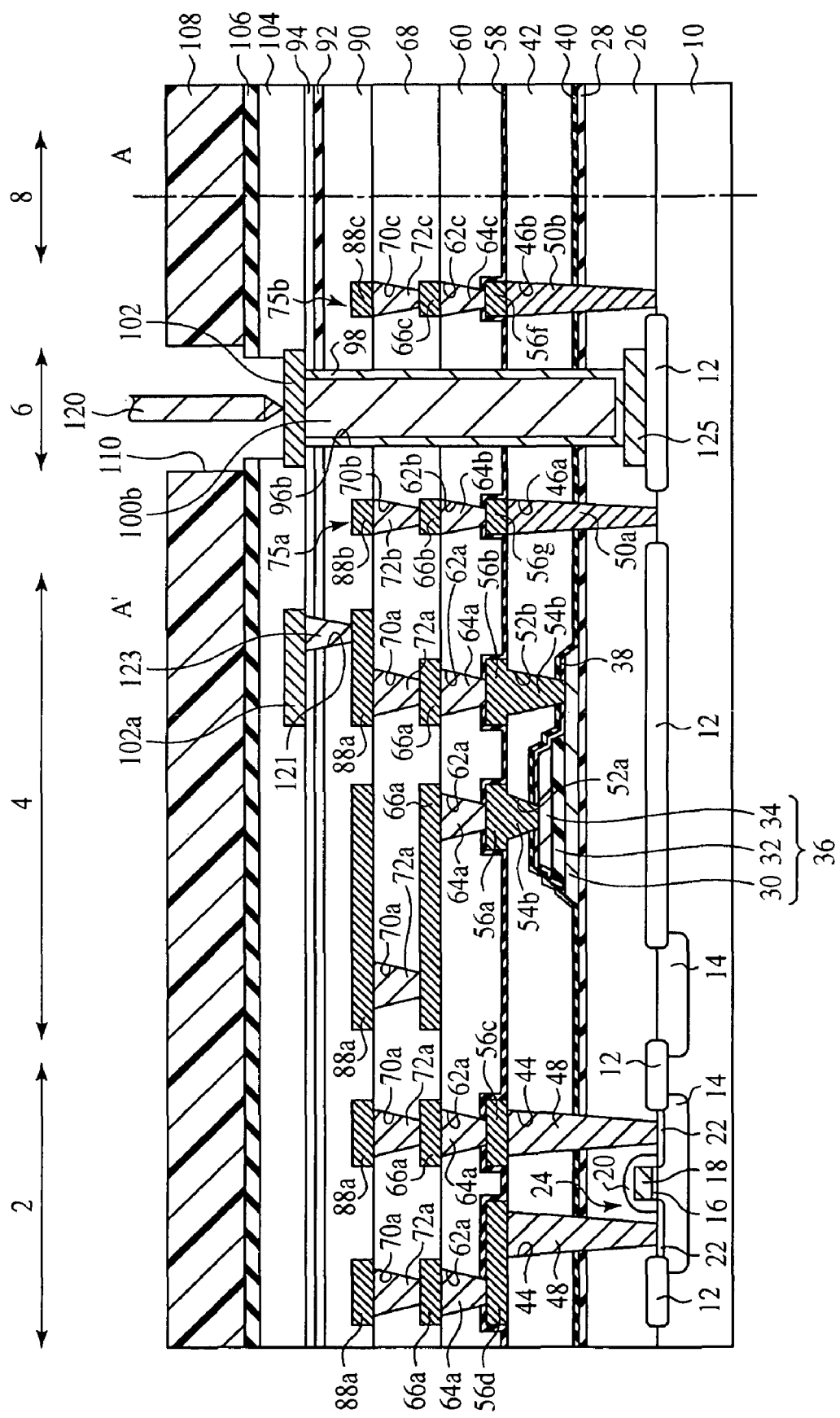
FIG. 48 is a sectional view of the semiconductor device according to the third embodiment in the steps of the method for manufacturing the semiconductor device, which illustrates the method (Part 14).

Then, with the photoresist film (see FIG. 39) as the mask and with the conduction film 125 as the etching stopper, the openings 96a are formed down to the conduction film 125 in the silicon oxide film 94, the insulative barrier film 92, the inter-layer insulation film 90, the inter-layer insulation film 68, the inter-layer insulation film 60, the insulative barrier film 58, the inter-layer insulation film 42, the insulative barrier film 40, the insulative barrier film 28 and the inter-layer insulation film 26 (see FIG. 40).

The following steps of the method for manufacturing the semiconductor device are the same as those of the method for manufacturing the semiconductor device according to the second embodiment described above with reference to FIGS. 28 to 33, and they are not explained.

Thus, the semiconductor device according to the present embodiment is manufactured.

As described above, the present embodiment is characterized mainly in that, as described above, the openings 96b are formed down to the conduction film 125 formed on the semiconductor substrate 10 with the device isolation regions 12 formed therebetween, and the conductors 100b are buried in the openings 96b. According to the present embodiment, because of such very strong conductors 100b present immediately below the electrode pads 102, even when a probe needle is contacted to the electrode pads 102 with some force in tests, etc., the electrode pads 102 can be prevented from being broken or deformed. Even if the electrode pads 102 should be broken or deformed, because of the conductors 100b formed very strong immediately below the electrode pads 102, cracks which arrive at the inter-layer insulation films 26, 42, 60, 68, 90 never take place in the conductors 100a. Thus, according to the present embodiment, hydrogen and water are prevented from arriving at the dielectric film 32 of the capacitors 36 via the inter-layer insulation films 26, 42, 60, 68, 90, etc., the ferroelectric forming the dielectric film 32 is prevented from begin reduced with hydrogen. As described above, according to the present embodiment, the dielectric film 32 of the capacitors 36 are surely presented from being deteriorated with hydrogen and water, and the semiconductor device including the capacitors 36 having good electric characteristics and a long life can be provided.

The present invention is not limited to the above-described embodiments and can cover other various modifications.

For example, in the second and the third embodiments, plane insulative barrier films 122, 126 (see FIG. 20) may be further formed. That is, the plane insulative barrier film 122 is further formed between the first metal interconnection layer 56 and the second metal interconnection layer 66, and between the second metal interconnection layer 66 and the third metal interconnection layer 88, the plane insulative barrier film 126 may be formed.

In the above-described embodiments, PZT film is used as the ferromagnetic film forming the dielectric film 32 of the capacitors 36. The ferroelectric film forming the dielectric film 32 of the capacitors 36 is not limited to PZT film, and any other ferromagnetic film can be used. For example, as the ferromagnetic film forming the dielectric film 32 of the capacitors 36, $Pb_{1-X}La_XZr_{1-Y}Ti_YO_3$ film (PLZT film), $SrBi_2(Ta_XNb_{1-X})_2O_9$ film, $Bi_4Ti_2O_{12}$ film or others may be used.

In the above-described embodiments, as the dielectric film 32 of the capacitors 36, ferromagnetic film is used, but the dielectric film 32 is not essentially ferromagnetic film. For example, to form DRAM, etc., high dielectric film (High-k film) may be used as the dielectric film 32. The high dielectric film forming the dielectric film 32 can be, e.g., $(BaSr)TiO_3$ film (BST film), $SrTiO_3$ film (STO film), $Ta_2O_5$ film or others.

The high dielectric film is dielectric film whose dielectric constant is higher than that of silicon dioxide.

In the above-described embodiments, as the insulative barrier films 28, 38, 40, 58, 92, 122, 126, aluminum oxide film is used, but the insulative barrier films 28, 38, 40, 58, 92, 122, 126 are not essentially aluminum oxide film. Films which function to prevent the diffusion of hydrogen and water can be suitably used as the insulative barrier films 28, 38, 40, 58, 92, 122, 126. As the insulative barrier films 28, 38, 40, 58, 92, 122, 126, films of, e.g., metal oxide can be suitably used. As the insulative barrier films 28, 38, 40, 58, 92, 122, 126 formed of metal oxide, tantalum oxide, titanium oxide, etc., for example, can be used. The insulative barrier films 28, 38, 40, 58, 92, 122, 126 are not limited of films of metal oxide. For example, silicon nitride film ($Si_3N_4$ film), silicon nitride oxide film (SiON film), etc. can be used as the insulative barrier films 28, 38, 40, 58, 92, 122, 126. The film of metal oxide is dense, and even when the film is formed relatively thin, the film can surely prevent the diffusion of hydrogen and water. Thus, in view of the micronization, it is advantageous that the insulative barrier films 28, 38, 40, 58, 92, 122, 126 are formed of metal oxide.

What is claimed is:

1. A semiconductor device comprising:
   a capacitor formed over a semiconductor substrate and including a lower electrode, a dielectric film formed over the lower electrode and an upper electrode formed over the dielectric film;
   a first insulation film formed over the capacitor;
   a first interconnection formed over the first insulation film;
   a second insulation film formed over the first insulation film and over the first interconnection;
   an electrode pad formed over the second insulation film;
   an opening formed continuously in the second insulation film and in the first insulation film below the electrode pad, the second insulation film and the first insulation film being penetrated by the opening; and
   a conductor plug buried in the opening, a length of the conductor plug being larger than at least a thickness of the second insulation film, and a diameter of the conductor plug being larger than a diameter of another conductor plug connected to the first interconnection.

2. The semiconductor device according to claim 1, further comprising:
   a third insulation film formed over the semiconductor substrate, burying the capacitor; and
   a second interconnection and a conduction film formed over the third insulation film,
   the electrode pad being connected to the conduction film through the second insulation film and the first insulation film.

3. The semiconductor device according to claim 1, further comprising
   a conduction film formed below the electrode pad and formed of one and the same conductor film as the upper electrode or the lower electrode of the capacitor,
   the electrode pad being connected to the conduction film through the second insulation film and the first insulation film.

4. The semiconductor device according to claim 1, further comprising:
   an insulation layer formed over the semiconductor substrate below the electrode pad; and
   a conduction film formed over the insulation film,
   the electrode pad being connected to the conduction film through the second insulation film and the first insulation film.

5. The semiconductor device according to claim 1, wherein the conductor is formed of Cu, Au, Al or Al—Cu alloy.

6. The semiconductor device according to claim 1, further comprising
   a barrier film formed above the capacitor, for preventing the diffusion of hydrogen and water.

7. The semiconductor device according to claim 6, wherein the barrier film is flat.

8. The semiconductor device according to claim 6, wherein the barrier film is formed of aluminum oxide or titanium oxide.

9. The semiconductor device according to claim 1, wherein the dielectric film of the capacitor is formed of a ferroelectric or a high dielectric.

10. The semiconductor device according to claim 9, wherein the dielectric film of the capacitor is $PbZr_{1-x}Ti_xO_3$ film, $Pb_{1-x}La_xZr_{1-y}Ti_yO_3$ film, $SrBi_2(Ta_xNb_{1-x})_2O_9$ film or $Bi_4Ti_2O_{12}$ film.

* * * * *